United States Patent
Hermes et al.

(10) Patent No.: US 11,211,513 B2
(45) Date of Patent: Dec. 28, 2021

(54) OPTICAL SENSOR AND DETECTOR FOR AN OPTICAL DETECTION

(71) Applicant: trinamiX GmbH, Ludwigshafen am Rhein (DE)

(72) Inventors: Wilfried Hermes, Ludwigshafen am Rhein (DE); Sebastian Valouch, Ludwigshafen am Rhein (DE); Robert Send, Ludwigshafen am Rhein (DE); Ingmar Bruder, Ludwigshafen am Rhein (DE); Bertram Feuerstein, Ludwigshafen am Rhein (DE)

(73) Assignee: trinamiX GmbH, Ludwigshafen am Rhein (DE)

( * ) Notice: Subject to any disclaimer, the term of this patent is extended or adjusted under 35 U.S.C. 154(b) by 125 days.

(21) Appl. No.: 16/321,143

(22) PCT Filed: Jul. 27, 2017

(86) PCT No.: PCT/EP2017/068956
§ 371 (c)(1),
(2) Date: Jan. 28, 2019

(87) PCT Pub. No.: WO2018/019921
PCT Pub. Date: Feb. 1, 2018

(65) Prior Publication Data
US 2019/0172964 A1    Jun. 6, 2019

(30) Foreign Application Priority Data
Jul. 29, 2016    (EP) .................................. 16181998

(51) Int. Cl.
*H01L 31/09*    (2006.01)
*H01L 31/02*    (2006.01)
(Continued)

(52) U.S. Cl.
CPC .......... *H01L 31/095* (2013.01); *G01S 7/4816* (2013.01); *G01S 17/46* (2013.01);
(Continued)

(58) Field of Classification Search
CPC . H01L 27/14; H01L 27/146; H01L 27/14665; H01L 27/14667; H01L 31/02;
(Continued)

(56) References Cited

U.S. PATENT DOCUMENTS 3,035,176 A    5/1962    Kis et al.
3,112,197 A    11/1963   Neugebauer et al.
(Continued)

FOREIGN PATENT DOCUMENTS

CA    1065054    10/1979
CA    2196563    12/1996
(Continued)

OTHER PUBLICATIONS

*Wikipedia*, Article denoted, "Thermocouple", retrieved Jul. 20, 2016.
(Continued)

*Primary Examiner* — Anastasia Midkiff
(74) *Attorney, Agent, or Firm* — Armstrong Teasdale LLP

(57) ABSTRACT

The present invention relates to an optical sensor, a detector comprising the optical sensor for an optical detection of at least one object, a method for manufacturing the optical sensor and various uses of the optical sensor and the detector. Furthermore, the invention relates to a human-machine interface, an entertainment device, a scanning system, a tracking system, a stereoscopic system, and a camera. The optical sensor (110) comprises a layer (112) of at least one photoconductive material (114), at least two individual electrical contacts (136, 136') contacting the layer (112) of the photoconductive material (114), and a cover (Continued)

layer (116) deposited on the layer (112) of the photoconductive material (114), wherein the cover layer (116) is an amorphous layer comprising at least one metal-containing compound (120). The optical sensor (110) can be supplied as a non-bulky hermetic package which, nevertheless, provides a high degree of protection against possible degradation by humidity and/or oxygen. Moreover, the cover layer (116) is capable of activating the photoconductive material (114) which results in an increased performance of the optical sensor (110). Further, the optical sensor (110) may be easily manufactured and integrated on a circuit carrier device.

16 Claims, 14 Drawing Sheets

(51) Int. Cl.
    *H01L 31/0203*     (2014.01)
    *H01L 31/0216*     (2014.01)
    *H01L 31/0224*     (2006.01)
    *H01L 31/032*     (2006.01)
    *G01S 7/481*     (2006.01)
    *G01S 17/46*     (2006.01)
    *H01L 31/18*     (2006.01)
    *H01L 27/146*     (2006.01)
    *G01S 17/48*     (2006.01)

(52) U.S. Cl.
    CPC ........ *G01S 17/48* (2013.01); *H01L 27/14665* (2013.01); *H01L 27/14667* (2013.01); *H01L 31/0203* (2013.01); *H01L 31/0216* (2013.01); *H01L 31/02016* (2013.01); *H01L 31/0224* (2013.01); *H01L 31/0324* (2013.01); *H01L 31/09* (2013.01); *H01L 31/186* (2013.01); *H01L 31/1864* (2013.01); *Y02E 10/50* (2013.01); *Y02P 70/50* (2015.11)

(58) Field of Classification Search
    CPC ........... H01L 31/02016; H01L 31/0203; H01L 31/0216; H01L 31/0224; H01L 31/0324; H01L 31/09; H01L 31/095; H01L 31/186; H01L 31/1864; G01S 7/4819; G01S 7/46; G01S 7/48; Y02P 70/50; Y02F 10/50
    See application file for complete search history.

(56) References Cited

U.S. PATENT DOCUMENTS

| | | |
|---|---|---|
| 3,384,752 A | 5/1968 | Odone |
| 3,562,785 A | 2/1971 | Craig |
| 3,564,268 A | 2/1971 | Bayne et al. |
| 3,873,823 A | 3/1975 | Northrup et al. |
| 3,937,950 A | 2/1976 | Hosoe et al. |
| 3,954,340 A | 5/1976 | Blomqvist et al. |
| 4,023,033 A | 5/1977 | Bricot et al. |
| 4,053,240 A | 10/1977 | Aizawa et al. |
| 4,079,247 A | 3/1978 | Briscot et al. |
| 4,256,513 A | 3/1981 | Yoshida |
| 4,286,035 A | 8/1981 | Nishizima et al. |
| 4,346,293 A | 8/1982 | Fetzer |
| 4,469,945 A | 9/1984 | Hoeberechts et al. |
| 4,524,276 A | 6/1985 | Ohtombe |
| 4,565,761 A | 1/1986 | Katagiri et al. |
| 4,584,704 A | 4/1986 | Ferren |
| 4,593,187 A | 6/1986 | Grotts et al. |
| 4,602,158 A | 7/1986 | Barrett |
| 4,603,258 A | 7/1986 | Sher et al. |
| 4,647,193 A | 3/1987 | Rosenfeld |
| 4,675,535 A | 6/1987 | Tsunekawa et al. |
| 4,694,172 A | 9/1987 | Powell et al. |
| 4,760,004 A | 7/1988 | Rochat et al. |
| 4,760,151 A | 7/1988 | Rochat et al. |
| 4,767,211 A | 8/1988 | Munakata et al. |
| 4,773,751 A | 9/1988 | Matsuda et al. |
| 4,927,721 A | 5/1990 | Gratzel et al. |
| 4,952,472 A | 8/1990 | Baranyi et al. |
| 5,082,363 A | 1/1992 | Nakanishi et al. |
| 5,216,476 A | 6/1993 | Lanckton |
| 5,227,985 A | 7/1993 | Dementhon et al. |
| 5,235,377 A | 8/1993 | Ide et al. |
| 5,291,066 A | 3/1994 | Neugebauer et al. |
| 5,343,291 A | 8/1994 | Ohwada et al. |
| 5,350,644 A | 9/1994 | Graetzel et al. |
| 5,355,241 A | 10/1994 | Kelley |
| 5,375,008 A | 12/1994 | Guerreri |
| 5,512,997 A | 4/1996 | Ogawa |
| 5,576,975 A | 11/1996 | Sasaki et al. |
| 5,581,094 A | 12/1996 | Hara et al. |
| 5,589,928 A | 12/1996 | Babbitt et al. |
| 5,856,844 A | 1/1999 | Batterman et al. |
| 6,061,122 A | 5/2000 | Hoshino et al. |
| 6,163,371 A | 12/2000 | Kato et al. |
| 6,191,881 B1 | 2/2001 | Tajima |
| 6,229,913 B1 | 5/2001 | Nayar et al. |
| 6,266,142 B1 | 7/2001 | Junkins et al. |
| 6,359,211 B1 | 3/2002 | Spitler et al. |
| 6,417,836 B1 | 7/2002 | Kumar et al. |
| 6,512,233 B1 | 1/2003 | Sato et al. |
| 6,785,028 B1 | 8/2004 | Atsuumi et al. |
| 6,930,297 B1 | 8/2005 | Nakamura |
| 6,947,459 B2 | 9/2005 | Kurtz et al. |
| 6,995,445 B2 | 2/2006 | Forrest et al. |
| 7,022,966 B2 | 4/2006 | Gonzo et al. |
| 7,049,601 B2 | 5/2006 | Agano |
| 7,196,317 B1 | 3/2007 | Meissner et al. |
| 7,247,851 B2 | 7/2007 | Okada et al. |
| 7,301,608 B1 | 11/2007 | Mendenhall et al. |
| 7,417,716 B2 | 8/2008 | Nagasaka et al. |
| 7,626,569 B2 | 12/2009 | Lanier |
| 7,677,742 B2 | 3/2010 | Hillmer et al. |
| 7,768,498 B2 | 8/2010 | Wey |
| 7,773,070 B2 | 8/2010 | Trisnadi et al. |
| 7,939,932 B2 | 5/2011 | Martin |
| 8,013,901 B2 | 9/2011 | Fukuhara et al. |
| 8,019,166 B2 | 9/2011 | Cheng et al. |
| 8,107,056 B1 | 1/2012 | Riza |
| 8,144,173 B2 | 3/2012 | Baba |
| 8,228,299 B1 | 7/2012 | Maloney et al. |
| 8,231,809 B2 | 7/2012 | Pschirer et al. |
| 8,345,003 B1 | 1/2013 | Trisnadi et al. |
| 8,363,526 B2 | 1/2013 | Hotta et al. |
| 8,390,793 B2 | 3/2013 | Yamaguchi et al. |
| 8,411,289 B2 | 4/2013 | Takahashi |
| 8,477,580 B2 | 7/2013 | Yamamoto et al. |
| 8,563,855 B2 | 10/2013 | Pschirer et al. |
| 8,593,565 B2 | 11/2013 | Shuster |
| 8,902,354 B2 | 12/2014 | Shuster |
| 8,908,157 B2 | 12/2014 | Eisele et al. |
| 9,001,029 B2 | 4/2015 | Bruder et al. |
| 9,104,910 B2 | 8/2015 | Huang |
| 9,385,326 B2 | 7/2016 | Wonneberger et al. |
| 9,389,315 B2 | 7/2016 | Bruder et al. |
| 9,428,518 B2 | 8/2016 | Wonneberger et al. |
| 9,557,856 B2 | 1/2017 | Send et al. |
| 9,646,365 B1 | 5/2017 | Hinkel et al. |
| 9,665,182 B2 | 5/2017 | Send et al. |
| 9,741,954 B2 | 8/2017 | Bruder et al. |
| 9,787,899 B1 | 10/2017 | Hinkel et al. |
| 9,829,564 B2 | 11/2017 | Bruder et al. |
| 9,919,999 B2 | 3/2018 | Koenemann et al. |
| 9,958,535 B2 | 5/2018 | Send et al. |
| 9,989,623 B2 | 6/2018 | Send et al. |
| 10,012,532 B2 | 7/2018 | Send et al. |
| 10,094,927 B2 | 10/2018 | Send et al. |
| 10,120,078 B2 | 11/2018 | Bruder et al. |
| 10,290,817 B2 | 5/2019 | Battagliarin et al. |
| 10,353,049 B2 | 7/2019 | Wonneberger et al. |
| 10,412,283 B2 | 9/2019 | Send et al. |
| 10,775,505 B2 | 9/2020 | Valouch et al. |
| 10,823,818 B2 | 11/2020 | Send et al. |

(56) References Cited

U.S. PATENT DOCUMENTS

| | | |
|---|---|---|
| 10,845,459 B2 | 11/2020 | Bruder et al. |
| 10,955,936 B2 | 3/2021 | Send et al. |
| 11,041,718 B2 | 6/2021 | Send et al. |
| 11,060,922 B2 | 7/2021 | Altenbeck et al. |
| 11,067,692 B2 | 7/2021 | Lungenschmied et al. |
| 11,125,880 B2 | 9/2021 | Send et al. |
| 2001/0025938 A1 | 10/2001 | Imai |
| 2002/0011576 A1 | 1/2002 | Cho et al. |
| 2003/0017360 A1 | 1/2003 | Tai et al. |
| 2003/0094607 A1 | 5/2003 | Guenther et al. |
| 2003/0128351 A1 | 7/2003 | Schmidt |
| 2003/0132391 A1 | 7/2003 | Agano |
| 2003/0227635 A1 | 12/2003 | Muller |
| 2004/0178325 A1 | 9/2004 | Forrest et al. |
| 2004/0190117 A1 | 9/2004 | Kubaink |
| 2004/0216625 A1 | 11/2004 | Birnstock et al. |
| 2005/0052120 A1 | 3/2005 | Gupta et al. |
| 2005/0061957 A1 | 3/2005 | Kase |
| 2005/0122308 A1 | 6/2005 | Bell et al. |
| 2005/0184301 A1 | 8/2005 | Nagasaka et al. |
| 2005/0217720 A1 | 10/2005 | Rey-Mermet et al. |
| 2005/0227390 A1 | 10/2005 | Shtein et al. |
| 2005/0227406 A1 | 10/2005 | Shtein et al. |
| 2005/0268957 A1 | 12/2005 | Enomoto et al. |
| 2005/0269616 A1 | 12/2005 | Andriessen |
| 2006/0044546 A1 | 3/2006 | Lewin et al. |
| 2006/0049397 A1 | 3/2006 | Pfeiffer et al. |
| 2006/0065833 A1 | 3/2006 | Craig et al. |
| 2006/0075585 A1 | 4/2006 | Krieger et al. |
| 2006/0082546 A1 | 4/2006 | Wey |
| 2007/0008515 A1 | 1/2007 | Otani et al. |
| 2007/0010924 A1 | 1/2007 | Otani et al. |
| 2007/0046625 A1 | 3/2007 | Yee |
| 2007/0080925 A1 | 4/2007 | Radivojevic et al. |
| 2007/0109558 A1 | 5/2007 | Harding |
| 2007/0122927 A1 | 5/2007 | Li et al. |
| 2007/0176165 A1 | 8/2007 | Forrest et al. |
| 2007/0183047 A1 | 8/2007 | Phillips et al. |
| 2007/0206181 A1 | 9/2007 | Arenberg et al. |
| 2008/0013005 A1 | 1/2008 | Deane |
| 2008/0080789 A1 | 4/2008 | Marks |
| 2008/0157965 A1 | 7/2008 | Shahar |
| 2008/0170750 A1 | 7/2008 | Gordon |
| 2008/0259310 A1 | 10/2008 | Wada |
| 2008/0269482 A1 | 10/2008 | Pschirer et al. |
| 2008/0284925 A1 | 11/2008 | Han |
| 2008/0297487 A1 | 12/2008 | Hotelling et al. |
| 2009/0001254 A1* | 1/2009 | Ogawa ............... H01L 27/14676 250/208.1 |
| 2009/0009747 A1 | 1/2009 | Wolf |
| 2009/0046543 A1 | 2/2009 | De Hoog et al. |
| 2009/0009701 A1 | 4/2009 | Yamaguchi |
| 2009/0153841 A1 | 6/2009 | Ophey et al. |
| 2009/0185158 A1 | 7/2009 | Wolf |
| 2009/0188547 A1 | 7/2009 | Hayashi et al. |
| 2009/0225319 A1 | 9/2009 | Lee |
| 2009/0231582 A1 | 9/2009 | Aebischer |
| 2009/0322677 A1 | 12/2009 | Lee et al. |
| 2010/0073462 A1 | 3/2010 | Lee et al. |
| 2010/0091263 A1 | 4/2010 | Kumagai et al. |
| 2010/0141927 A1 | 6/2010 | Hashimoto et al. |
| 2010/0141964 A1 | 6/2010 | Horsch |
| 2010/0194942 A1 | 8/2010 | Wada |
| 2010/0231513 A1 | 9/2010 | Deliwala |
| 2010/0258179 A1 | 10/2010 | Wieting |
| 2010/0279458 A1 | 11/2010 | Yeh |
| 2010/0282309 A1 | 11/2010 | Pschirer et al. |
| 2010/0283868 A1 | 11/2010 | Clark et al. |
| 2010/0297405 A1 | 11/2010 | Flores et al. |
| 2011/0032365 A1 | 2/2011 | Yett |
| 2011/0055846 A1 | 3/2011 | Perez et al. |
| 2011/0096319 A1 | 4/2011 | Otani et al. |
| 2011/0099105 A1 | 4/2011 | Mennie et al. |
| 2011/0103215 A1 | 5/2011 | Hotta et al. |
| 2011/0122287 A1 | 5/2011 | Kunishige et al. |
| 2011/0123188 A1 | 5/2011 | Cardwell et al. |
| 2011/0127788 A1 | 6/2011 | Nakanishi |
| 2011/0181553 A1 | 7/2011 | Brown et al. |
| 2011/0194097 A1 | 8/2011 | Yamaguchi et al. |
| 2011/0284756 A1 | 11/2011 | Miko et al. |
| 2011/0286661 A1 | 11/2011 | Lee et al. |
| 2011/0297235 A1 | 12/2011 | Bergmann |
| 2011/0306413 A1 | 12/2011 | Bickerstaff et al. |
| 2011/0317146 A1 | 12/2011 | Gu et al. |
| 2012/0013885 A1 | 1/2012 | Yang et al. |
| 2012/0061587 A1 | 3/2012 | Wu |
| 2012/0062517 A1 | 3/2012 | Lai et al. |
| 2012/0063287 A1 | 3/2012 | Yamamoto et al. |
| 2012/0105690 A1 | 5/2012 | Waqas et al. |
| 2012/0146028 A1 | 6/2012 | Oda et al. |
| 2012/0160298 A1 | 6/2012 | Kanamoto et al. |
| 2012/0162410 A1 | 6/2012 | Vaillant |
| 2012/0206336 A1 | 8/2012 | Bruder |
| 2012/0242867 A1 | 9/2012 | Shuster |
| 2012/0249998 A1 | 10/2012 | Eisele et al. |
| 2012/0250137 A1 | 10/2012 | Maxik et al. |
| 2012/0262365 A1 | 10/2012 | Mallinson |
| 2012/0262696 A1 | 10/2012 | Eisele et al. |
| 2012/0289672 A1 | 11/2012 | Kastler et al. |
| 2012/0293651 A1 | 11/2012 | Kawamata et al. |
| 2012/0320160 A1 | 12/2012 | Drazic |
| 2012/0328906 A1 | 12/2012 | Kwon et al. |
| 2013/0033579 A1 | 2/2013 | Wajs |
| 2013/0076695 A1 | 3/2013 | Gomez et al. |
| 2013/0135604 A1 | 5/2013 | Gogolla et al. |
| 2013/0201492 A1 | 8/2013 | Takahashi |
| 2013/0222551 A1 | 8/2013 | Shamir et al. |
| 2013/0235390 A1 | 9/2013 | Holzapfel et al. |
| 2013/0242283 A1 | 9/2013 | Bailey et al. |
| 2013/0266210 A1 | 10/2013 | Morgan-Mar et al. |
| 2013/0271818 A1 | 10/2013 | Maxik et al. |
| 2013/0320302 A1 | 12/2013 | Park et al. |
| 2014/0015242 A1 | 1/2014 | Forrest |
| 2014/0043610 A1 | 2/2014 | Engel et al. |
| 2014/0066656 A1 | 3/2014 | Bruder et al. |
| 2014/0078376 A1 | 3/2014 | Shuster |
| 2014/0124782 A1 | 5/2014 | Jung et al. |
| 2014/0132724 A1 | 5/2014 | Choi et al. |
| 2014/0209789 A1 | 7/2014 | Hu |
| 2014/0211295 A1 | 7/2014 | Maxik et al. |
| 2014/0217329 A1 | 8/2014 | Hayoz et al. |
| 2014/0233028 A1 | 8/2014 | Englund |
| 2014/0291480 A1 | 10/2014 | Bruder et al. |
| 2014/0347442 A1 | 11/2014 | Wang et al. |
| 2014/0368726 A1 | 12/2014 | Gladnick |
| 2015/0029326 A1 | 1/2015 | Backman et al. |
| 2015/0085166 A1 | 3/2015 | Shuster |
| 2015/0111337 A1 | 4/2015 | Welker et al. |
| 2015/0124241 A1 | 5/2015 | Eisele et al. |
| 2015/0124268 A1 | 5/2015 | Bruder et al. |
| 2015/0132887 A1 | 5/2015 | Welker et al. |
| 2015/0170400 A1 | 6/2015 | Seitz et al. |
| 2015/0286340 A1 | 10/2015 | Send et al. |
| 2015/0346911 A1 | 12/2015 | Christiansson |
| 2015/0372046 A1 | 12/2015 | Kim et al. |
| 2016/0099429 A1 | 4/2016 | Bruder et al. |
| 2016/0124074 A1 | 5/2016 | Wonneberger et al. |
| 2016/0127664 A1 | 5/2016 | Bruder et al. |
| 2016/0139243 A1 | 5/2016 | Send et al. |
| 2016/0140786 A1 | 5/2016 | Wang |
| 2016/0155575 A1 | 6/2016 | Yamato et al. |
| 2016/0177177 A1 | 6/2016 | Koenemann et al. |
| 2016/0211464 A1 | 7/2016 | Tanabe et al. |
| 2016/0218302 A1 | 7/2016 | Hermes et al. |
| 2016/0224110 A1 | 8/2016 | Massonneau et al. |
| 2016/0248021 A1 | 8/2016 | Sundarraj et al. |
| 2016/0255323 A1 | 9/2016 | Wajs |
| 2016/0266257 A1 | 9/2016 | Bruder et al. |
| 2016/0286199 A1 | 9/2016 | Wajs et al. |
| 2016/0320489 A1 | 11/2016 | Send et al. |
| 2016/0364015 A1 | 12/2016 | Send et al. |
| 2017/0039793 A1 | 2/2017 | Send et al. |
| 2017/0074652 A1 | 3/2017 | Send et al. |
| 2017/0082426 A1 | 3/2017 | Bruder et al. |

(56) References Cited

U.S. PATENT DOCUMENTS

| | | |
|---|---|---|
| 2017/0082486 A1 | 3/2017 | Send et al. |
| 2017/0123593 A1 | 5/2017 | Send et al. |
| 2017/0140786 A1 | 5/2017 | Send et al. |
| 2017/0183295 A1 | 6/2017 | Koenemann et al. |
| 2017/0205230 A1 | 7/2017 | Send et al. |
| 2017/0219694 A1 | 8/2017 | Send et al. |
| 2017/0219709 A1 | 8/2017 | Send et al. |
| 2017/0237926 A1 | 8/2017 | Bruder et al. |
| 2017/0250334 A1 | 8/2017 | Hermes et al. |
| 2017/0263868 A1 | 9/2017 | Tanabe et al. |
| 2017/0309828 A1 | 10/2017 | Tanabe et al. |
| 2017/0363465 A1 | 12/2017 | Send et al. |
| 2017/0363741 A1 | 12/2017 | Send et al. |
| 2018/0003993 A1 | 1/2018 | Send et al. |
| 2018/0007343 A1 | 1/2018 | Send et al. |
| 2018/0017679 A1 | 1/2018 | Valouch et al. |
| 2018/0031672 A1 | 2/2018 | Bruder et al. |
| 2018/0044357 A1 | 2/2018 | Spielmann et al. |
| 2018/0067213 A1 | 3/2018 | Send et al. |
| 2018/0136319 A1 | 5/2018 | Send et al. |
| 2018/0182980 A1 | 6/2018 | Lennartz et al. |
| 2018/0210064 A1 | 7/2018 | Send et al. |
| 2018/0231376 A1 | 8/2018 | Send et al. |
| 2018/0238993 A1 | 8/2018 | Send et al. |
| 2018/0243045 A1 | 8/2018 | Franjic et al. |
| 2018/0249051 A1 | 8/2018 | Send et al. |
| 2018/0276843 A1 | 9/2018 | Send et al. |
| 2018/0329024 A1 | 11/2018 | Send et al. |
| 2018/0356501 A1 | 12/2018 | Send et al. |
| 2019/0129035 A1 | 5/2019 | Valouch et al. |
| 2019/0129036 A1 | 5/2019 | Valouch et al. |
| 2019/0140129 A1 | 5/2019 | Valouch et al. |
| 2019/0157470 A1 | 5/2019 | Send et al. |
| 2019/0170849 A1 | 6/2019 | Hermes et al. |
| 2019/0172964 A1 | 6/2019 | Hermes et al. |
| 2019/0198206 A1 | 6/2019 | Ter Maat et al. |
| 2019/0277703 A1* | 9/2019 | Valouch ............ H01L 31/02966 |
| 2019/0339356 A1 | 11/2019 | Schildknecht et al. |
| 2019/0353767 A1 | 11/2019 | Eberspach et al. |
| 2020/0003899 A1 | 1/2020 | Lungenschmied et al. |
| 2021/0223395 A1 | 7/2021 | Valouch et al. |

FOREIGN PATENT DOCUMENTS

| | | |
|---|---|---|
| CN | 1270706 | 10/2000 |
| CN | 1677053 A | 10/2005 |
| CN | 1723564 A | 1/2006 |
| CN | 1777859 | 5/2006 |
| CN | 1809801 A | 7/2006 |
| CN | 1894976 | 1/2007 |
| CN | 1896686 A | 1/2007 |
| CN | 101129074 | 2/2008 |
| CN | 101290348 A | 10/2008 |
| CN | 101449181 | 6/2009 |
| CN | 101650173 A | 2/2010 |
| CN | 101655350 | 2/2010 |
| CN | 101859439 A | 10/2010 |
| CN | 102096962 | 6/2011 |
| CN | 201897828 | 7/2011 |
| CN | 102185004 A | 9/2011 |
| CN | 102435136 | 5/2012 |
| CN | 102506754 A | 6/2012 |
| CN | 102549380 | 7/2012 |
| CN | 102549381 A | 7/2012 |
| CN | 102737435 | 10/2012 |
| CN | 102833569 | 12/2012 |
| CN | 103106411 A | 5/2013 |
| CN | 103322910 A | 9/2013 |
| CN | 103403494 | 11/2013 |
| CN | 103492835 | 1/2014 |
| CN | 103649677 | 3/2014 |
| CN | 103650478 | 3/2014 |
| DE | 2 417 854 | 10/1974 |
| DE | 25 01 124 A1 | 8/1975 |
| DE | 32 25 372 A1 | 2/1983 |
| DE | 42 11 875 | 10/1993 |
| DE | 196 04 856 | 8/1997 |
| DE | 10146752 | 4/2002 |
| DE | 10 2005 043 627 A1 | 3/2007 |
| DE | 10 2005 053 995 | 5/2007 |
| DE | 10 2007 037 875 A1 | 2/2009 |
| DE | 10 2010 042 278 | 4/2012 |
| DE | 20 2012 009 070 | 1/2013 |
| DE | 10 2014 108 353 A1 | 12/2014 |
| EP | 0 112 169 A2 | 6/1984 |
| EP | 0 185 450 A2 | 6/1986 |
| EP | 0 309 631 | 4/1989 |
| EP | 0 754 930 A2 | 1/1997 |
| EP | 1 176 646 A1 | 1/2002 |
| EP | 1 191 819 | 3/2002 |
| EP | 1 330 117 | 7/2003 |
| EP | 1 373 272 | 1/2004 |
| EP | 1 667 246 A1 | 6/2006 |
| EP | 1 832 910 | 9/2007 |
| EP | 2 205 657 A1 | 7/2010 |
| EP | 2 220 141 A1 | 8/2010 |
| EP | 2 507 286 A2 | 10/2012 |
| EP | 2 527 866 A1 | 11/2012 |
| EP | 2 725 617 A1 | 4/2014 |
| EP | 2 735 542 | 5/2014 |
| EP | 2 813 324 | 12/2014 |
| EP | 2 818 493 A1 | 12/2014 |
| EP | 15 153 215 | 1/2015 |
| EP | 2 831 180 | 2/2015 |
| EP | 15 157 363 | 3/2015 |
| EP | 15 164 653 | 4/2015 |
| EP | 2 884 303 A1 | 6/2015 |
| EP | 15 177 275 | 7/2015 |
| EP | 15 180 353 | 8/2015 |
| EP | 15 180 354 | 8/2015 |
| EP | 15 185 005 | 9/2015 |
| EP | 15 191 960 | 10/2015 |
| EP | 15 196 238 | 11/2015 |
| EP | 15 196 239 | 11/2015 |
| EP | 15 197 744 | 12/2015 |
| EP | 15 155 835 | 2/2016 |
| EP | 16 155 834 | 2/2016 |
| EP | 16 155 845 | 2/2016 |
| EP | 3 008 421 | 4/2016 |
| EP | 3 008 757 | 4/2016 |
| EP | 3 036 503 | 6/2016 |
| GB | 2 432 723 | 5/2007 |
| JP | S59-50579 | 3/1984 |
| JP | 59-79805 | 5/1984 |
| JP | 61-89501 | 5/1986 |
| JP | S61-135280 | 6/1986 |
| JP | 61-186804 | 8/1986 |
| JP | 61-245579 | 10/1986 |
| JP | 64-17485 | 1/1989 |
| JP | H02-170004 | 6/1990 |
| JP | 04-240817 | 8/1992 |
| JP | 5-48833 A | 2/1993 |
| JP | 05-240640 | 9/1993 |
| JP | 6-133321 | 5/1994 |
| JP | 7-146113 | 6/1995 |
| JP | 7-318630 | 12/1995 |
| JP | 8-159714 | 6/1996 |
| JP | 8-292586 A | 11/1996 |
| JP | 10-26513 A | 1/1998 |
| JP | 10-221064 | 8/1998 |
| JP | H11-230860 | 8/1999 |
| JP | 11-257917 | 9/1999 |
| JP | 11-325825 | 11/1999 |
| JP | 3110095 | 11/2000 |
| JP | 2001-516150 | 9/2001 |
| JP | 2002-176191 | 6/2002 |
| JP | 2003-307407 | 10/2003 |
| JP | 2004-508691 | 3/2004 |
| JP | 2005-509909 | 4/2005 |
| JP | 2005-189087 | 7/2005 |
| JP | 2005-241340 A | 9/2005 |
| JP | 2005-296268 | 10/2005 |
| JP | 2006-514366 | 4/2006 |
| JP | 2006-337254 | 12/2006 |

(56) References Cited

FOREIGN PATENT DOCUMENTS

| | | |
|---|---|---|
| JP | 2007-521559 | 8/2007 |
| JP | 2007-530978 | 11/2007 |
| JP | 2008-522418 | 6/2008 |
| JP | 1 947 477 | 7/2008 |
| JP | 2008-164538 | 7/2008 |
| JP | 2009-257890 | 11/2009 |
| JP | 2010-081002 | 4/2010 |
| JP | 2010-218770 | 9/2010 |
| JP | 2010-531520 | 9/2010 |
| JP | 2011-503673 | 1/2011 |
| JP | 2011-027707 | 2/2011 |
| JP | 2012-519584 | 8/2012 |
| JP | 2012-522248 | 9/2012 |
| JP | 2012-229964 | 11/2012 |
| JP | 2012-231154 | 11/2012 |
| JP | 2013-051674 | 3/2013 |
| TW | 2011-40111 A | 11/2011 |
| WO | 99-09603 | 2/1999 |
| WO | WO 01/29576 A1 | 4/2001 |
| WO | WO 02/076988 | 10/2002 |
| WO | WO 02/101838 A1 | 12/2002 |
| WO | 03/012371 A1 | 2/2003 |
| WO | WO 03/098617 | 11/2003 |
| WO | WO 2004/072909 | 8/2004 |
| WO | WO 2004/114112 A1 | 12/2004 |
| WO | WO 2005/106965 A1 | 11/2005 |
| WO | WO 2007/006717 | 1/2007 |
| WO | WO 2007/054470 A1 | 5/2007 |
| WO | WO 2008/122531 | 10/2008 |
| WO | WO 2008/145172 | 12/2008 |
| WO | WO 2009/013282 A1 | 1/2009 |
| WO | WO 2009/021859 | 2/2009 |
| WO | WO 2009/053291 A1 | 4/2009 |
| WO | WO 2009/058115 A1 | 5/2009 |
| WO | WO 2009/105801 | 9/2009 |
| WO | WO 2010/088032 A2 | 8/2010 |
| WO | WO 2010/094636 A1 | 8/2010 |
| WO | WO 2010/118409 | 10/2010 |
| WO | WO 2010/118450 | 10/2010 |
| WO | WO 2011/067192 A2 | 6/2011 |
| WO | WO 2011/083722 | 7/2011 |
| WO | WO 2011/091967 A2 | 8/2011 |
| WO | WO 2012/001628 A1 | 1/2012 |
| WO | WO 2012/046181 A1 | 4/2012 |
| WO | WO 2012/049038 A1 | 4/2012 |
| WO | WO 2012/085803 A1 | 6/2012 |
| WO | WO 2012/091814 | 7/2012 |
| WO | WO 2012/110924 A1 | 8/2012 |
| WO | WO 2012/115593 | 8/2012 |
| WO | WO 2012/139354 | 10/2012 |
| WO | 2012/152812 A1 | 11/2012 |
| WO | 2012/168395 A1 | 12/2012 |
| WO | WO 2006/134370 | 12/2012 |
| WO | WO 2013/009676 | 1/2013 |
| WO | WO 2013/090960 | 6/2013 |
| WO | WO 2013/091016 A1 | 6/2013 |
| WO | 2013/118037 A1 | 8/2013 |
| WO | WO 2013/116883 | 8/2013 |
| WO | WO 2013/144177 A1 | 10/2013 |
| WO | WO 2013/156101 A1 | 10/2013 |
| WO | 2013/170982 A1 | 11/2013 |
| WO | 2014/086722 A1 | 6/2014 |
| WO | 2014/097489 A1 | 6/2014 |
| WO | WO 2014/097181 A1 | 6/2014 |
| WO | WO 2014/123522 | 8/2014 |
| WO | 2014/178923 A2 | 11/2014 |
| WO | 2014/198623 A1 | 12/2014 |
| WO | 2014/198625 A1 | 12/2014 |
| WO | 2014/198626 A1 | 12/2014 |
| WO | 2014/198629 A1 | 12/2014 |
| WO | 2015/024871 A1 | 2/2015 |
| WO | WO 2015/081362 | 6/2015 |
| WO | WO 2015/091607 | 6/2015 |
| WO | WO 2015/150989 | 10/2015 |
| WO | WO 2015/159192 | 10/2015 |
| WO | WO 2015/161989 | 10/2015 |
| WO | WO 2015/162528 | 10/2015 |
| WO | WO 2015/176981 | 11/2015 |
| WO | WO 2015/177784 A2 | 11/2015 |
| WO | 2015/193804 A2 | 12/2015 |
| WO | 2016/005893 A1 | 1/2016 |
| WO | WO 2016/012274 | 1/2016 |
| WO | 2016/051323 A1 | 4/2016 |
| WO | WO 2016/066494 | 5/2016 |
| WO | 2016/092449 A1 | 6/2016 |
| WO | 2016/092454 A1 | 6/2016 |
| WO | WO 2016/083914 | 6/2016 |
| WO | WO 2016/120392 | 8/2016 |
| WO | WO 2016/146725 | 9/2016 |
| WO | WO 2017/089553 | 6/2017 |
| WO | WO 2017/144401 | 8/2017 |
| WO | WO 2018/096083 | 5/2018 |
| WO | WO 2018/115073 | 6/2018 |
| WO | WO 2018/146138 | 8/2018 |
| WO | WO 2018/146146 | 8/2018 |
| WO | WO 2018/167215 | 9/2018 |
| WO | WO 2018/193045 | 10/2018 |
| WO | WO 2019/002199 | 1/2019 |
| WO | WO 2019/011803 | 1/2019 |
| WO | WO 2019/038354 | 2/2019 |
| WO | WO 2019/042956 | 3/2019 |
| WO | WO 2019/042959 | 3/2019 |

OTHER PUBLICATIONS

Chinese Office Action dated Jan. 29, 2019, in Chinese Patent Application No. 201580036919.9.
Pekkola et al., "Focus-Induced Photoresponse: a novel way to measure distances with photodetectors", *Scientific Reports* (2018) 8:9208, 8 pages.
L. Pintilie, et al., "Field-effect-assisted photoconductivity in PbS films deposited on silicon dioxide", *J. Appl. Phys.* 91, p. 5782, 2002.
Extended Search Report dated Aug. 23, 2011 in Europe Application No. 11154531.5 (With English Translation of Category of Cited Documents).
Erwin Bacher, et al., "Synthesis and Characterization of Photo-Cross-Linkable Hole-Conducting Polymers", Macromolecules, vol. 38, 2005, pp. 1640-1647.
H. Bruce Goodbrand, et al., "Ligand-Accelerated Catalysis of the Ullmann Condensation: Application to Hole Conducting Triarylamines", J. Org. Chem., vol. 64, 1999, pp. 670-674.
Felix E. Goodson, et al., "Palladium-Catalyzed Synthesis of Pure, Regiodefined Polymeric Triarylamines", J. Am. Chem. Soc., vol. 121, 1999, pp. 7527-7539.
John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.
Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.
Ping-Hsin Huang, et al., "Synthesis and Characterization of new fluorescent two-photon absorption chromophores", J. Mater. Chem., vol. 16, 2006, pp. 850-857.
Qinglan Huang, et al., "Molecularly 'Engineered' Anode Adsorbates for Probing OLED Interfacial Structure—Charge Injection/Luminance Relationships: Large, Structure-Dependent Effects", J. Am. Chem. Soc., vol. 125, 2003, pp. 14704-14705.
A. Balionyte, et al., "Carbazolyl-substituted triphenyldiamine derivatives as novel photoconductive amorphous molecular materials", Journal of Photochemistry and Photobiology A: Chemistry, vol. 162, 2004, pp. 249-252.
G. R. A. Kumara, et al., "Fabrication of Dye-Sensitized Solar Cells Using Triethylamine Hydrothiocyanate as a CuI Crystal Growth Inhibitor", Langmuir, vol. 18, 2002, pp. 10493-10495.
Lukas Schmidt-Mende, et al., "Organic Dye for Highly Efficient Solid-State Dye-Sensitized Solar Cells", Adv. Mater., vol. 17, No. 7, 2005, pp. 813-815.

(56) References Cited

OTHER PUBLICATIONS

James Lindley, "Copper Assisted Nucleophilic Substitution of Aryl Halogen", Tetrahedron, vol. 40, No. 9, 1984, pp. 1433-1456.
Yunqi Liu, et al., "Synthesis and characterization of a novel bipolar polymer for light-emitting diodes", Chem. Commun., vol. 24, 1998, pp. 2747-2748.
Narukuni Hirata, et al., "Interface engineering for solid-state dye-sensitised nanocrystalline solar cells: the use of an organic redox cascade", Chem. Commun., vol. 5, 2006, pp. 535-537.
Qingjiang Yu, et al., "High-Efficiency Dye-Sensitized Solar Cells: The Influence of Lithium Ions on Exciton Dissociation, Charge Recombination, and Surface States", ACS Nano, vol. 4, No. 10, 2010, pp. 6032-6038.
Bin Peng, et al., "Systematic investigation of the role of compact $TiO_2$ solar cells", Coordination Chemistry Reviews, vol. 248, 2004, pp. 1479-1489.
Jiun Yi Shen, et al., "High $T_g$ blue emitting materials for electroluminescent devices", J. Mater. Chem., vol. 15, 2005, pp. 2455-2463.
Tobat P. I. Saragi, et al., "Comparison of Charge-Carrier Transport in Thin Films of Spiro-Linked Compounds and Their Corresponding Parent Compounds", Adv. Funct. Mater., vol. 16, 2006, pp. 966-974.
V. P. S. Perera, et al., "Dye-Sensitized Solid-State Photovoltaic Cells Based on Dye Multilayer-Semiconductor Nanostructures", J. Phys. Chem. B, vol. 107, 2003, pp. 13758-13761.
U. Bach, et al., "Solid-state dye-sensitized mesoporous $TiO_2$ solar cells with high photon-to-electron conversion efficiencies", Nature, vol. 395, 1998, pp. 583-585.
John P. Wolfe, et al., "Rational Development of Practical Catalysts for Aromatic Carbon-Nitrogen Bond Formation", Acc. Chem. Res. vol. 31, 1998, pp. 805-818.
Bryant H. Yang, et al., "Palladium-Catalyzed amination of aryl halides and sulfonates", Journal of Organometallic Chemistry, vol. 576, 1999, pp. 125-146.
Zhong Hui Li, et al., "Synthesis and Functional Properties of Strongly Luminescent Diphenylamino End-Capped Oligophenylenes", J. Org. Chem., vol. 69, 2004, pp. 921-927.
Brian O'Regan, et al., "A low-cost, high-efficiency solar cell based on dye-sensitized colloidal $TiO_2$ films", Letters to Nature, vol. 353, 1991, pp. 737-740.
International Search Report dated Sep. 24, 2014 in PCT/EP2014/061682.
International Preliminary Report on Patentability and Written Opinion dated Dec. 15, 2015 in PCT/EP2014/061682.
International Preliminary Report on Patentability and Written Opinion dated Dec. 23, 2015 in PCT/EP2014/061695.
International Search Report and Written Opinion dated May 31, 2012 in PCT/IB2012/050592 filed on Feb. 9, 2012.
Supplementary European Search Report dated Nov. 19, 2014, issued in corresponding European Patent Application No. EP 12 74 6808.
Volker Viereck, et al., Large-area applications of optical MEMS: micromirror arrays guide daylight, optimize indoor illumination, Optical Components, Photonik International 2, 2009, pp. 48-49.
C.U. Murade, et al., "High speed adaptive liquid microlens array", Optics Express, vol. 20, No. 16, Jul. 30, 2012, pp. 18180-18187.
Jason Heikenfeld, et al., "Recent Progress in Arrayed Electrowetting Optics", Optics & Photonics News, vol. 20, No. 1, Jan. 1, 2009, pp. 20-26.
Tao Peng, "Algorithms and models for 3-D shape measurement using digital fringe projections", Dissertation, University of Maryland (College Park, Md.), Jan. 16, 2007, 268 pages (http://drum.lib.umd.edu//handle/1903/6654; http://en.wikipedia.org/wiki/Gray_code; http://en.wikipedia.org/wiki/Structured-light_3D_scanner).
Jie-Ci Yang et al., "An Intelligent Automated Door Control System Based on a Smart", Sensors, 2013, 13(5), pp. 5923-5936; doi: 10.3390/s130505923 www.mdpi.com/journal/sensors.
Tomas Leijtens, et al., "Hole Transport Materials with Low Glass Transition Temperatures and High Solubility for Application in Solid-State Dye-Sensitized Solar Cells", ACS Nano, vol. 6, No. 2, 2012, pp. 1455-1462 www.acsnano.org.
International Search Report and Written Opinion dated Oct. 31, 2014 in PCT/EP2014/067466 filed Aug. 15, 2014.
Paul Pargas, "Phenomena of Image Sharpness Recognition of CdS and CdSe Photoconductors" Journal of the Optical Society of America, vol. 54, No. 4, Apr. 1964, pp. 516-519.
Paul Pargas, "A Lens Measuring Method Using Photoconductive Cells" Journal of the SMPTE, vol. 74, Jun. 1965, pp. 501-504.
Jack T. Billings, "An Improved Method for Critical Focus of Motion-Picture Optical Printers" Journal of the SMPTE, vol. 80, Aug. 1971, pp. 624-628.
International Search Report dated Sep. 9, 2014 in PCT/EP2014/061688 filed Jun. 5, 2014.
Written Opinion of the International Searching Authority dated Sep. 9, 2014 in PCT/EP2014/061688 filed Jun. 5, 2014.
International Search Report and Written Opinion of the International Searching Authority dated Mar. 12, 2015 in PCT/EP2014/078155 Filed Dec. 17, 2014.
International Search Report and Written Opinion of the International Searching Authority dated May 16, 2014 in PCT/IB2013/061095.
Seigo ITO, et al., "High-Efficiency Organic-Dye-Sensitized Solar Cells Controlled by Nanocrystalline-$TiO_2$ Electrode Thickness", Adv. Mater., vol. 18, 2006, pp. 1202-1205.
Atte Haapalinna, et al., "Measurement of the Absolute Linearity of Photodetectors with a Diode Laser," Meas. Sci. Technol., 10, (1999) 1075-1078.
M. R. Andersen, et al., "Kinect Depth Sensor Evaluation for Computer Vision Applications",Electrical and Computer Engineering, Technical Report ECE-TR-6, Aarhus University, 2012, 39 pages.
Takumi Kinoshita, et al., "Wideband dye-sensitized solar cells employing a phosphine-coordinated ruthenium sensitizer", Nature Photonics, vol. 7, 2013, pp. 535-239.
Office Action dated Apr. 22, 2015 in Chinese Patent Application No. 201280018328.5 (submitting English translation only).
International Search Report and Written Opinion dated Sep. 3, 2014 in PCT/EP2014/061691.
International Preliminary Report on Patentability dated Sep. 25, 2015 in PCT/EP2014/061691.
Kuthirumal, S., et al., "Flexible Depth of Field Photography," IEEE Transactions on Pattern Analysis and Machine Intelligence, vol. 33, No. 1 (2011), pp. 58-71.
Hiura Shinsaku et al., "Depth Measurement by the Multi-Focus Camera," Computer Vision and Pattern Recognition, 1998. Proceedings. 1998 IEEE Computer Society Conference on Santa Barbara, CA, USA, Jun. 23-25, 1998, pp. 953-959.
International Preliminary Report on Patentability and Written Opinion dated Dec. 23, 2015 in PCT/EP2014/061688.
Denis Klimentjew, et al., "Multi Sensor Fusion of Camera and 3D Laser Range Finder for Object Recognition" 2010 IEEE International Conference on Multisensor Fusion and Integration for Intelligent Systems, 2010, pp. 236-241.
International Search Report and Written Opinion dated Nov. 21, 2014 in PCT/EP2014/067465.
"So funktioniert die DLP-Technologie" DLP-Technologie—www.dlp.com/de/technology/how-dlp-works, 2014, 2 Pages.
"NEW—Ultra-Compact Pockels Cells with Brewster Polarizer and Waveplate for Laser Q-Switching" Leysop Ltd, Manfacturers and Suppliers of Electro-Optic Components—http://www.leysop.com/integrated_pockels_cell.htm, Aug. 4, 2013, 2 Pages.
D. Scaramuzza, et al., "Extrinsic Self Calibration of a Camera and a 3D Laser Range Finder from Natural Scenes" 2007 IEEE/RSJ International Conference on Intelligent Robots and Systems, 2007, (4164-4169) 8 pages.
International Search Report dated Aug. 28, 2015, in PCT/IB2015/052769, filed Apr. 16, 2015.
International Search Report and Written Opinion dated Jun. 30, 2015 in PCT/IB15/052233 Filed Mar. 26, 2015.
International Search Report dated Sep. 22, 2015, in Application No. PCT/IB2015/052785, filed on Apr. 16, 2015.
International Search Report dated Nov. 27, 2015, in PCT/IB2015/055121, filed Jul. 7, 2015.

(56) References Cited

OTHER PUBLICATIONS

International Search Report and Written Opinion dated Mar. 29, 2016, in PCT/IB2015/054536, filed Jun. 16, 2015.
International Search Report and Written Opinion dated Jan. 18, 2016 in PCT/IB2015/057412 filed Sep. 28, 2015.
Wang, Feng-Peng et al., "Distance Measurement using Digital Cameras Based on Laser Spot Detection", published on Jun. 30, 2011, School of Physics and Electronic Information, Gannan Normal University, Ganzhou 341000, China (with English Abstract).
Bahaa E. A. Saleh, et al., "Fundamentals of Photonics" John Wiley & Sons, Inc., Chapter 3, 1991, pp. 80-107 (with Cover Page).
International Search Report dated Mar. 21, 2016, in PCT/IB2015/059406.
International Search Report and Written Opinion in PCT/IB2015/059411 dated Mar. 16, 2016 filed Dec. 7, 2015.
Nam-Trung Nguyen, "Micro-optofluidic Lenses: A review", Biomicrofluidics, 2010, vol. 4, 031501-15.
Uriel Levy et al., "Tunable optofluidic devices", Microfluid Nanofluid, 2008, vol. 4, pp. 97-105.
International Search Report dated Mar. 22, 2016 in PCT/IB2015/059408 filed Dec. 7, 2015.
International Search Report dated Mar. 15, 2016 in PCT/IB2015/059404 filed Dec. 7, 2015.
International Search Report and Written Opinion dated Mar. 21, 2016, in PCT/IB2015/059403, filed Dec. 7, 2015.
International Preliminary Report and Written Opinion dated Mar. 10, 2016, in PCT/IB2015/059404.
International Search Report and Written Opinion dated May 27, 2016, in PCT/EP2016/051817, filed Jan. 28, 2016.
International Search Report dated May 20, 2016, in PCT/EP2016/054532.
International Preliminary Report on Patentability dated Aug. 1, 2017, in PCT/EP2016/051817.
Linyi Bian, et al., "Recent Progress in the Design of Narrow Bandgap Conjugated Polymers for High-Efficiency Organic Solar Cells", Progress in Polymer Science, vol. 37, 2012, pp. 1292-1331.
Antonio Facchetti, "Polymer donor-polymer acceptor (all-polymer) solar Cells", Materials Today, vol. 16 No. 4, Apr. 2013, pp. 123-132.
Graham H. Carey, et al., "Colloidal Quantum Dot Solar Cells", Chemical Reviews, vol. 115 No. 23, 2015, pp. 12732-12763.
Jason P. Clifford, et al., "Fast, Sensitive and Spectrally Tunable Colloidal Quantum-Dot Photodetectors", Nature Nanotechnology, Jan. 2009, pp. 1-5.
Kotaro Fukushima, et al., "Crystal Structures and Photocarrier Generation of Thioindigo Derivatives", Journal of Physical Chemistry B, vol. 102 No. 31, 1998, pp. 5985-5990.
Serap Günes, et al., "Hybrid Solar Cells", Inorganica Chimica Acta, vol. 361, 2008, pp. 581-588.
R. S. Mane, et al., "Chemical Deposition Method for Metal Chalcogenide Thin Films", Materials Chemistry and Physics, vol. 65, 2000, pp. 1-31.
Wilfried Hermes, "Emerging Thin-Film Photovoltaic Technologies", Chemie Ingenieur Technik, 2015, vol. 87 No. 4, pp. 376-389.
Paul H. Keck, "Photoconductivity in Vacuum Coated Selenium Films", Journal Optical Society of America, vol. 42 No. 4, Apr. 1952, pp. 221-225, with cover page.
Frank H. Moser, et al., "Phthalocyanine Compounds", Reinhold Publishing Corporation, 1963, p. 69-76 with cover pages.
M. Popescu, "Disordered Chalcogenide Optoelectronic Materials: Phenomena and Applications", Journal of Optoelectronics and Advanced Materials, vol. 7 No. 4, Aug. 2005, pp. 2189-2210.
Friedrich Andreas Sperlich, "Electron Paramagnetic Resonance Spectroscopy of Conjugated Polymers and Fullerenes for Organic Photovoltaics", Julius-Maximilians-Universität Würzburg, 2013, pp. 1-127.
F. Stöckmann, "Superlinear Photoconductivity", Physica Status Solidi, vol. 34, 1969, pp. 751-757.
Evangelos Theocharous, "Absolute Linearity Measurements on a PbS Detector in the Infrared", Applied Optics, vol. 45 No. 11, Apr. 10, 2006, pp. 2381-2386.
Evangelos Theocharous, et al., "Absolute Linearity Measurements on HgCdTe Detectors in the Infrared Region", Applied Optics, vol. 43 No. 21, Jul. 20, 2004, pp. 4182-4188.
Arthur L. Thomas, "Phthalocyanine Research and Applications", CRC Press, 1990, pp. 253-271 with cover pages.
International Search Report and Written Opinion dated Jul. 19, 2016 in PCT/EP2016/058487 filed Apr. 18, 2016.
International Preliminary Report on Patentability and Written Opinion dated Feb. 1, 2018, in PCT/EP2016/066783.
http://www.plenoptic.info/pages/refocusing.html.
C. Hahne, A. Aggoun, S. Haxha, V. Velisavljevic, and J. Fernández, "Light field geometry of a standard plenoptic camera," Opt. Express 22, 26659-26673 (2014).
C. Hahne, A. Aggoun, S. Haxha, V. Velisavljevic, and J. Fernández, "Baseline of virtual cameras acquired by a standard plenoptic camera setup," in 3D-TV-Conference: The True Vision—Capture, Transmission and Display of 3D Video (3DTV-CON), Jul. 2-4, 2014.
C. Hahne, A. Aggoun, and V. Velisavljevic, "The refocusing distance of a standard plenoptic photograph," in 3D-TV-Conference: The True Vision—Capture, Transmission and Display of 3D Video (3DTV-CON), Jul. 8-10, 2015.
C. Hahne and A. Aggoun, "Embedded FIR filter design for real-time refocusing using a standard plenoptic video camera," Proc. SPIE 9023, in Digital Photography X, 902305 (Mar. 7, 2014).
Baeg et al., "Organic Light Detectors: Photodiodes and Phototransistors", *Advanced Materials*, vol. 25, No. 31, Mar. 11, 2013, pp. 4267-4295.
Office Action dated Jan. 3, 2018, in Chinese Patent Application No. 201610552144.7 parallel to U.S. Appl. No. 15/364,680.
International Preliminary Report on Patentability and Written Opinion dated Feb. 22, 2018 in PCT/EP2016/069049).
Office Action dated Mar. 5, 2018, in corresponding Chinese Patent Application No. 201480056299.0.
R. M. Schaffert, "A New High-Sensitivity Organic Photoconductor for Electrophotography", *IBM J. Res. Develop.*, 1971, p. 75-89.
P. Gregory, Ed., *Chemistry and Technology of printing and imaging systems*, Chapman & Hall, 1996, Chap. 4, R.S. Gairns, *Electrophotography*, p. 76-112.
International Search Report and Written Opinion dated Nov. 17, 2016, in PCT/EP2016/071628, filed Sep. 14, 2016.
"Telezentrisches Objektiv" Retrieved from the Internet: https://de.wikipedia.org/wiki/Telezentrisches_Objektiv. Date of retrieval: Sep. 11, 2015, 3 Pages. (Cited on p. 53, line No. 40 in the Specification of related case U.S. Appl. No. 15/758,135).
Benjamin F. Grewe, et al., "Fast Two-Layer Two-Photon Imaging of Neuronal Cell Populations Using an Electrically Tunable Lens," *Biomedical Optics Express*, vol. 2, No. 7, Jul. 1, 2011 (pp. 2035-2046).
Petr Bartu et al, "Conformable Large-AreaPposition-Sensitive Photodetectors Based on Luminescence-Collecting Silicone Waveguides," *Journal of Applied Physics*, 107, 123101 (2010).
Roland Stolarski, "Fluorescent Naphthalimide Dyes for Polyester Fibres," *Fibres & Textiles* in Eastern Europe, vol. 17, No. 2(73) pp. 91-95 (2009).
Ayse Aktas et al., "Synthesis, Characterization, Electrochemical and Spectroelectrochemical Properties of Peripherally Tetra-Substituted Metal-Free and Metallophthalocyanines," *Dyes and Pigments*, 99, (2013) 613-619.
Hairong Li, et al., "Syntheses and Properties of Octa-, Tetra-, and Di-Hydroxy-Substituted Phthalocyanines," *Tetrahedron*, 65 (2009) 3357-3363.
"Methine Dyes and Pigments," *Ullmann's Encyclopedia of Industrial Chemistry*, vol. 23 (2012).
Jing Liu, et al., "Sulfone-Rhodamines: A New Class of Near-Infrared Fluorescent Dyes for Bioimagin," *ACS Applied Materials & Interfaces*, 8, 22953-22962 (2016).
E. Noelting et al., "Berichte der deutschen chemischen Gesellschaft", *Band*, 38, S. 3516-3527 (1905).
T. Nedelcev et al., "Preparation and Characterization of a New Derivative of Rhodamine B with an Alkoxysilane Moiety," *Dyes and Pigments*, 76 (2008), 550-556.

(56) References Cited

OTHER PUBLICATIONS

Aurore Loudet et al., "BODIPY Dyes and Their Derivatives: Syntheses and Spectroscopic Properties," Chem.Rev., 107 (2007) 4981-4932.
Weili Zhao, et al., "Conformationally Restricted Aza-Bodipy: A Highly fluorescent, Stable, Near-Infrared-Absorbing Dye", Angew. Chem. Int. Ed., 44 (2005) 1677-1679.
Georg M. Fischer, et al., "Near-Infrared Dyes and Fluorophores Based on Diketopyrrolopyrroles," Angew. Chem. Int. Ed. 46 (2007) 3750-3753.
Amaresh Mishra et al., "Small Molecule Organic Semiconductors on the Move: Promises for Future Solar Energy Technology," Angew. Chem. Int. Ed., 51, (2012), 2020-2067.
G. Seybold et al., "New Perylene and Violanthrone Dyestuffs for Fluorescent Collectors," Dyes and Pigments, 11 (1989) 303-317.
Nam-Trung Nguyen, "Micro-Optofluidic Lenses: A Review", Biomicrofluidics, 4, (2010) 031501.
Uriel Levy et al., "Tunable Optofluidic Devices," Microfluid Nanofluid (2008) 4: 97-105.
Robert Koeppe et al., "Video-Speed Detection of the Absolute Position of a Light Point on a Large-Area Photodetector Based on Luminescent Waveguides," Optics Express, vol. 18, No. 3, (Feb. 1, 2010), 2209.
Office Action dated Jul. 9, 2018, in Japanese Patent Application No. 2017-007544.
Xing Lin, et al., "Coded focal stack photography", Computational Photography (ICCP), 2013 IEEE International Conference On, Apr. 19, 2013, XP032424246, pp. 1-9.
Nabeel A. Riza, et al., "Noncontact distance sensor using spatial signal processing", Optics Letters, Optical Society of America, vol. 34, No. 4, Feb. 15, 2009, XP001522006, pp. 434-436.
Nabeel A. Riza, et al., "Smart agile lens remote optical sensor for three-dimensional object shape measurements", Applied Optics, Optical Society of America, vol. 49, No. 7, Mar. 1, 2010, XP001552714, pp. 1139-1150.
International Search Report dated Nov. 7, 2017, in corresponding PCT/EP2017/057867.
International Search Report dated Jul. 7, 2017, in corresponding PCT/EP2017/057825.
Street (Ed.): Technology and Applications of Amorphous Silicon, Springer-Verlag Heidelberg, 2010, pp. 346-349.
International Search Report dated Aug. 17, 2017, in corresponding PCT/EP2017/060057.
International Search Report dated Aug. 1, 2017, in corresponding PCT/EP2017/060058.
Walter Fuhs, "Hydrogenated Amorphous Silicon—Material Properties and Device Applications", In S. Baranovski, Charge Transport in Disordered Solids, Wiley, p. 97-147, 2006.
Office Action dated Dec. 18, 2018, in Japanese Patent Application No. 2016-518930.
A.G. Pattantyus-Abraham, I.J. Kramer, A.R. Barkhouse, X. Wang, G. Konstantatos, R. Debnath, L. Levina, I. Raabe, M.K. Nazeeruddin, M. Grätzel, and E.H. Sargent, Depleted-Heterojunction Colloidal Quantum Dot Solar Cells, ACS NANO 4 (6), May 24, 2010.
R. Martins and E. Fortunato, Thin Film Position Sensitive Detectors: from 1D to 3D Applications, Chap. 8 in R. A. Street (Ed.), Technology and Applications of Amorphous Silicon, Springer, 2010.
International Search Report dated Oct. 20, 2017 In PCT/EP2017/068956 filed on Jul. 27, 2017.
Leskela, M. et al., "Preparation of lead sulfide thin films by the atomic layer epitaxy process," Pergamon Press plc, Vacuum/vol. 41/Nos. 4-6, pp. 1457-1459 (1990).
Dasgupta, N. et al., "Fabrication and Characterization of Lead Sulfide Thin Films by Atomic Layer Deposition," The Electrochemical Society, ECS Transactions, 16 (4) 29-36 (2008), Total 8 pages.
Dasgupta, N. et al., "Design of an atomic layer deposition reactor for hydrogen sulfide compatibility," Review of Scientific Instruments 81, 044102 (2010), Total 6 pages.
Xu, J. et al., "Atomic layer deposition of absorbing thin films on nanostructured electrodes for short-wavelength infrared photosensing," AIP Publishing, Applied Physics Letters 107, 153105 (2015), Total 5 pages.
Blount, G., et al., "Photoconductive properties of chemically deposited PbS with dielectric overcoatings," AIP Publishing, Journal of Applied Physics 46, 3489 (1975), Total 12 pages.
Groner, M. et al., "Low-Temperature Al2O3 Atomic Layer Deposition," American Chemical Society, Chem. Mater., vol. 16, No. 4, 2004, pp. 639-645.
Yoon, W. et al., "Electrical Measurement Under Atmospheric Conditions of PbSe Nanocrystal Thin Films Passivated by Remote Plasma Atomic Layer Deposition of Al2O3," IEEE Transactions on Nanotechnology, vol. 12, No. 2, Mar. 2013, pp. 146-151.
Hu, C., et al., "Air-stable short-wave infrared PbS colloidal quantum dot photoconductors passivated with Al2O3 atomic layer deposition," AIP Publishing, Applied Physics Letters 105, 171110 (2014), Total 5 pages.
Liu, Y., et al., "Robust, Functional Nanocrystal Solids by Infilling with Atomic Layer Deposition," ACS Publications, American Chemical Society, Nano Letters 2011, 11, pp. 5349-5355.
Liu, Y., et al., "PbSe Quantum Dot Field-Effect Transistors with Air-Stable Electron Mobilities above 7 $cm^2$ $V^{-1}$ $S^{-1}$," ACS Publications, American Chemical Society, Nano Letters 2013, 13, pp. 1578-1587.
George, S., "Atomic Layer Deposition: An Overview," American Chemical Society, Chem. Rev. 2010, 110, pp. 111-131.
Konstantatos, G., et al., "Engineering the Temporal Response of Photoconductive Photodetectors via Selective Introduction of Surface Trap States," American Chemical Society, Nano Letters 2008, vol. 8, No. 5, pp. 1446-1450.
Soci, C., et al., "ZnO Nanowire UV Photodetectors with High Internal Gain," American Chemical Society, Nano Letters 2007, vol. 7, No. 4, pp. 1003-1009.
List of integrated circuit packaging types (Wikipedia article, downloaded Jan. 15, 2019 from https://en.wikipedia.org/wiki/List_of_integrated_circuit_packaging_types).
List of integrated circuit packaging types, Dimension Reference (Wikipedia article, downloaded Jan. 15, 2019 from https://en.wikipedia.org/wiki/List_of_integrated_circuit_packaging_types#PIN-PITCH).
J. Robertson, "High Dielectric Constant Oxides", European Physical Journal Applied Physics, vol. 28, No. 3, pp. 265-291, 2004.
J.A. Kittl et al., "High-k Dielectrics for Future Generation Memory Devices", Microelectronic Engineering, Vo. 86 (2009) 1789-1795.
Serap Günes, et al., "Hybrid Solar Cells", Inorganica Chimica Acta 361, (2008), p. 581-588.
John E. Anthony, et al., "n-Type Organic Semiconductors in Organic Electronics", Adv. Mater. 2010, 22, pp. 3876-3892.
Tian-yi Li, et al., "Small Molecule Near-Infrared Boron Dipyrromethene Donors for Organic Tandem Solar Cells", J. Am. Chem. Soc. 2017, 139, 13636-13639.
Christian Ulrich et al., "Organic Thin-Film Photovoltaic Cells Based on Oligothiophenes with Reduced Bandgap", Adv. Funct. Mater. 2007, 17, pp. 2991-2999.
Ronald Gresser, et al., "Synthesis and Characterization of Near-Infrared Absorbing Benzannulated Aza-BODIPY Dyes", Chem. Eur. J. 2011, 17, pp. 2939-2947.
Amaresh Mishra, et al., "Small Molecule Organic Semiconductors on the Move: Promises for Future Solar Energy Technology", Angew. Chem. Int. Ed. 2012, 51, 2020-2067.
Huifeng Yao, et al., "Molecular Desion of Benzodithiophene-Based Organic Photovoltaic Materials", Chem. Rev. 2016, 116, 7397-7457.
Moritz Riede, et al., "Efficient Organic Tandem Solar Cells based on Small Molecules", Adv. Funct. Mater. 2011, 21, pp. 3019-3028.
Rico Schueppei, et al., "Controlled Current Matching in Small Molecule Organic Tandem Solar Cells Using Doped Spacer Layers", J. Appl. Phys. 107, 044503, 2010.
Jan Meiss et al., "Fluorinated Zinc Phthalocyanine as Donor for Efficient Vacuum-Deposited Organic Solar Cells," Adv. Funct. Mater. 2012, 22, pp. 405-414.

(56) References Cited

OTHER PUBLICATIONS

Kurt Konolige et al., "A Low-Cost Laser Distance Sensor", *2008 IEEE International Conference on Robotics and Automation*, Pasadena, CA, May 19-23, 2008.

X. Jiang et al., Dreidimensionales Computersehen, Chapter 2, Springer, Berlin Heidelberg (1997).

International Preliminary Report on Patentability and Written Opinion dated Aug. 22, 2019 in PCT/EP2018/053057.

Ikeoka, et al., "Real-Time Depth Estimation with Wide Detectable Range Using Horizontal Planes of Sharp Focus Proceedings", ACIVS 2011: Advanced Concepts for Intelligent Vision Systems, pp. 669-680 (with English Abstract) (https://link.springer.com/chapter/10.1007/978-3-642-23687-7_60).

Suh et al., "Surface PAssivation by Atomic-layer-deposited Al2O3/TiO2 Stacks", 2013, 3 pages.

Japanese Office Action dated Nov. 5, 2019, in corresponding Japanese Patent Application No. 2017-558775 w/Engiish translation.

Wikipedia—Printed Circuit Board: https://en.wikipedia.org/wiki/Printed_circuit_board ( 25 pages).

ISO 21348 Definitions of Solar Irradiance Spectral Categories, http://SpaceWx.com.

\* cited by examiner

OPTICAL SENSOR AND DETECTOR FOR AN OPTICAL DETECTION

FIELD OF THE INVENTION

The invention relates to an optical sensor and to a detector comprising such an optical sensor for an optical detection, in particular, of optical radiation, especially within the infrared spectral range, specifically with regard to sensing at least one of transmissivity, absorption, emission and reflectance, or of at least one object, especially, for determining a position of at least one object, specifically with regard to a depth or both to the depth and a width of the at least one object. Furthermore, the invention relates to a human-machine interface, an entertainment device, a scanning system, a tracking system, a stereoscopic system, and a camera. Further, the invention relates to a method for manufacturing the optical sensor and to various uses of the optical sensor and the detector. Such devices, methods and uses can be employed for example in various areas of daily life, gaming, traffic technology, mapping of spaces, production technology, security technology, medical technology or in the sciences. However, further applications are possible.

PRIOR ART

Various detectors for optically detecting at least one object are known on the basis of optical sensors. WO 2012/110924 A1 discloses a detector comprising at least one optical sensor, wherein the optical sensor exhibits at least one sensor region. Herein, the optical sensor is designed to generate at least one sensor signal in a manner dependent on an illumination of the sensor region. According to the so-called "FiP effect", the sensor signal, given the same total power of the illumination, is hereby dependent on a geometry of the illumination, in particular on a beam cross-section of the illumination on the sensor region. The detector furthermore has at least one evaluation device designated to generate at least one item of geometrical information from the sensor signal, in particular at least one item of geometrical information about the illumination and/or the object.

WO 2014/097181 A1 discloses a method and a detector for determining a position of at least one object, by using at least one transversal optical sensor and at least one longitudinal optical sensor. Preferably, a stack of longitudinal optical sensors is employed, in particular to determine a longitudinal position of the object with a high degree of accuracy and without ambiguity. Further, WO 2014/097181 A1 discloses a human-machine interface, an entertainment device, a tracking system, and a camera, each comprising at least one such detector for determining a position of at least one object.

PCT patent application No. PCT/EP2016/051817, filed Jan. 28, 2016, the full content of which is herewith included by reference, discloses further kinds of materials which are suitable as longitudinal optical sensor. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

M Leskelä, L Niinistö, P Niemela, E Nykänen, P Soininen, M Tiitta and J Vähäkangas, *Preparation of lead sulfide thin films by the atomic layer epitaxy process*, studied a preparation of lead sulfide thin films on different substrates by atomic layer deposition (ALD). Sulfur source was in all experiments H2S, but as lead source the following compounds were tested: bromide, iodide and acetate as well as thd (2,2,6,6-tetramethyl-3,5-heptanedione) and diethyldithiocarbamate chelates. The last complex gave the highest growth rate. The growth experiments were carried out at 300-350° C. and the film thicknesses varied between 0.1 and 1 µm. The results showed that the films were polycrystalline and randomly oriented. The conductivity was p-type and the carrier concentration and mobility were comparable with those found in films deposited by traditional chemical methods.

N. P. Dasgupta, S. P. Walch and F. B. Prinz, *Fabrication and characterization of lead sulfide thin films by atomic layer deposition*, ECS Transactions 16 (4), p. 29-36, 2008, present a study of the deposition of lead sulfide (PbS) thin films by ALD. PbS films were deposited from Pb(tmhd)$_2$ and H$_2$S precursors at precursor sublimation temperatures of 165-175° C. The film growth rate was 0.13-0.18 nm/cycle, which is higher than previously published values. A linear growth rate characteristic of ALD was observed, with no chemical contamination. AFM images show that the films are polycrystalline with grain size increasing with film thickness.

N. P. Dasgupta, J. F. Mack, M. C. Langston, Al Bousetta, and F. B. Prinz, *Design of an atomic layer deposition reactor for hydrogen sulfide compatibility*, Rev. Sc. Instr. 81, 044102, 2010, describe a customized ALD reactor being designed with components compatible with hydrogen sulfide (H$_2$S) chemistry. H$_2$S is used as a reactant for the ALD of metal sulfides. The use of H$_2$S in an ALD reactor requires special attention to safety issues due to its highly toxic, flammable, and corrosive nature. The reactor was designed with respect to materials compatibility of all wetted components with H$_2$S. A customized safety interlock system was developed to shut down the system in the event of toxic gas leakage, power outage, loss of building ventilation or compressed air pressure. ALD of lead sulfide (PbS) and zinc sulfide (ZnS) were demonstrated with no chemical contamination or detectable release of H$_2$S.

J. Xu, B. R. Sutherland, S. Hoogland, F. Fan, S. Kinge, and E. H. Sargent, *Atomic layer deposition of absorbing thin films on nanostructured electrodes for short-wavelength infrared photo-sensing*, Appl. Phys. Lett. 107, 153105, 2015, report that ALD, prized for its high-quality thin-film formation in the absence of high temperature or high vacuum, has become an industry standard for the large-area deposition of a wide array of oxide materials. Recently, it has shown promise in the formation of nanocrystalline sulfide films. Here, they demonstrate the viability of ALD lead sulfide for photodetection. Leveraging the conformal capabilities of ALD, they enhance the absorption without compromising the extraction efficiency in the absorbing layer by utilizing a ZnO nanowire electrode. The nanowires are first coated with a thin shunt-preventing $TiO_2$ layer, followed by an infrared-active ALD PbS layer for photo-sensing.

In particular in order to avoid degradation of the photoconductive material by external influence, such as by humidity and/or oxygen, the optical sensor comprising the photoconductive material may at least partially be covered with an encapsulation layer. For this purpose, the encapsulation layer is, typically, provided by using an encapsulation glue, usually an epoxy-based glue, and/or an encapsulation glass. In addition or alternatively, the optical sensor may be encapsulated in hermetically sealed packages. However, encapsulation glass and encapsulation glue are, preferably, selected with respect to their absorption characteristic over the wavelength range which may be relevant for sensing by the photoconductive material. Herein, borosilicate glass and quartz glass are known to absorb at wavelengths above ca. 2500 nm, which may considerably limit a spectral response of the photoconductive material, in particular, of PbS and PbSe. Other encapsulation glasses, such as sapphire, may provide a more suitable absorption characteristic, but usually tend to be quite expensive. In addition, hermetic packages generally turn out to be rather bulky, difficult to integrate on printed circuit boards, and expensive.

G. H. Blount, K. Preis, R. T. Yamada, and R. H. Bube, *Photoconductive properties of chemically deposited PbS with dielectric overcoatings*, J. Appl. Phys. 46, p. 3489, 1975, describe overcoatings of $Al_2O_3$, $As_2S_3$, CdTe, $MgF_2$, SiO, and $SiO_2$ which were vacuum deposited on thin-film PbS photodetectors. Overcoating thicknesses were approximately those required to optimize antireflection properties. None of the overcoatings seriously degraded detector properties, although production yields were low with $Al_2O_3$, $MgF_2$, and CdTe. The low yields are apparently due to physical incompatibilities of the overcoating and the PbS film. Improved detector properties were obtained with $As_2S_3$ through a reduction of 1/f noise and passivation to hostile environments.

M. D. Groner, F. H. Fabreguette, J. W. Elam, and S. M. George, *Low-Temperature $Al_2O_3$ Atomic Layer Deposition*, Chem. Mater. 16, pp. 639-645, 2004, report about $Al_2O_3$ films deposited by ALD at temperatures as low as 33° C. in a viscous-flow reactor using alternating exposures of $Al(CH_3)_3$ (trimethylaluminum, TMA) and $H_2O$. Low-temperature $Al_2O_3$ ALD films have the potential to coat thermally fragile substrates such as organic, polymeric, or biological materials. $Al_2O_3$ film densities were lower at lower deposition temperatures. $Al_2O_3$ ALD film densities were 3.0 g/cm3 at 177° C. and 2.5 g/cm3 at 33° C. AFM images showed that $Al_2O_3$ ALD films grown at low temperatures were very smooth with a root-mean-squared (RMS) roughness of only 0.4±0.1 nm. Elemental analysis of the films using forward recoil spectrometry revealed hydrogen concentrations that increased with decreasing growth temperature. No other elements were observed by Rutherford backscattering spectrometry except the parent aluminum and oxygen concentrations. Low-temperature $Al_2O_3$ ALD at 58° C. was demonstrated for the first time on a poly(ethylene terephthalate) (PET) polymeric substrate.

U.S. Pat. No. 5,291,066 A discloses a moisture-proof integrated circuit module including at least one integrated circuit component in a high density interconnect (HDI) structure fabricated by applying to a substrate successive multiple ply sequences having a plurality of via holes therein. The sequences overlie the component(s) and the module substrate, and each sequence includes a dielectric film and a plurality of lands comprised of metal that extends into the vias of the sequence to provide electrical interconnections. The module includes at least one moisture barrier film to prevent penetration of moisture through the module to the circuit component(s).

U.S. Pat. No. 7,939,932 B2 discloses a low-temperature inorganic dielectric ALD film (e.g., $Al_2O_3$ and $TiO_2$) deposited on a packaged or unpackaged chip device so as to coat the device including any exposed electrical contacts. Such a low-temperature ALD film generally can be deposited without damaging the packaged chip device. The ALD film is typically deposited at a sufficient thickness to provide desired qualities (e.g., hermeticity for the entire packaged chip device, passivation for the electrical contacts, biocompatibility, etc.) but still allows for electrical connections to be made to the electrical contacts (e.g., by soldering or otherwise) directly through the ALD film without having to expose the electrical contacts.

W. Yoon, A. R. Smith, E. E. Foos, J. E. Boercker, W. B. Heuer, and J. G. Tischler, *Electrical Measurement Under Atmospheric Conditions of PbSe Nanocrystal Thin Films Passivated by Remote Plasma Atomic Layer Deposition of $Al_2O_3$*, IEEE Transaction Nanotech. 12 (2), pp. 146-151, 2013, report that PbSe nanocrystal thin-film transistors (TFTs) were passivated using remote plasma ALD of a ~10 nm thick $Al_2O_3$ film at 150° C. By using a highly reactive remote oxygen plasma source, the time for one complete ALD cycle was about 15 s with growth rates of ~0.11 nm/cycle. The effective mobilities measured under atmospheric condition from $Al_2O_3$-passivated PbSe nanocrystal TFTs were comparable to the values reported previously for air-free PbSe nanocrystal TFTs, demonstrating that ALD $Al_2O_3$ layers prevent oxidation and degradation of nanocrystal films from air exposure. The variation in the effective mobility of passivated devices was also found to be negligible under ambient conditions over a period of 30 days. The results show that remote plasma ALD processing of $Al_2O_3$ is capable of producing an effective passivation layer on air-sensitive nanocrystals with high deposition rates at reduced temperature. C. Hu, A. Gassenq, Y. Justo, K. Devloo-Casier, H. Chen, C. Detavernier, Z. Hens, and G. Roelkens, *Air-stable short-wave infrared PbS colloidal quantum dot photoconductors passivated with $Al_2O_3$ atomic layer deposition*, Appl. Phys. Lett. 105, 171110, 2014, present a PbS colloidal quantum dot photoconductor with $Al_2O_3$ ALD passivation for air-stable operation. Two different types of inorganic ligands for the quantum dots, $S^{2-}$ and $OH^-$, are investigated. PbS/$S^{2-}$ photoconductors with a cut-off wavelength up to 2.4 lm are obtained, and a responsivity up to 50 A/W at 1550 nm is reported.

Y. Liu, M. Gibbs, C. L. Perkins, J. Tolentino, M. H. Zarghami, J. Bustamante Jr., and M. Law, *Robust, Functional Nanocrystal Solids by Infilling with Atomic Layer Deposition*, Nano Letters, Vol. 11, No. 12, 24 Oct. 2011, pp. 5349-55, describe optoelectronic devices which are based on films of lead chalcogenide, in particular PbSe, nanocrystals, wherein low-temperature ALD is used to fill in the PbSe nanocrystals with metal oxides, in particular amorphous alumina, in order to generate inorganic nanocomposites in which the nanocrystals are locked in place and protected against oxidative and photothermal damage.

Y. Liu, J. Tolentino, M. Gibbs, R. Ihly, C. L. Perkins, Y. Liu, N. Crawford, J. C. Hemminger, and M. Law, *PbSe Quantum Dot Field-Effect Transistors with Air Stable Electron Mobilities above* 7 $cm^2$ $V^{-1}$ $s^{-1}$, Nano Letters, Vol. 13, No. 4, 1 Mar. 2013, pp. 1578-87, describe films of lead chalcogenide, in particular PbSe, colloidal quantum dots, which are filled with metal oxides, in particular amorphous alumina, by low-temperature ALD in order to achieve high charge carrier mobility in FETs with simultaneous passivation of surface states by the ALD coating.

Despite the advantages implied by the above-mentioned devices and detectors, there still is a need for improvements with respect to a simple, cost-efficient and, still, reliable optical sensor and spatial detector.

Problem Addressed by the Invention

Therefore, a problem addressed by the present invention is that of specifying a device and a method for an optical detection which at least substantially avoids the disadvantages of known devices and methods of this type.

In particular, providing an improved simple, cost-efficient and, still, reliable optical sensor and detector for detecting optical radiation, especially within the infrared spectral range, would be desirable, specifically with regard to sensing at least one of transmissivity, absorption, emission and reflectance.

Further, it would particularly be desirable to provide an improved simple, cost-efficient and, still, reliable optical sensor and detector for determining the position of an object in space, specifically with regard to a depth or both to the depth and a width of the at least one object, which, more specifically, may cover at least a partition of the infrared spectral range.

More particular, it would be desirable to be capable of furnishing the optical sensor with an encapsulation layer that may especially be adapted to avoid degradation by external influence, such as by humidity and/or oxygen. Herein, it may be advantageous to use an encapsulation material which exhibits a suitable absorption characteristic and is, concurrently, easy to manufacture and easy to integrate on a circuit carrier device.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical sensor is disclosed. Herein, the optical sensor according to the present invention comprises
  a layer of at least one photoconductive material,
  at least two individual electrical contacts contacting the layer of the photoconductive material, and
  a cover layer deposited on the layer of the photoconductive material, wherein the cover layer is an amorphous layer comprising at least one metal-containing compound.

As used herein, the "optical sensor" is generally a device which is designed to generate at least one sensor signal in a manner dependent on an illumination of a sensor region by a light beam. The sensor signal may generally be an arbitrary signal indicative of a position of an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation.

According to the present invention, the optical sensor comprises a layer of at least one photoconductive material, wherein the layer of the photoconductive material may function as a sensor region. As used herein, the "sensor region" is considered as a partition of the optical sensor being designed to receive the illumination of the optical sensor by the light beam, wherein the illumination in a manner as received by the sensor region may trigger the generation of the at least one sensor signal, wherein the generation of the sensor signal may be governed by a defined relationship between the sensor signal and the manner of the illumination of the sensor region.

As used herein, the term "photoconductive material" refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. In this kind of material, the electrical current may be guided via at least one first electrical contact through the material to at least one second electrical contact, wherein the first electrical contact is isolated from the second electrical contact while both the first electrical contact and the second electrical contact are in direct connection with the material. For this purpose, the direct connection may be provided by any known measure known from the state of the art, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

For the purposes of the present invention, the photoconductive material as used in the sensor region of the optical sensor may, preferably, comprise an inorganic photoconductive material, and/or a solid solution thereof and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary CdTe may be solved in ZnTe leading to $Cd_{1-x}Zn_xTe$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state. By way of example, a pure silicon crystal may be doped with one or more of boron, aluminum, gallium, indium, phosphorous, arsenic, antimony, germanium, or other atoms, particularly, in order to modify the chemical and/or physical properties of the silicon crystal.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide, which might, preferably, be selected from a group comprising sulfide chalcogenides, selenide chalcogenides, ternary chalcogenides, quaternary and higher chalcogenides. However, other inorganic photoconductive materials may equally be appropriate.

As mentioned above, the chalcogenide, preferably selected from a group comprising sulfide chalcogenides, selenide chalcogenides, telluride chalcogenides, ternary chalcogenides, quaternary and higher chalcogenides, may preferably be appropriate to be used as the photoconductive material in the sensor region of the optical sensor. This preference may particularly be based on a reason that this kind of material has already known to be both cost-efficient and reliable in many different areas of application, including optical detectors for the infrared spectral range.

In particular, the sulfide chalcogenide may be selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS or $Cu_2S$), cobalt sulfide (CoS), nickel sulfide (NiS), molybdenum disulfide ($MoS_2$), iron disulfide ($FeS_2$), and chromium trisulfide ($CrS_3$).

In particular, the selenide chalcogenide may be selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe or $Cu_2Se$), molybdenum diselenide ($MoSe_2$), tin selenide (SnSe), and cobalt selenide (CoSe), and indium selenide ($In_2Se_3$). Further, solid solutions and/or doped variants of the mentioned compounds or of other compounds of this kind may also be feasible.

In particular, the telluride chalcogenide may be selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), and indium telluride ($In_2Te_3$). Further, solid solutions and/or doped variants of the mentioned compounds or of other compounds of this kind may also be feasible.

In particular, the ternary chalcogenide may be selected from a group comprising mercury cadmium telluride (HgCdTe; MCT), mercury zinc telluride (HgZnTe), mercury cadmium sulfide (HgCdS), lead cadmium sulfide (PbCdS), lead mercury sulfide (PbHgS), copper indium disulfide ($CuInS_2$; CIS), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), and cadmium zinc selenide (CdZnSe), further combinations by applying compounds from the above listed binary chalcogenides and/or binary III-V-compounds. Further, solid solutions and/or doped variants of the mentioned compounds or of other compounds of this kind may also be feasible.

With regard to quaternary and higher chalcogenides, this kind of material may be selected from a quaternary and higher chalcogenide which may be known to exhibit suitable photoconductive properties. In particular, a compound having a composition of $Cu(In, Ga)S/Se_2$ or of $Cu_2ZnSn(S/Se)_4$ may be feasible for this purpose.

With regard to the III-V compound, this kind of semiconducting material may be selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb). Further, solid solutions and/or doped variants of the mentioned compounds or of other compounds of this kind may also be feasible.

With regard to the II-VI compound, this kind of semiconducting material may be selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe). However, other II-VI compounds may be feasible. Further, solid solutions of the mentioned compounds or of other compounds of this kind may also be applicable.

With regard to the metal oxides, this kind of semiconducting material may be selected from a known metal oxide which may exhibit photoconductive properties, particularly from the group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), ferrite ($Fe_3O_4$), and perovskite oxides ($ABC_3$, wherein A is a divalent cation, B a tetravalent cation, and C=O). Further ternary, quaternary or higher metal oxides may also be applicable. Furthermore, solid solutions and/or doped variants of the mentioned compounds or of other compounds of this kind, which could be stoichiometric compounds or off-stoichiometric compounds, may also be feasible. As explained later in more detail, it may be preferable to select a metal oxide which might, simultaneously, also exhibit transparent or translucent properties.

With regard to a group IV element or compound, this kind of semiconducting material may be selected from a group comprising doped diamond (C), doped silicon (Si), silicon carbide (SiC), and silicon germanium (SiGe), wherein the semiconducting material may be selected from a crystalline, or, preferably, from a microcrystalline or an amorphous semiconducting material. For providing a silicon-based photoconductor which may, especially simultaneously, exhibit a high resistivity, a high charge-carrier lifetime, and a low surface recombination rate, doped silicon comprising a low dopant concentration and a low defect density, such as existing in silicon float zone wafers, may preferably be selected.

In a preferred embodiment, the photoconductive material may be or comprise at least one chalcogenide which can, preferably, be selected from a group comprising sulfide chalcogenides, selenide chalcogenides, telluride chalcogenides, and ternary chalcogenides. As generally used, the term "chalcogenide" refers to a compound which may comprise a group 16 element of the periodic table apart from an oxide, i.e. a sulfide, a selenide, and a telluride. In particular, the photoconductive material may be or comprise a sulfide chalcogenide, preferably lead sulfide (PbS), a selenide chalcogenide, preferably lead selenide (PbSe), a telluride chalcogenide, preferably, cadmium telluride (CdTe), or a ternary chalcogenide is, preferably mercury zinc telluride (HgZnTe; MZT). Since at least the mentioned preferred photoconductive materials are, generally, known to exhibit a distinctive absorption characteristic within the infrared spectral range, the optical sensor having the layer which comprises the mentioned preferred photoconductive material may, preferably, be used as an infrared sensor. However, other embodiments and/or other photoconductive materials, in particular, the photoconductive materials as described above, may also be feasible.

In a particularly preferred embodiment of the present invention, the optical sensor may be provided in a form of a layer of the at least one photoconductive material, which may comprise a chalcogenide, preferably lead sulfide (PbS), lead selenide (PbSe) or another appropriate material. With regard to the above mentioned materials, layers of those materials which may comprise at least a few crystals exhibiting a size above 15 nm are included. Herein, the layer of the photoconductive material may be fabricated by applying at least one deposition method which may be selected from the group consisting of: vacuum evaporation, sputtering, atomic layer deposition, chemical vapor deposition, spray pyrolysis, electrodeposition, anodization, electro-conversion, electro-less dip growth, successive ionic adsorption and reaction, chemical bath deposition, and solution-gas interface techniques. As a result, the layer of the photoconductive material may exhibit a thickness in the range 10 nm to 100 µm, preferably from 100 nm to 10 µm, in particular from 300 nm to 5 µm. However other photoconductive materials as mentioned above and/or below may also be feasible for this purpose and may also be treated in the same or in a similar fashion.

Preferably, the photoconductive material may be fabricated by depositing the respective material on an insulating substrate, preferably on a ceramic substrate or a glass substrate, in particular for providing mechanical stability to the layer of the photoconductive material. In this manner, by depositing the selected layer on the appropriate substrate and providing at least two individual electrical contacts, the optical sensor according to the present invention may, thus, be obtained. Herein, an illumination of the photoconductive material in the sensor region by an incident light beam results in a variation of the electrical conductivity in the illuminated layer of the photoconductive material. In a particular embodiment, the substrate may be or comprise an electrically conducting substrate, wherein an additional insulating interlayer may be present between the electrically conducting substrate and the at least one layer of the photoconductive material.

Consequently, upon impingement of the sensor region by the light beam the at least two electrical contacts may provide the sensor signal which depends on the electrical conductivity of the photoconductive material. For this purpose, the at least individual two electrical contacts may be applied at different locations of the layer of the photoconductive material, especially, in a manner that at least two of the individual electrical contacts are electrically isolated with respect to each other. Herein, the electrical contacts may comprise an evaporated metal layer which may easily be provided by known evaporation techniques. In particular, the evaporated metal layer may comprise one or more of silver, aluminum, platinum, magnesium, chromium, titanium, or gold. Alternatively, the electrical contacts may comprise a layer of graphene.

In this regard, it may be emphasized that the ALD encapsulation and/or passivation of quantum dots and/or nanocrystals comprising lead sulfide (PbS) or lead selenide (PbSe) is already known. Herein, the quantum dots are usually capped with one or more organic ligands, such as oleic acid, butylamine, or ethanethiol, which lead to sizes of the quantum dots up to 15 nm. However, synthesis and film formation of the quantum dots and/or the nanocrystals completely differs from the production of the layers of the photoconductive material, in particular, PbS or PbSe, according to the present invention. Herein, the quantum dots and/or the nanocrystals have to be synthesized first and require an inert handling. Thereafter, washing steps and formulation in an organic solvent is following. Only then, the formulation comprising the quantum dots and/or the nanocrystals can be applied to a substrate, where they have to be treated with heat and/or other organic ligands, such as by applying a ligand exchange.

In contrast hereto, crystals comprising the photoconductive material, in particular, PbS or PbSe, can be produced with sizes above 15 nm up to 300 nm. This kind of crystals may deposit directly from a precursor which may decompose during deposition. No capping of an organic ligand may occur but rather a surface oxidation may be present. Thus, from a material chemistry point of view, the quantum dot and/or the nanocrystal photoconductors exhibit a completely different nature with regard to the crystalline photoconductors according to the present invention, even if they may be based on the same material, such as PbS or PbSe. This finding is supported by C. Hu et al., so., who present a PbS colloidal quantum dot photoconductor with $Al_2O_3$ ALD passivation. Compared to the photoconductive layer according to the present invention, absorption maxima are shifted to smaller wavelengths and the photoconductor of C. Hu et al. show a comparatively slow response.

According to the present invention, the optical sensor further comprises a cover layer which is deposited on the photoconductive material. Herein, the cover layer may, preferably, be deposited in a manner that it may directly contact a layer of the photoconductive material. In a preferred embodiment, the cover layer may be deposited on the layer in a fashion that it may fully cover an accessible surface of the photoconductive material. Preferably, at least one deposition method may be used for depositing the metal-containing compound on the photoconductive material. For this purpose, the at least one deposition method may, in particular, be selected from an atomic layer deposition, a chemical vapor deposition, a sputtering process, or a combination thereof. Consequently, the cover layer may, in a particularly preferred embodiment, be or comprise an atomic deposition layer, a chemical vapor deposition layer, a sputtered layer, or a layer generated by using at least two of the mentioned deposition methods, wherein the atomic deposition layer or a layer generated by using a combination of atomic deposition and sputtering may especially by preferred. In other words, the cover layer may, in this particularly preferred embodiment, be obtainable by an ALD process, a CVD process, a sputtering process, or a combination thereof, the ALD process or the combination of ALD and sputtering being especially preferred. Herein, the term "atomic layer deposition", the equivalent terms "atomic layer epitaxy" or "molecular layer deposition" as well as their respective abbreviations "ALD, "ALE" or "MLD" are, generally, used for referring to a deposition process which may comprise a self-limiting process step and a subsequent self-limiting reaction step. Hence, the process which is applied in accordance with the present invention may also be referred to as an "ALD process". For further details referring to the ALD process, reference may be made to by George, Chem. Rev., 110, p. 111-131, 2010. Further, the term "chemical vapor deposition", usually abbreviated to "CVD" refers to a method in which a surface of a substrate or a layer located on a substrate may be exposed to at least one volatile precursor, wherein the precursor may react and/or decompose on the surface in order to generate a desired deposit. In a frequent case, possible by-products may be removed by applying a gas flow above the surface. Further, the term "sputtering" refers to a process in which a solid target material is used for ejecting particles in consequence of an impact of the target by high energetic particles. Further, the combination of the ALD process and the sputtering process, may allow, firstly, sputtering a coarse phase comprising coarse particles on the surface of the photoconductive material and, subsequently, generating a fine phase by using ALD which may, especially, be adapted for filling spaces, gaps and/or pores between the coarse particles, whereby a thicker cover layer may, eventually, be provided within a shorter period of time. On the other hand, firstly performing the ALD process and, subsequently, performing the sputtering process would, firstly, allow a conformal coating, in particular a filling of the porous photoconductive layer, with the slow ALD process, especially, in order to protect the photoconductive layer from the subsequent sputter process which might be more damaging to the material surface and, subsequently, providing thick layers within a short period of process time. For further details concerning a preferred manufacturing process for providing the cover layer, reference may be made to the description of the method elsewhere in this document.

In further accordance with the present invention, the cover layer comprises at least one metal-containing compound. Herein, the metal-containing compound may, preferably, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, and Bi. In a specific embodiment, the metal-containing compound may, alternatively, comprise a semimetal, which may also be denominated as a "metalloid", wherein the semimetal may be selected from the group consisting of B, Si, Ge, As, Sb, and Te. Preferably, the at least one metal-containing compound may be selected from the group consisting of Al, Ti, Ta, Mn, Mo, Zr, Hf, and W.

Herein, the at least one metal-containing compound may, preferably, be selected from the group comprising an oxide, a hydroxide, a chalcogenide, a pnictide, a carbide, or a combination thereof. As already defined above, the term "chalcogenide" refers to a compound which may comprise a group 16 element of the periodic table apart from an oxide, i.e. a sulfide, a selenide, and a telluride. In a similar fashion, the term "pnictide" refers to a, preferably binary, compound which may comprise a group 15 element of the periodic table, i.e. a nitride, a phosphide, arsenide and an antimonide. As described below in more detail, the metal-containing compound may, preferably, comprise at least one oxide, at least one hydroxide, or a combination thereof, preferably of Al, Ti, Zr or Hf; or, also preferred, a nitride of Si. In a particularly preferred embodiment of the present invention, the metal-containing compound as comprised by the cover layer may be a composition comprising aluminum oxide and/or aluminum hydroxide, which is, as generally used, for sake of simplicity also referred to as $Al_2O_3$.

As already mentioned above, the optical sensor comprises a cover layer which is deposited on the layer of the photoconductive material, preferably, in a fashion that it may fully cover the accessible surface of the photoconductive material. Thus, the cover layer may, in a first regard, be adapted for providing an encapsulation for the photoconductive material. As used herein the term "encapsulation" may refer to a package, preferably, an hermetic package, especially, in order to avoid as far as possible a partial or full degradation of the optical sensor or a partition thereof, in particular of the photoconductive material comprised within the sensor region of the optical sensor, by external influence, such as by humidity and/or by oxygen comprised in a surrounding atmosphere. Herein, the package may, preferably, be adapted to cover all accessible surfaces of the photoconductive material, wherein it may be taken into account that the layer of the photoconductive material may be deposited on a substrate which may already be adapted to protect a partition of the surfaces of the photoconductive material. In other words, the substrate and the cover layer may be adapted in a fashion that they can cooperate in order to accomplish a packaging, preferably a hermetic packaging, of the photoconductive material.

Surprisingly, it has been found that, the cover layer may, in a second regard, exhibit an additional function as a result of its deposition on the cover layer of the photoconductive material. As will be described below in more detail, the cover layer may be adapted to activate the photoconductive material in a sense that the photoconductive properties of the photoconductive material may considerably be improved after the deposition of the cover layer on the layer of the photoconductive material and a subsequent thermally treating the compound structure comprising the cover layer directly deposited on the photoconductive material. Not being bound by theory, the deposition of the cover layer on the photoconductive material may not only result in a direct contact between the respective surfaces of the cover layer and the photoconductive material. In addition, the thermal treatment of the compound structure may prompt the material comprised in the cover layer or at least a partition thereof in order to partially penetrate into the photoconductive material, thus, resulting in a physical and/or chemical effect, in particular with respect to the detailed structure and/or composition of the photoconductive material. It seems that this effect may allow a small partition of the material comprised in the cover layer to penetrate into receptive portions of the photoconductive material, such as phase boundaries, vacancies, or pores. This effect appears to be, particularly, related to the amorphous structure of the cover layer which can be revealed by applying an appropriate measuring procedure, such as energy dispersive X-ray spectroscopy (EDX), scanning electron microscopy (SEM), or as illustrated below in FIG. 2, x-ray diffraction (XRD). Thus, the amorphous nature of the cover layer may, especially, be determined by measuring it together with an internal standard, such as crystalline aluminum oxide or quartz, or the crystalline PbS itself, thus, wherein the amorphous nature may be considered as being achieved when less than 20% crystallinity based on this measuring method may be obtained. Furthermore, this effect is in contrast to the properties as ascribed to the $Al_2O_3$ layer of G. H. Blount et al., see above, wherein electron beam deposition is used, which provides a crystalline $Al_2O_3$ layer which is revealed by observing crystallites on examining fractures edges.

Moreover, the photoconductive properties of the photoconductive material PbS as used by G. H. Blount et al. appear to be marginally influenced by providing an encapsulation layer on the PbS layer. As described by G. H. Blount et al., a specific responsivity $S_1$ of the optical detector comprising the PbS layer changes from $1.4 \cdot 10^2$ $cm^2/W$ without an encapsulation layer to a value of $2.3 \cdot 10^2$ $cm^2/W$ after applying the crystalline $Al_2O_3$ layer, thus, resulting only in a slight improvement of the specific responsivity $S_1$ of the PbS by less than a factor of 2. As demonstrated below in more detail, the improvements of the optical detector according to the present invention after application of the $Al_2O_3$ cover layer exceeds a factor of 50, preferably of 100. Consequently, the amorphous nature of the cover layer according to the present invention may, thus, not only improve the protective encapsulation for the photoconductive material, especially, for avoiding the degradation of the photoconductive material, by external influence, such as humidity and/or oxygen, but may inherently contribute to the activation of the photoconductive properties of the photoconductive material that may be, preferentially, in direct contact with the cover layer.

In an alternative embodiment, the cover layer may be or comprise a laminate which may have at least two adjacent layers, wherein the adjacent layers may, in particular, differ by their respective composition in a manner that one, both, some, or all of the adjacent layers may comprise one of the metal-containing compounds. Herein, the adjacent layers may comprise two different metal-containing compounds, such as described above, providing an amorphous structure. By way of example, the cover layer may comprise alternating adjacent layers of an Al-containing compound and of a Zr- or Hf-containing compound. However, other combinations of metal-containing compounds may also be possible. In addition, the laminate may further comprise additional adjacent layers which may not have any one of the metal-containing compounds as described elsewhere in this application but may rather be or comprise at least one of a metallic compound, a polymeric compound, a silicone compound, or a glass compound. Herein, other kinds of materials may also be feasible. As a result, the laminate may comprise additional adjacent layers that may be amorphous but which may, alternatively, also be or comprise crystalline or nanocrystalline layers.

In a particularly preferred embodiment of the present invention, the cover layer may exhibit a thickness of 10 nm to 600 nm, preferably of 20 nm to 200 nm, more preferred of 40 nm to 100 nm, most preferred of 50 to 75 nm. This thickness may, particularly, reflect the amount of metal-containing compounds within the cover layer that may be advantageous to achieve the above-mentioned functions of providing encapsulation for the photoconductive material and, concurrently, of activating the photoconductive properties of the photoconductive material. This feature is, again, in clear contrast to the thickness of the encapsulation layer as illustrated in FIG. 2 of G. H. Blount, see above, which is indicated there as 780 nm. In this regard, it may be emphasize that the preferred values for the thickness for the cover layer may be advantageous with respect to an increased transparency of the cover layer as well as regarding a non-bulky implementation of the optical sensor.

In a further particularly preferred embodiment of the present invention, the cover layer may be a conformal layer with respect to the adjacent surface of the photoconductive material. As defined above, the thickness of the conformal layer may, thus, follow the corresponding surface of the photoconductive material within a deviation of ±50 nm, preferably of ±20 nm, mostly preferred of ±10 nm, wherein the deviation may occur over at least for at least 90%, preferably for at least 95%, mostly preferred for at least 99%, of a surface of the cover layer, hereby leaving aside any contamination or imperfection that may be present on the surface of the cover layer. Again, this feature is in particular contrast to the surface of the encapsulation layer as illustrated in FIG. 2 of G. H. Blount, see above, which appears to exhibit considerably larger deviations over the surface of the cover layer.

As mentioned above, the layer of the photoconductive material may be directly or indirectly applied to at least one substrate, wherein at least one of the substrate and the cover layer may, preferably, be optically transparent within a selected wavelength range. Consequently, it may, particularly, be advantageous to select the metal-containing compound as used for the cover layer to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency. For this purpose, the substrate may, in particular, comprise an at least one at least partially transparent insulating material, wherein the insulating material may, preferably, be selected from the group comprising an at least partially glass, metal oxide, a ceramic material, or a doped variant thereof. Herein, the insulating material may, especially, be selected from known at least one transparent glass, weakly doped semiconductor, metal oxide or ceramic material, in particular from sapphire ($Al_2O_3$), glass, quartz, fused silica, silicon, germanium, ZnS, or ZnSe. Alternatively the substrates may comprise of materials with at least partially optically transparent properties. The insulator material may, especially, be selected from or in addition, the cover layer may, thus, also be selected to exhibit at least partially optically transparent properties. On the other hand, in case the substrate may already be at least partially transparent, a larger variety of different materials, including optically intransparent materials, may be employed for the cover layer.

As mentioned above, the layer of the photoconductive material may be directly or indirectly applied to at least one substrate, wherein at least one of the substrate and the cover layer may, preferably, be optically transparent within a selected wavelength range. Consequently, it may, particularly, be advantageous to select the metal-containing compound as used for the cover layer to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency. Herein, the substrate material may, especially, be selected from at least one of a transparent glass, silicon, germanium, a metal oxide, a metal or a semiconducting material, in particular from aluminum doped tin oxide (AZO), indium doped tin oxide (ITO), ZnS, or ZnSe, wherein glass or silicon are particularly preferred. For semiconducting or conductive layers, that may exhibit too high conductivity to serve as a good insulating substrate, an insulating interlayer optically transparent within the desired wavelength range may be employed.

Further, the cover layer may, concurrently, be a functional layer which may be adapted to exhibit at least one further function in addition to the above-mentioned functions of providing encapsulation for the photoconductive material and, concurrently, of activating the photoconductive properties of the photoconductive material. In this regard, the metal-containing compound may, especially, be selected to be able to, concurrently, exert the desired further function. In particular, the metal-containing compound used for the cover layer may exhibit a high refractive index, preferably at least 1.2, more preferred at least 1.5, in order to qualify as a suitable anti-reflective layer. As mentioned above, the cover layer may be deposited on the layer of the photoconductive material according to the present invention, particularly by using ALD or a combination of ALD and sputtering, in a conformal manner, such that the cover layer may tightly follow the surface of the photoconductive material. In particular, a PbS layer or a PbSe layer, usually, exhibits not a smooth surface but a rather rough surface having protrusions and depressions, while $Al_2O_3$ was found as capable of being deposited as a cover layer which may tightly follow the surface of the PbS layer or the PbSe layer. As a result, reflections due to incoming light may, thus, be minimized. This observation appears to be in contrast to known deposition methods in which the deposited material is, usually, grown via coalescence which only allows minimizing the protrusions and depressions which may be present at the surface of the layer of the photoconductive material. Further, the cover layer may be a functional layer, in particular, be selected from a scratch-resistant layer, a hydrophilic layer, a hydrophobic layer, a self-cleaning layer, an anti-fog layer, and a conductive layer. Other types of functions may also be possible, in particular, a high-permittivity layer, i.e. a cover material which may exhibit a high permittivity, preferably $Al_2O_3$ or $ZrO_2$, and which may be employed for generating a high dielectric strength, especially, by using a high electric field, such as by applying a high electric voltage, across the optical sensor. Especially for the purpose of the selected functional layer, the cover layer may, in addition, comprise one or more additives, such as one or more stabilizing agents, which may be added in order to accomplish the desired further function of the cover layer. In particular, the cover layer may comprise glass or glass particles as stabilizing agent. However, other kinds of additives may also be feasible.

In a particular embodiment, particularly in a case in which it might not be appropriate to provide the cover layer with the desired further function or in which an extent of the further function as provided by the selected cover layer may not be sufficient, the cover layer may, additionally, at least partially be covered by at least one additional layer at least partially deposited on the cover layer. As an alternative or in addition, the at least one additional layer may at least partially be deposited between the layer of the photoconductive material and the cover layer. Preferably, the additional layer may be or exhibit the further function and may, thus, comprise at least one of an anti-reflective layer, an optical filter layer, a scratch-resistant layer, a hydrophilic layer, a hydrophobic layer, a self-cleaning layer, an anti-fog layer, a high-permittivity layer, or a conductive layer. Herein, the person skilled in the art may be easily capable of selecting and providing the at least one additional layer. However, other embodiments may also be possible.

In a preferred embodiment, the cover layer may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover layer. In a particular embodiment, an adhesive layer may be provided at the electrical contacts, wherein the adhesive layer may, especially, be adapted for bonding. For this purpose, the adhesive layer may comprise at least one of Ni, Cr, Ti or Pd.

Not wishing to be bound by theory, an increase in mobility is usually considered as favorable for the performance of a photoconductive material. However, this assumption may only be appropriate if other parameters, in particular a lifetime of the charge carriers, may not be affected hereby. As indicated by G. Konstantatos, L. Levina, A. Fischer, and E. H. Sargent, *Engineering the Temporal Response of Photoconductive Photodetectors via Selective Introduction of Surface Trap States*, Nanoletters 2008, Vol. 8, No. 5, pp. 1446-50, and by Rinku Saran and Richard J. Curry, *Lead sulfide nano-crystal photodetector technologies*, Nature Photonics 10, 2016, pp. 81-92, non-recombining trap states appear to be favorable for increasing the performance of a photoconductive device, even if the trap states may be able to reduce the carrier mobility. As shown by C. Soci, A. Zhang, B. Xiang, S. A. Dayeh, D. P. R. Aplin, J. Park, X. Y. Bao, Y. H. Lo, and D. Wang, *ZnO Nanowire UV Photodetectors with High Internal Gain*, Nanoletters 2007, Vol. 7, No. 4, pp. 1003-09, the trap states are considered to extend the lifetime of the charge carriers which results in an increase of photoconductive gain.

On the other hand, with respect to field-effect transistors (FETs), a reduction in charge carrier mobility and a presence of trap states are, generally, considered as completely detrimental to the performance of the FET, in particular, since, as, e.g., demonstrated by S. Kar, High Permittivity Gate Dielectric Materials, Springer, Berlin, Heidelberg, page 66, or by P. Stallinga and H. L. Gomes, Organic Electronics 7 (2006) 592-599, they may be capable of causing disadvantageous off-currents, a non-linear transfer curve and/or non-linear contact effects.

Comparing FETs to quantum-dot solar cells as described by Y. Liu et al., see above, it may be noted that the optical sensor according to the present invention does not comprise charge-carrier selective layers and can, therefore, not be considered as a photovoltaic device. Since due to a blocking nature of traps in the charge-selective layers, the photoconductive gain as described above cannot be found in photovoltaic devices, a direct comparison cannot be drawn. For photovoltaic devices, the presence of trap states does, in general, not result in a higher performance of the solar cell. In this regard, it may be noted that dissimilar dimensions of planar photovoltaic devices compared to lateral photoconductor devices result in different distances for charge carriers to travel and in different charge-carrier lifetimes provided for reaching the corresponding electrodes. Taking into account comparable electric fields that can be obtained by assuming 1V for the photovoltaic device and 100 V for the photoconductive device, the travel distances differ by orders of magnitude, i.e. approx. only 100 nm for the photovoltaic devices but more than 10 µm for the photoconductive devices according to the present invention.

A further differing feature of FETs and photoconductive devices may be related to a location of the charge-carrier flow. While, the charge-carrier flow may, essentially, be restricted to a thickness of a few nm from the dielectric in the FET, the whole thickness of the layer may be used in the photoconductive device for this purpose. This observation results in strong implications which regard to a filling of the trap states and an influence of the trap state density on the performance of the respective device. In the FET, the trap states which are located a few nm from the dielectric can only be filled with comparatively few charge carriers while the bulk layer device can, still, remain unsaturated. In contrast hereto, a uniform filling of trap states is expected for the photoconductive device. Consequently, the physics triggering the high performance of the photoconductive device appears to be fundamentally different from the phenomena as observed in the FET devices.

In a further aspect of the present invention, a detector for optical detection, in particular, for determining a position of at least one object, specifically with regard to a depth or to both the depth and a width of the at least one object is disclosed. According to the present invention, the detector for an optical detection of at least one object comprises:
- at least one optical sensor as described elsewhere herein, the optical sensor comprising at least one sensor region, wherein the optical sensor is designed to generate at least one sensor signal in a manner dependent on an illumination of the sensor region by a light beam; and
- at least one evaluation device, wherein the evaluation device is designed to generate at least one coordinate of the object by evaluating the sensor signal of the optical sensor.

Herein, the listed components may be separate components. Alternatively, two or more of the components may be integrated into one component. Further, the at least one evaluation device may be formed as a separate evaluation device independent from the transfer device and the optical sensors, but may preferably be connected to the optical sensors in order to receive the sensor signal. Alternatively, the at least one evaluation device may fully or partially be integrated into the optical sensors.

According to the present invention, the detector comprises at least one of the optical sensors as described elsewhere in this document. Thus, the detector may, preferably, be designed for detecting electromagnetic radiation over a considerably wide spectral range, wherein the ultraviolet (UV), visible, near infrared (NIR), and the infrared (IR) spectral ranges are particularly preferred. Herein, the following photoconductive materials may, especially, be selected for the photoconductive layer within the sensor region of the optical sensor:

- for the UV spectral range: doped diamond (C), zinc oxide (ZnO), titanium oxide ($TiO_2$), gallium nitride (GaN), gallium phosphide (GaP) or silicon carbide (SiC);
- for the visible spectral range: silicon (Si), gallium arsenide (GaAs), cadmium sulfide (CdS), cadmium telluride (CdTe), copper indium sulfide ($CuInS_2$; CIS), copper indium gallium selenide (CIGS), copper zinc tin sulfide (CZTS);
- for the NIR spectral range: indium gallium arsenide (InGaAs), silicon (Si), germanium (Ge), cadmium telluride (CdTe), copper indium sulfide ($CuInS_2$; CIS), copper indium gallium selenide (CIGS), copper zinc tin sulfide (CZTS), wherein CdTe, CIS, CIGS, and CZTS are particularly preferred for wavelengths above 850 nm;
- for IR spectral range: indium gallium arsenide (InGaAs) for wavelengths up to 2.6 µm; indium arsenide (InAs) for wavelengths up to 3.1 µm; lead sulfide (PbS) for wavelengths up to 3.5 µm; lead selenide (PbSe) for wavelengths up to 5 µm; indium antimonide (InSb) for wavelengths up to 5.5 µm; and mercury cadmium telluride (MCT, HgCdTe) for wavelengths up 16 µm.

As already mentioned above, the position generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. As will be outlined in further detail below, the detector may have an optical axis, which may constitute a main direction of view of the detector. The optical axis may form an axis of the coordinate system, such as a z-axis. Further, one or more additional axes may be provided, preferably perpendicular to the z-axis.

Thus, as an example, the detector may constitute a coordinate system in which the optical axis forms the z-axis and in which, additionally, an x-axis and a y-axis may be provided which are perpendicular to the z-axis and which are perpendicular to each other. As an example, the detector and/or a part of the detector may rest at a specific point in this coordinate system, such as at the origin of this coordinate system. In this coordinate system, a direction parallel or antiparallel to the z-axis may be regarded as a longitudinal direction, and a coordinate along the z-axis may be considered a longitudinal coordinate. An arbitrary direction perpendicular to the longitudinal direction may be considered a transversal direction, and an x- and/or y-coordinate may be considered a transversal coordinate.

Alternatively, other types of coordinate systems may be used. Thus, as an example, a polar coordinate system may be used in which the optical axis forms a z-axis and in which a distance from the z-axis and a polar angle may be used as additional coordinates. Again, a direction parallel or anti-parallel to the z-axis may be considered a longitudinal direction, and a coordinate along the z-axis may be considered a longitudinal coordinate. Any direction perpendicular to the z-axis may be considered a transversal direction, and the polar coordinate and/or the polar angle may be considered a transversal coordinate.

As used herein, the detector for optical detection generally is a device which is adapted for providing at least one item of information on the position of the at least one object. The detector may be a stationary device or a mobile device. Further, the detector may be a stand-alone device or may form part of another device, such as a computer, a vehicle or any other device. Further, the detector may be a hand-held device. Other embodiments of the detector are feasible.

The detector may be adapted to provide the at least one item of information on the position of the at least one object in any feasible way. Thus, the information may e.g. be provided electronically, visually, acoustically or in any arbitrary combination thereof. The information may further be stored in a data storage of the detector or a separate device and/or may be provided via at least one interface, such as a wireless interface and/or a wire-bound interface.

In a particularly preferred embodiment, the optical sensor may be or comprise a longitudinal optical sensor. As used herein, the "longitudinal optical sensor" is generally a device which is designed to generate at least one longitudinal sensor signal in a manner dependent on an illumination of the sensor region by the light beam, wherein the longitudinal sensor signal, given the same total power of the illumination, is dependent, according to the so-called "FiP effect" on a beam cross-section of the light beam in the sensor region. The longitudinal sensor signal may generally be an arbitrary signal indicative of the longitudinal position, which may also be denoted as a depth. As an example, the longitudinal sensor signal may be or may comprise a digital and/or an analog signal. As an example, the longitudinal sensor signal may be or may comprise a voltage signal and/or a current signal. Additionally or alternatively, the longitudinal sensor signal may be or may comprise digital data. The longitudinal sensor signal may comprise a single signal value and/or a series of signal values. The longitudinal sensor signal may further comprise an arbitrary signal which is derived by combining two or more individual signals, such as by averaging two or more signals and/or by forming a quotient of two or more signals. For potential embodiments of the longitudinal optical sensor and the longitudinal sensor signal, reference may be made to WO 2012/110924 A1.

Further, the sensor region of the longitudinal optical sensor is illuminated by at the least one light beam. Given the same total power of the illumination, the electrical conductivity of the sensor region, therefore, depends on the beam cross-section of the light beam in the sensor region, be denominated as a "spot size" generated by the incident beam within the sensor region. Thus, the observable property that the electrical conductivity of the photoconductive material depends on an extent of the illumination of the sensor region comprising the photoconductive material by an incident light beam particularly accomplishes that two light beams comprising the same total power but generating different spot sizes on the sensor region provide different values for the electrical conductivity of the photoconductive material in the sensor region and are, consequently, distinguishable with respect to each other.

Further, since the longitudinal sensor signal is determined by applying an electrical signal, such as a voltage signal and/or a current signal, the electrical conductivity of the material which is traversed by the electrical signal is, therefore, taken into account when determining the longitudinal sensor signal. As will be explained below in more detail, an application of a bias voltage source and of a load resistor employed in series with the longitudinal optical sensor may preferably be used here. As a result, the longitudinal optical sensor which comprises a photoconductive material within the sensor region, thus, principally allows determining the beam cross-section of the light beam in the sensor region from a recording of the longitudinal sensor signal, such as by comparing at least two longitudinal sensor signals, at least one item of information on the beam cross-section, specifically on the beam diameter.

Further, since the beam cross-section of the light beam in the sensor region, according to the above-mentioned FiP effect, given the same total power of the illumination, depends on the longitudinal position or depth of an object which emits or reflects the light beam which impinges on the sensor region, the longitudinal optical sensor may, therefore, be applied to determining a longitudinal position of the respective object.

As already known from WO 2012/110924 A1, the longitudinal optical sensor is designed to generate at least one longitudinal sensor signal in a manner dependent on an illumination of the sensor region, wherein the sensor signal, given the same total power of the illumination depends on a beam cross-section of the illumination on the sensor region. As an example, a measurement of a photocurrent I as a function of a position of a lens is provided there, wherein the lens is configured for focusing electromagnetic radiation onto the sensor region of the longitudinal optical sensor. During the measurement, the lens is displaced relative to the longitudinal optical sensor in a direction perpendicular to the sensor region in a manner that, as a result, the diameter of the light spot on the sensor region changes. In this particular example in which a photovoltaic device, in particular, a dye solar cell, is employed as the material in the sensor region, the signal of the longitudinal optical sensor, in this case a photocurrent, clearly depends on the geometry of the illumination such that, outside a maximum at the focus of the lens, the photocurrent falls to less than 10% of its maximum value.

As used herein, the term "evaluation device" generally refers to an arbitrary device designed to generate the items of information, i.e. the at least one item of information on the position of the object. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. As used herein, the sensor signal may generally refer to one of the longitudinal sensor signal and, if applicable, to the transversal sensor signal. Further, the evaluation device may comprise one or more data storage devices.

Further, as outlined above, the evaluation device may comprise one or more interfaces, such as one or more wireless interfaces and/or one or more wire-bound interfaces.

The at least one evaluation device may be adapted to perform at least one computer program, such as at least one computer program performing or supporting the step of generating the items of information. As an example, one or more algorithms may be implemented which, by using the sensor signals as input variables, may perform a predetermined transformation into the position of the object.

The evaluation device may particularly comprise at least one data processing device, in particular an electronic data processing device, which can be designed to generate the items of information by evaluating the sensor signals. Thus, the evaluation device is designed to use the sensor signals as input variables and to generate the items of information on the transversal position and the longitudinal position of the object by processing these input variables. The processing can be done in parallel, subsequently or even in a combined manner. The evaluation device may use an arbitrary process for generating these items of information, such as by calculation and/or using at least one stored and/or known relationship. Besides the sensor signals, one or a plurality of further parameters and/or items of information can influence said relationship, for example at least one item of information about a modulation frequency. The relationship can be determined or determinable empirically, analytically or else semi-empirically. Particularly preferably, the relationship comprises at least one calibration curve, at least one set of calibration curves, at least one function or a combination of the possibilities mentioned. One or a plurality of calibration curves can be stored for example in the form of a set of values and the associated function values thereof, for example in a data storage device and/or a table. Alternatively or additionally, however, the at least one calibration curve can also be stored for example in parameterized form and/or as a functional equation. Separate relationships for processing the sensor signals into the items of information may be used. Alternatively, at least one combined relationship for processing the sensor signals is feasible. Various possibilities are conceivable and can also be combined.

By way of example, the evaluation device can be designed in terms of programming for the purpose of determining the items of information. The evaluation device can comprise in particular at least one computer, for example at least one microcomputer. Furthermore, the evaluation device can comprise one or a plurality of volatile or nonvolatile data memories. As an alternative or in addition to a data processing device, in particular at least one computer, the evaluation device can comprise one or a plurality of further electronic components which are designed for determining the items of information, for example an electronic table and in particular at least one look-up table and/or at least one application-specific integrated circuit (ASIC), and/or at least one digital signal processor (DSP), and/or at least one field programmable gate array (FPGA).

The detector has, as described above, at least one evaluation device. In particular, the at least one evaluation device can also be designed to completely or partly control or drive the detector, for example by the evaluation device being designed to control at least one illumination source and/or to control at least one modulation device of the detector. The evaluation device can be designed, in particular, to carry out at least one measurement cycle in which one or a plurality of sensor signals, such as a plurality of sensor signals, are picked up, for example a plurality of sensor signals of successively at different modulation frequencies of the illumination.

The evaluation device is designed, as described above, to generate at least one item of information on the position of the object by evaluating the at least one sensor signal. Said position of the object can be static or may even comprise at least one movement of the object, for example a relative movement between the detector or parts thereof and the object or parts thereof. In this case, a relative movement can generally comprise at least one linear movement and/or at least one rotational movement. Items of movement information can for example also be obtained by comparison of at least two items of information picked up at different times, such that for example at least one item of location information can also comprise at least one item of velocity information and/or at least one item of acceleration information, for example at least one item of information about at least one relative velocity between the object or parts thereof and the detector or parts thereof. In particular, the at least one item of location information can generally be selected from: an item of information about a distance between the object or parts thereof and the detector or parts thereof, in particular an optical path length; an item of information about a distance or an optical distance between the object or parts thereof and the optional transfer device or parts thereof; an item of information about a positioning of the object or parts thereof relative to the detector or parts thereof; an item of information about an orientation of the object and/or parts thereof relative to the detector or parts thereof; an item of information about a relative movement between the object or parts thereof and the detector or parts thereof; an item of information about a two-dimensional or three-dimensional spatial configuration of the object or of parts thereof, in particular a geometry or form of the object. Generally, the at least one item of location information can therefore be selected for example from the group consisting of: an item of information about at least one location of the object or at least one part thereof; information about at least one orientation of the object or a part thereof; an item of information about a geometry or form of the object or of a part thereof, an item of information about a velocity of the object or of a part thereof, an item of information about an acceleration of the object or of a part thereof, an item of information about a presence or absence of the object or of a part thereof in a visual range of the detector.

The at least one item of location information can be specified for example in at least one coordinate system, for example a coordinate system in which the detector or parts thereof rest. Alternatively or additionally, the location information can also simply comprise for example a distance between the detector or parts thereof and the object or parts thereof. Combinations of the possibilities mentioned are also conceivable.

As outlined above, the at least one longitudinal sensor signal, given the same total power of the illumination by the light beam, is, according to the FiP effect, dependent on a beam cross-section of the light beam in the sensor region of the at least one longitudinal optical sensor. As used herein, the term beam cross-section generally refers to a lateral extension of the light beam or a light spot generated by the light beam at a specific location. In case a circular light spot is generated, a radius, a diameter or a Gaussian beam waist or twice the Gaussian beam waist may function as a measure of the beam cross-section. In case non-circular light-spots are generated, the cross-section may be determined in any other feasible way, such as by determining the cross-section of a circle having the same area as the non-circular light spot, which is also referred to as the equivalent beam cross-section. In this regard, it may be possible to employ the observation of an extremum, i.e. a maximum or a minimum, of the longitudinal sensor signal, in particular a global extremum, under a condition in which the corresponding material, such as a photovoltaic material, may be impinged by a light beam with the smallest possible cross-section, such as when the material may be located at or near a focal point as affected by an optical lens. In case the extremum is a maximum, this observation may be denominated as the positive FiP-effect, while in case the extremum is a minimum, this observation may be denominated as the negative FiP-effect.

Thus, irrespective of the material actually comprised in the sensor region but given the same total power of the illumination of the sensor region by the light beam, a light beam having a first beam diameter or beam cross-section may generate a first longitudinal sensor signal, whereas a light beam having a second beam diameter or beam-cross section being different from the first beam diameter or beam cross-section generates a second longitudinal sensor signal being different from the first longitudinal sensor signal. Thus, by comparing the longitudinal sensor signals, at least one item of information on the beam cross-section, specifically on the beam diameter, may be generated. For details of this effect, reference may be made to WO 2012/110924 A1. Accordingly, the longitudinal sensor signals generated by the longitudinal optical sensors may be compared, in order to gain information on the total power and/or intensity of the light beam and/or in order to normalize the longitudinal sensor signals and/or the at least one item of information on the longitudinal position of the object for the total power and/or total intensity of the light beam. Thus, as an example, a maximum value of the longitudinal optical sensor signals may be detected, and all longitudinal sensor signals may be divided by this maximum value, thereby generating normalized longitudinal optical sensor signals, which, then, may be transformed by using the above-mentioned known relationship, into the at least one item of longitudinal information on the object. Other ways of normalization are feasible, such as a normalization using a mean value of the longitudinal sensor signals and dividing all longitudinal sensor signals by the mean value. Other options are possible. Each of these options may be appropriate to render the transformation independent from the total power and/or intensity of the light beam. In addition, information on the total power and/or intensity of the light beam might, thus, be generated.

Specifically in case one or more beam properties of the light beam propagating from the object to the detector are known, the at least one item of information on the longitudinal position of the object may thus be derived from a known relationship between the at least one longitudinal sensor signal and a longitudinal position of the object. The known relationship may be stored in the evaluation device as an algorithm and/or as one or more calibration curves. As an example, specifically for Gaussian beams, a relationship between a beam diameter or beam waist and a position of the object may easily be derived by using the Gaussian relationship between the beam waist and a longitudinal coordinate.

This embodiment may, particularly, be used by the evaluation device in order to resolve an ambiguity in the known relationship between a beam cross-section of the light beam and the longitudinal position of the object. Thus, even if the beam properties of the light beam propagating from the object to the detector are known fully or partially, it is known that, in many beams, the beam cross-section narrows before reaching a focal point and, afterwards, widens again. Thus, before and after the focal point in which the light beam has the narrowest beam cross-section, positions along the axis of propagation of the light beam occur in which the light beam has the same cross-section. Thus, as an example, at a distance z0 before and after the focal point, the cross-section of the light beam is identical. Thus, in case only one longitudinal optical sensor with a specific spectral sensitivity is used, a specific cross-section of the light beam might be determined, in case the overall power or intensity of the light beam is known. By using this information, the distance z0 of the respective longitudinal optical sensor from the focal point might be determined. However, in order to determine whether the respective longitudinal optical sensor is located before or behind the focal point, additional information is required, such as a history of movement of the object and/or the detector and/or information on whether the detector is located before or behind the focal point. In typical situations, this additional information may not be provided. Therefore, additional information may be gained in order to resolve the above-mentioned ambiguity. Thus, in case the evaluation device, by evaluating the longitudinal sensor signals, recognizes that the beam cross-section of the light beam on a first longitudinal optical sensor is larger than the beam cross-section of the light beam on a second longitudinal optical sensor, wherein the second longitudinal optical sensor is located behind the first longitudinal optical sensor, the evaluation device may determine that the light beam is still narrowing and that the location of the first longitudinal optical sensor is situated before the focal point of the light beam. Contrarily, in case the beam cross-section of the light beam on the first longitudinal optical sensor is smaller than the beam cross-section of the light beam on the second longitudinal optical sensor, the evaluation device may determine that the light beam is widening and that the location of the second longitudinal optical sensor is situated behind the focal point. Thus, generally, the evaluation device may be adapted to recognize whether the light beam widens or narrows, by comparing the longitudinal sensor signals of different longitudinal sensors.

For further details with regard to determining the at least one item of information on the longitudinal position of the object by employing the evaluation device according to the present invention, reference may made to the description in WO 2014/097181 A1. Thus, generally, the evaluation device may be adapted to compare the beam cross-section and/or the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

In addition to the at least one longitudinal coordinate of the object, at least one transversal coordinate of the object may be determined. Thus, generally, the evaluation device may further be adapted to determine at least one transversal coordinate of the object by determining a position of the light beam on the at least one transversal optical sensor, which may be a pixelated, a segmented or a large-area transversal optical sensor, as further outlined also in WO 2014/097181 A1.

In a particular embodiment of the present invention, the detector may comprise at least two longitudinal optical sensors, wherein each longitudinal optical sensor may be adapted to generate at least one longitudinal sensor signal.

As an example, the sensor regions or the sensor surfaces of the longitudinal optical sensors may, thus, be oriented in parallel, wherein slight angular tolerances might be tolerable, such as angular tolerances of no more than 10°, preferably of no more than 5°. Herein, preferably all of the longitudinal optical sensors of the detector, which may, preferably, be arranged in form of a stack along the optical axis of the detector, may be transparent. Thus, the light beam may pass through a first transparent longitudinal optical sensor before impinging on the other longitudinal optical sensors, preferably subsequently. Thus, the light beam from the object may subsequently reach all longitudinal optical sensors present in the optical detector. Herein, the different longitudinal optical sensors may exhibit the same or different spectral sensitivities with respect to the incident light beam.

Preferably, the detector according to the present invention may comprise a stack of longitudinal optical sensors as disclosed in WO 2014/097181 A1, particularly in combination with one or more transversal optical sensors. As an example, one or more transversal optical sensors may be located on a side of the stack of longitudinal optical sensors facing towards the object. Alternatively or additionally, one or more transversal optical sensors may be located on a side of the stack of longitudinal optical sensors facing away from the object. Again, additionally or alternatively, one or more transversal optical sensors may be interposed in between the longitudinal optical sensors of the stack. However, embodiments which may only comprise a single longitudinal optical sensor but no transversal optical sensor may still be possible, such as in a case wherein only determining the depth of the object may be desired.

Alternatively or in addition, the optical sensor according to the present invention may, thus, be or comprise a transversal optical sensor. As used herein, the term "transversal optical sensor" generally refers to a device which is adapted to determine a transversal position of at least one light beam traveling from the object to the detector. With regard to the term position, reference may be made to the definition above. Thus, preferably, the transversal position may be or may comprise at least one coordinate in at least one dimension perpendicular to an optical axis of the detector. As an example, the transversal position may be a position of a light spot generated by the light beam in a plane perpendicular to the optical axis, such as on a light-sensitive sensor surface of the transversal optical sensor. As an example, the position in the plane may be given in Cartesian coordinates and/or polar coordinates. Other embodiments are feasible. For potential embodiments of the transversal optical sensor, reference may be made to WO 2014/097181 A1. However, other embodiments are feasible and will be outlined in further detail below.

The transversal optical sensor may provide at least one transversal sensor signal. Herein, the transversal sensor signal may generally be an arbitrary signal indicative of the transversal position. As an example, the transversal sensor signal may be or may comprise a digital and/or an analog signal. As an example, the transversal sensor signal may be or may comprise a voltage signal and/or a current signal. Additionally or alternatively, the transversal sensor signal may be or may comprise digital data. The transversal sensor signal may comprise a single signal value and/or a series of signal values. The transversal sensor signal may further comprise an arbitrary signal which may be derived by combining two or more individual signals, such as by averaging two or more signals and/or by forming a quotient of two or more signals.

In a first embodiment similar to the disclosure according to WO 2014/097181 A1, the transversal optical sensor may be a photo detector having at least one first electrode, at least one second electrode and at least one photovoltaic material, wherein the photovoltaic material may be embedded in between the first electrode and the second electrode. Thus, the transversal optical sensor may be or may comprise one or more photo detectors, such as one or more organic photodetectors and, most preferably, one or more dye-sensitized organic solar cells (DSCs, also referred to as dye solar cells), such as one or more solid dye-sensitized organic solar cells (s-DSCs). Thus, the detector may comprise one or more DSCs (such as one or more sDSCs) acting as the at least one transversal optical sensor and one or more DSCs (such as one or more sDSCs) acting as the at least one longitudinal optical sensor.

In contrast to this known embodiment, a particularly preferred embodiment of the transversal optical sensor according to the present invention may comprise a layer of the photoconductive material, preferably an inorganic photoconductive material, such as one of the photoconductive materials as mentioned above and/or below. Preferably, the layer of the photoconductive material may directly or indirectly be applied to at least one substrate which, in particular, comprises a transparent conducting oxide, preferably indium tin oxide (ITO), fluorine doped tin oxide (SnO2:F; FTO), or magnesium oxide (MgO), or a perovskite transparent conductive oxide, such as $SrVO_3$, or $CaVO_3$, or, alternatively, metal nanowires, in particular Ag nanowires. However, other materials may also be feasible, in particular according to the desired transparent spectral range. In a particular embodiment, an interlayer comprising an insulating, a semiconductive or an electrically conducting material may, additionally, been applied.

Further, at least two electrodes may be present for recording the transversal optical signal. In a preferred embodiment, the at least two electrodes may actually be arranged in the form of at least two physical electrodes, preferably, exhibiting a form of a T-shape, wherein each physical electrode may comprise an electrically conducting material, preferably a metallically conducting material, more preferred a highly metallically conducting material such as copper, silver, gold, an alloy or a composition which comprises these kinds of materials, or graphene. Herein, each of the at least two physical electrodes may, preferably, be arranged in a manner that a direct electrical contact between the respective electrode and the photoconductive layer in the optical sensor may be achieved, particularly in order to acquire the longitudinal sensor signal with as little loss as possible, such as due to additional resistances in a transport path between the optical sensor and the evaluation device.

Preferably, at least one of the electrodes of the transversal optical sensor may be a split electrode having at least two partial electrodes, wherein the transversal optical sensor may have a sensor area, wherein the at least one transversal sensor signal may indicate an x- and/or a y-position of the incident light beam within the sensor area. The sensor area may be a surface of the photo detector facing towards the object. The sensor area preferably may be oriented perpendicular to the optical axis. Thus, the transversal sensor signal may indicate a position of a light spot generated by the light beam in a plane of the sensor area of the transversal optical sensor. Generally, as used herein, the term "partial electrode" refers to an electrode out of a plurality of electrodes, adapted for measuring at least one current and/or voltage signal, preferably independent from other partial electrodes. Thus, in case a plurality of partial electrodes is provided, the respective electrode is adapted to provide a plurality of electric potentials and/or electric currents and/or voltages via the at least two partial electrodes, which may be measured and/or used independently.

The transversal optical sensor may further be adapted to generate the transversal sensor signal in accordance with the electrical currents through the partial electrodes. Thus, a ratio of electric currents through two horizontal partial electrodes may be formed, thereby generating an x-coordinate, and/or a ratio of electric currents through to vertical partial electrodes may be formed, thereby generating a y-coordinate. The detector, preferably the transversal optical sensor and/or the evaluation device, may be adapted to derive the information on the transversal position of the object from at least one ratio of the currents through the partial electrodes. Other ways of generating position coordinates by comparing currents through the partial electrodes are feasible.

The partial electrodes may generally be defined in various ways, in order to determine a position of the light beam in the sensor area. Thus, two or more horizontal partial electrodes may be provided in order to determine a horizontal coordinate or x-coordinate, and two or more vertical partial electrodes may be provided in order to determine a vertical coordinate or y-coordinate. Thus, the partial electrodes may be provided at a rim of the sensor area, wherein an interior space of the sensor area remains free and may be covered by one or more additional electrode materials. As will be outlined in further detail below, the additional electrode material preferably may be a transparent additional electrode material, such as a transparent metal and/or a transparent conductive oxide and/or, most preferably, a transparent conductive polymer.

By using the transversal optical sensor, wherein one of the electrodes is a split electrode with three or more partial electrodes, currents through the partial electrodes may be dependent on a position of the light beam in the sensor area. This may generally be due to the fact that Ohmic losses or resistive losses may occur on the way from a location of generation of electrical charges due to the impinging light onto the partial electrodes. Thus, besides the partial electrodes, the split electrode may comprise one or more additional electrode materials connected to the partial electrodes, wherein the one or more additional electrode materials provide an electrical resistance. Thus, due to the Ohmic losses on the way from the location of generation of the electric charges to the partial electrodes through with the one or more additional electrode materials, the currents through the partial electrodes depend on the location of the generation of the electric charges and, thus, to the position of the light beam in the sensor area. For details of this principle of determining the position of the light beam in the sensor area, reference may be made to the preferred embodiments below and/or to the physical principles and device options as disclosed in WO 2014/097181 A1 and the respective references therein.

Accordingly, the transversal optical sensor may comprise the sensor area, which, preferably, may be transparent to the light beam travelling from the object to the detector. The transversal optical sensor may, therefore, be adapted to determine a transversal position of the light beam in one or more transversal directions, such as in the x- and/or in the y-direction. For this purpose, the at least one transversal optical sensor may further be adapted to generate at least one transversal sensor signal. Thus, the evaluation device may be designed to generate at least one item of information on a transversal position of the object by evaluating the transversal sensor signal of the longitudinal optical sensor.

Further embodiments of the present invention referred to the nature of the light beam which propagates from the object to the detector. As used herein, the term "light" generally refers to electromagnetic radiation in one or more of the visible spectral range, the ultraviolet spectral range and the infrared spectral range. Therein, in partial accordance with standard ISO-21348 in a valid version at the date of this application, the term visible spectral range generally refers to a spectral range of 380 nm to 760 nm. The term infrared (IR) spectral range generally refers to electromagnetic radiation in the range of 760 nm to 1000 µm, wherein the range of 760 nm to 1.4 µm is usually denominated as the near infrared (NIR) spectral range, and the range from 15 µm to 1000 µm as the far infrared (FIR) spectral range. The term ultraviolet spectral range generally refers to electromagnetic radiation in the range of 1 nm to 380 nm, preferably in the range of 100 nm to 380 nm. Preferably, light as used within the present invention is visible light, i.e. light in the visible spectral range.

The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space.

The light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

In addition, the detector may comprise at least one transfer device, such as an optical lens, in particular one or more refractive lenses, particularly converging thin refractive lenses, such as convex or biconvex thin lenses, and/or one or more convex mirrors, which may further be arranged along the common optical axis. Most preferably, the light beam which emerges from the object may in this case travel first through the at least one transfer device and thereafter through the single transparent optical sensor or the stack of the transparent optical sensors until it may finally impinge on an imaging device. As used herein, the term "transfer device" refers to an optical element which may be configured to transfer the at least one light beam emerging from the object to optical sensors within the detector. Thus, the transfer device can be designed to feed light propagating from the object to the detector to the optical sensors, wherein this feeding can optionally be effected by means of imaging or else by means of non-imaging properties of the transfer device. In particular the transfer device can also be designed to collect the electromagnetic radiation before the latter is fed to the optical sensors.

In addition, the at least one transfer device may have imaging properties. Consequently, the transfer device comprises at least one imaging element, for example at least one lens and/or at least one curved mirror, since, in the case of such imaging elements, for example, a geometry of the illumination on the sensor region can be dependent on a relative positioning, for example a distance, between the transfer device and the object. As used herein, the transfer device may be designed in such a way that the electromagnetic radiation which emerges from the object is transferred completely to the sensor region, for example is focused completely onto the sensor region, in particular if the object is arranged in a visual range of the detector.

Generally, the detector may further comprise at least one imaging device, i.e. a device capable of acquiring at least one image. The imaging device can be embodied in various ways. Thus, the imaging device can be for example part of the detector in a detector housing. Alternatively or additionally, however, the imaging device can also be arranged outside the detector housing, for example as a separate imaging device. Alternatively or additionally, the imaging device can also be connected to the detector or even be part of the detector. In a preferred arrangement, the stack of the transparent optical sensors and the imaging device are aligned along a common optical axis along which the light beam travels. Thus, it may be possible to locate an imaging device in the optical path of the light beam in a manner that the light beam travels through the stack of the transparent optical sensors until it impinges on the imaging device. However, other arrangements are possible.

As used herein, an "imaging device" is generally understood as a device which can generate a one-dimensional, a two-dimensional, or a three-dimensional image of the object or of a part thereof. In particular, the detector, with or without the at least one optional imaging device, can be completely or partly used as a camera, such as an IR camera, or an RGB camera, i.e. a camera which is designed to deliver three basic colors which are designated as red, green, and blue, on three separate connections. Thus, as an example, the at least one imaging device may be or may comprise at least one imaging device selected from the group consisting of: a pixelated organic camera element, preferably a pixelated organic camera chip; a pixelated inorganic camera element, preferably a pixelated inorganic camera chip, more preferably a CCD- or CMOS-chip; a monochrome camera element, preferably a monochrome camera chip; a multicolor camera element, preferably a multicolor camera chip; a full-color camera element, preferably a full-color camera chip. The imaging device may be or may comprise at least one device selected from the group consisting of a monochrome imaging device, a multi-chrome imaging device and at least one full color imaging device. A multi-chrome imaging device and/or a full color imaging device may be generated by using filter techniques and/or by using intrinsic color sensitivity or other techniques, as the skilled person will recognize. In particular contrast to the transversal optical sensor as described above, the imaging device may, generally, exhibit intransparent optical properties. Other embodiments of the imaging device are also possible.

The imaging device may be designed to image a plurality of partial regions of the object successively and/or simultaneously. By way of example, a partial region of the object can be a one-dimensional, a two-dimensional, or a three-dimensional region of the object which is delimited for example by a resolution limit of the imaging device and from which electromagnetic radiation emerges. In this context, imaging should be understood to mean that the electromagnetic radiation which emerges from the respective partial region of the object is fed into the imaging device, for example by means of the at least one optional transfer device of the detector. The electromagnetic rays can be generated by the object itself, for example in the form of a luminescent radiation. Alternatively or additionally, the at least one detector may comprise at least one illumination source for illuminating the object.

In particular, the imaging device can be designed to image sequentially, for example by means of a scanning method, in particular using at least one row scan and/or line scan, the plurality of partial regions sequentially. However, other embodiments are also possible, for example embodiments in which a plurality of partial regions is simultaneously imaged. The imaging device is designed to generate, during this imaging of the partial regions of the object, signals, preferably electronic signals, associated with the partial regions. The signal may be an analogue and/or a digital signal. By way of example, an electronic signal can be associated with each partial region. The electronic signals can accordingly be generated simultaneously or else in a temporally staggered manner. By way of example, during a row scan or line scan, it is possible to generate a sequence of electronic signals which correspond to the partial regions of the object, which are strung together in a line, for example. Further, the imaging device may comprise one or more signal processing devices, such as one or more filters and/or analogue-digital-converters for processing and/or preprocessing the electronic signals.

Light emerging from the object can originate in the object itself, but can also optionally have a different origin and propagate from this origin to the object and subsequently toward the optical sensors. The latter case can be affected for example by at least one illumination source being used. The illumination source can be embodied in various ways. Thus, the illumination source can be for example part of the detector in a detector housing. Alternatively or additionally, however, the at least one illumination source can also be arranged outside a detector housing, for example as a separate light source. The illumination source can be arranged separately from the object and illuminate the object from a distance. Alternatively or additionally, the illumination source can also be connected to the object or even be part of the object, such that, by way of example, the electromagnetic radiation emerging from the object can also be generated directly by the illumination source. By way of example, at least one illumination source can be arranged on and/or in the object and directly generate the electromagnetic radiation by means of which the sensor region is illuminated. This illumination source can for example be or comprise an ambient light source and/or may be or may comprise an artificial illumination source. By way of example, at least one infrared emitter and/or at least one emitter for visible light and/or at least one emitter for ultraviolet light can be arranged on the object. By way of example, at least one light emitting diode and/or at least one laser diode can be arranged on and/or in the object. The illumination source can comprise in particular one or a plurality of the following illumination sources: a laser, in particular a laser diode, although in principle, alternatively or additionally, other types of lasers can also be used; a light emitting diode; an incandescent lamp; a neon light; a flame source; a heat source; an organic light source, in particular an organic light emitting diode; a structured light source; a light source comprising a diffractive optical element, a light source comprising a micro-mirror device, such as a digital light processor (DLP). Alternatively or additionally, other illumination sources can also be used. It is particularly preferred if the illumination source is designed to generate one or more light beams having a Gaussian beam profile, as is at least approximately the case for example in many lasers. For further potential embodiments of the optional illumination source, reference may be made to one of WO 2012/110924 A1 and WO 2014/097181 A1. Still, other embodiments are feasible.

The at least one optional illumination source generally may emit light in at least one of: the ultraviolet spectral range, preferably in the range of 200 nm to 380 nm; the visible spectral range (380 nm to 780 nm); the infrared spectral range, preferably in the range of 780 nm to 3.0 micrometers. Most preferably, the at least one illumination source is adapted to emit light in the visible spectral range, preferably in the range of 500 nm to 780 nm, most preferably at 650 nm to 750 nm or at 690 nm to 700 nm. Herein, it is particularly preferred when the illumination source may exhibit a spectral range which may be related to the spectral sensitivities of the longitudinal sensors, particularly in a manner to ensure that the longitudinal sensor which may be illuminated by the respective illumination source may provide a sensor signal with a high intensity which may, thus, enable a high-resolution evaluation with a sufficient signal-to-noise-ratio.

Furthermore, the detector can have at least one modulation device for modulating the illumination, in particular for a periodic modulation, in particular a periodic beam interrupting device. A modulation of the illumination should be understood to mean a process in which a total power of the illumination is varied, preferably periodically, in particular with one or a plurality of modulation frequencies. In particular, a periodic modulation can be effected between a maximum value and a minimum value of the total power of the illumination. The minimum value can be 0, but can also be >0, such that, by way of example, complete modulation does not have to be effected. The modulation can be effected for example in a beam path between the object and the optical sensor, for example by the at least one modulation device being arranged in said beam path. Alternatively or additionally, however, the modulation can also be effected in a beam path between an optional illumination source—described in even greater detail below—for illuminating the object and the object, for example by the at least one modulation device being arranged in said beam path. A combination of these possibilities is also conceivable. The at least one modulation device can comprise for example a beam chopper or some other type of periodic beam interrupting device, for example comprising at least one interrupter blade or interrupter wheel, which preferably rotates at constant speed and which can thus periodically interrupt the illumination. Alternatively or additionally, however, it is also possible to use one or a plurality of different types of modulation devices, for example modulation devices based on an electro-optical effect and/or an acousto-optical effect. Once again alternatively or additionally, the at least one optional illumination source itself can also be designed to generate a modulated illumination, for example by said illumination source itself having a modulated intensity and/or total power, for example a periodically modulated total power, and/or by said illumination source being embodied as a pulsed illumination source, for example as a pulsed laser. Thus, by way of example, the at least one modulation device can also be wholly or partly integrated into the illumination source. Various possibilities are conceivable.

Accordingly, the detector can be designed in particular to detect at least two sensor signals in the case of different modulations, in particular at least two longitudinal sensor signals at respectively different modulation frequencies. The evaluation device can be designed to generate the geometrical information from the at least two longitudinal sensor signals. As described in WO 2012/110924 A1 and WO 2014/097181 A1, it is possible to resolve ambiguities and/or it is possible to take account of the fact that, for example, a total power of the illumination is generally unknown. By way of example, the detector can be designed to bring about a modulation of the illumination of the object and/or at least one sensor region of the detector, such as at least one sensor region of the at least one optical sensor, with a frequency of 0.05 Hz to 1 MHz, such as 0.1 Hz to 10 kHz. As outlined above, for this purpose, the detector may comprise at least one modulation device, which may be integrated into the at least one optional illumination source and/or may be independent from the illumination source. Thus, at least one illumination source might, by itself, be adapted to generate the modulation of the illumination, and/or at least one independent modulation device may be present, such as at least one chopper and/or at least one device having a modulated transmissibility, such as at least one electro-optical device and/or at least one acousto-optical device.

According to the present invention, it may be advantageous in order to apply at least one modulation frequency to the optical detector as described above. However, it may still be possible to directly determine the longitudinal sensor signal without applying a modulation frequency to the optical detector. As will be demonstrated below in more detail, an application of a modulation frequency may not be required under many relevant circumstances in order to acquire the desired longitudinal information about the object. As a result, the optical detector may, thus, not be required to comprise a modulation device which may further contribute to the simple and cost-effective setup of the spatial detector. As a further result, a spatial light modulator may be used in a time-multiplexing mode rather than a frequency-multiplexing mode or in a combination thereof.

In a further aspect of the present invention, an arrangement comprising at least two individual detectors according to any of the preceding embodiments, preferably two or three individual optical sensors, which may be placed at two distinct locations, is proposed. Herein, the at least two detectors preferably may have identical optical properties but might also be different with respect from each other. In addition, the arrangement may further comprise at least one illumination source. Herein, the at least one object might be illuminated by using at least one illumination source which generates primary light, wherein the at least one object elastically or inelastically reflects the primary light, thereby generating a plurality of light beams which propagate to one of the at least two detectors. The at least one illumination source may form or may not form a constituent part of each of the at least two detectors. By way of example, the at least one illumination source itself may be or may comprise an ambient light source and/or may be or may comprise an artificial illumination source. This embodiment is preferably suited for an application in which at least two detectors, preferentially two identical detectors, are employed for acquiring depth information, in particular, for the purpose to providing a measurement volume which extends the inherent measurement volume of a single detector.

In this regard, the individual optical sensor may, preferably, be spaced apart from the other individual optical sensors comprised by the detector in order to allow acquiring an individual image which may differ from the images taken by the other individual optical sensors. In particular, the individual optical sensors may be arranged in separate beam paths in a collimated arrangement in order to generate a single circular, three-dimensional image. Thus, the individual optical sensors may be aligned in a manner that they are located parallel to the optical axis and may, in addition, exhibit an individual displacement in an orientation perpendicular to the optical axis of the detector. Herein, an alignment may be achieved by adequate measures, such as by adjusting a location and orientation of the individual optical sensor and/or the corresponding transfer element. Thus, the two individual optical sensors may, preferably, be spaced apart in a manner that they may be able to generate or increase a perception of depth information, especially in a fashion that the depth information may be obtained by combining visual information as derived from the two individual optical sensors having overlapping fields of view, such as the visual information as obtained by binocular vision. For this purpose, the individual optical sensors may, preferably be spaced apart from each other by a distance from 1 cm to 100 cm, preferably from 10 cm to 25 cm, as determined in the direction perpendicular to the optical axis. As used herein, the detector as provided in this embodiment may, in particular, be part of a "stereoscopic system" which will be described below in more detail. Besides allowing stereoscopic vision, further particular advantages of the stereoscopic system which are primarily based on a use of more than one optical sensor may, in particular, include an increase of the total intensity and/or a lower detection threshold.

In a further aspect of the present invention, a human-machine interface for exchanging at least one item of information between a user and a machine is proposed. The human-machine interface as proposed may make use of the fact that the above-mentioned detector in one or more of the embodiments mentioned above or as mentioned in further detail below may be used by one or more users for providing information and/or commands to a machine. Thus, preferably, the human-machine interface may be used for inputting control commands.

The human-machine interface comprises at least one detector according to the present invention, such as according to one or more of the embodiments disclosed above and/or according to one or more of the embodiments as disclosed in further detail below, wherein the human-machine interface is designed to generate at least one item of geometrical information of the user by means of the detector wherein the human-machine interface is designed to assign the geometrical information to at least one item of information, in particular to at least one control command.

In a further aspect of the present invention, an entertainment device for carrying out at least one entertainment function is disclosed. As used herein, an entertainment device is a device which may serve the purpose of leisure and/or entertainment of one or more users, in the following also referred to as one or more players. As an example, the entertainment device may serve the purpose of gaming, preferably computer gaming. Additionally or alternatively, the entertainment device may also be used for other purposes, such as for exercising, sports, physical therapy or motion tracking in general. Thus, the entertainment device may be implemented into a computer, a computer network or a computer system or may comprise a computer, a computer network or a computer system which runs one or more gaming software programs.

The entertainment device comprises at least one human-machine interface according to the present invention, such as according to one or more of the embodiments disclosed above and/or according to one or more of the embodiments disclosed below. The entertainment device is designed to enable at least one item of information to be input by a player by means of the human-machine interface. The at least one item of information may be transmitted to and/or may be used by a controller and/or a computer of the entertainment device.

In a further aspect of the present invention, a tracking system for tracking the position of at least one movable object is provided. As used herein, a tracking system is a device which is adapted to gather information on a series of past positions of the at least one object or at least one part of an object. Additionally, the tracking system may be adapted to provide information on at least one predicted future position of the at least one object or the at least one part of the object. The tracking system may have at least one track controller, which may fully or partially be embodied as an electronic device, preferably as at least one data processing device, more preferably as at least one computer or microcontroller. Again, the at least one track controller may comprise the at least one evaluation device and/or may be part of the at least one evaluation device and/or might fully or partially be identical to the at least one evaluation device.

The tracking system comprises at least one detector according to the present invention, such as at least one detector as disclosed in one or more of the embodiments listed above and/or as disclosed in one or more of the embodiments below. The tracking system further comprises at least one track controller. The tracking system may comprise one, two or more detectors, particularly two or more identical detectors, which allow for a reliable acquisition of depth information about the at least one object in an overlapping volume between the two or more detectors. The track controller is adapted to track a series of positions of the object, each position comprising at least one item of information on a position of the object at a specific point in time.

The tracking system may further comprise at least one beacon device connectable to the object. For a potential definition of the beacon device, reference may be made to WO 2014/097181 A1. The tracking system preferably is adapted such that the detector may generate an information on the position of the object of the at least one beacon device, in particular to generate the information on the position of the object which comprises a specific beacon device exhibiting a specific spectral sensitivity. Thus, more than one beacon exhibiting a different spectral sensitivity may be tracked by the detector of the present invention, preferably in a simultaneous manner. Herein, the beacon device may fully or partially be embodied as an active beacon device and/or as a passive beacon device. As an example, the beacon device may comprise at least one illumination source adapted to generate at least one light beam to be transmitted to the detector. Additionally or alternatively, the beacon device may comprise at least one reflector adapted to reflect light generated by an illumination source, thereby generating a reflected light beam to be transmitted to the detector.

In a further aspect of the present invention, a scanning system for determining at least one position of at least one object is provided. As used herein, the scanning system is a device which is adapted to emit at least one light beam being configured for an illumination of at least one dot located at least one surface of the at least one object and for generating at least one item of information about the distance between the at least one dot and the scanning system. For the purpose of generating the at least one item of information about the distance between the at least one dot and the scanning system, the scanning system comprises at least one of the detectors according to the present invention, such as at least one of the detectors as disclosed in one or more of the embodiments listed above and/or as disclosed in one or more of the embodiments below.

Thus, the scanning system comprises at least one illumination source which is adapted to emit the at least one light beam being configured for the illumination of the at least one dot located at the at least one surface of the at least one object. As used herein, the term "dot" refers to a small area on a part of the surface of the object which may be selected, for example by a user of the scanning system, to be illuminated by the illumination source. Preferably, the dot may exhibit a size which may, on one hand, be as small as possible in order to allow the scanning system determining a value for the distance between the illumination source comprised by the scanning system and the part of the surface of the object on which the dot may be located as exactly as possible and which, on the other hand, may be as large as possible in order to allow the user of the scanning system or the scanning system itself, in particular by an automatic procedure, to detect a presence of the dot on the related part of the surface of the object.

For this purpose, the illumination source may comprise an artificial illumination source, in particular at least one laser source and/or at least one incandescent lamp and/or at least one semiconductor light source, for example, at least one light-emitting diode, in particular an organic and/or inorganic light-emitting diode. On account of their generally defined beam profiles and other properties of handleability, the use of at least one laser source as the illumination source is particularly preferred. Herein, the use of a single laser source may be preferred, in particular in a case in which it may be important to provide a compact scanning system that might be easily storable and transportable by the user. The illumination source may thus, preferably be a constituent part of the detector and may, therefore, in particular be integrated into the detector, such as into the housing of the detector. In a preferred embodiment, particularly the housing of the scanning system may comprise at least one display configured for providing distance-related information to the user, such as in an easy-to-read manner. In a further preferred embodiment, particularly the housing of the scanning system may, in addition, comprise at least one button which may be configured for operating at least one function related to the scanning system, such as for setting one or more operation modes. In a further preferred embodiment, particularly the housing of the scanning system may, in addition, comprise at least one fastening unit which may be configured for fastening the scanning system to a further surface, such as a rubber foot, a base plate or a wall holder, such comprising as magnetic material, in particular for increasing the accuracy of the distance measurement and/or the handleablity of the scanning system by the user.

In a particularly preferred embodiment, the illumination source of the scanning system may, thus, emit a single laser beam which may be configured for the illumination of a single dot located at the surface of the object. By using at least one of the detectors according to the present invention at least one item of information about the distance between the at least one dot and the scanning system may, thus, be generated. Hereby, preferably, the distance between the illumination system as comprised by the scanning system and the single dot as generated by the illumination source may be determined, such as by employing the evaluation device as comprised by the at least one detector. However, the scanning system may, further, comprise an additional evaluation system which may, particularly, be adapted for this purpose. Alternatively or in addition, a size of the scanning system, in particular of the housing of the scanning system, may be taken into account and, thus, the distance between a specific point on the housing of the scanning system, such as a front edge or a back edge of the housing, and the single dot may, alternatively, be determined.

Alternatively, the illumination source of the scanning system may emit two individual laser beams which may be configured for providing a respective angle, such as a right angle, between the directions of an emission of the beams, whereby two respective dots located at the surface of the same object or at two different surfaces at two separate objects may be illuminated. However, other values for the respective angle between the two individual laser beams may also be feasible. This feature may, in particular, be employed for indirect measuring functions, such as for deriving an indirect distance which may not be directly accessible, such as due to a presence of one or more obstacles between the scanning system and the dot or which may otherwise be hard to reach. By way of example, it may, thus, be feasible to determine a value for a height of an object by measuring two individual distances and deriving the height by using the Pythagoras formula. In particular for being able to keep a predefined level with respect to the object, the scanning system may, further, comprise at least one leveling unit, in particular an integrated bubble vial, which may be used for keeping the predefined level by the user.

As a further alternative, the illumination source of the scanning system may emit a plurality of individual laser beams, such as an array of laser beams which may exhibit a respective pitch, in particular a regular pitch, with respect to each other and which may be arranged in a manner in order to generate an array of dots located on the at least one surface of the at least one object. For this purpose, specially adapted optical elements, such as beam-splitting devices and mirrors, may be provided which may allow a generation of the described array of the laser beams.

Thus, the scanning system may provide a static arrangement of the one or more dots placed on the one or more surfaces of the one or more objects. Alternatively, illumination source of the scanning system, in particular the one or more laser beams, such as the above described array of the laser beams, may be configured for providing one or more light beams which may exhibit a varying intensity over time and/or which may be subject to an alternating direction of emission in a passage of time. Thus, the illumination source may be configured for scanning a part of the at least one surface of the at least one object as an image by using one or more light beams with alternating features as generated by the at least one illumination source of the scanning device. In particular, the scanning system may, thus, use at least one row scan and/or line scan, such as to scan the one or more surfaces of the one or more objects sequentially or simultaneously.

In a further aspect of the present invention, a stereoscopic system for generating at least one single circular, three-dimensional image of at least one object is provided. As used herein, the stereoscopic system as disclosed above and/or below may comprise at least two of the FiP sensors as the longitudinal optical sensors, wherein a first FiP sensor may be comprised in a tracking system, in particular in a tracking system according to the present invention, while a second FiP sensor may be comprised in a scanning system, in particular in a scanning system according to the present invention. Herein, the FiP sensors may, preferably, be arranged in separate beam paths in a collimated arrangement, such as by aligning the FiP sensors parallel to the optical axis and individually displaced perpendicular to the optical axis of the stereoscopic system. Thus, the FiP sensors may be able to generate or increase a perception of depth information, especially, by obtaining the depth information by a combination of the visual information derived from the individual FiP sensors which have overlapping fields of view and are, preferably, sensitive to an individual modulation frequency. For this purpose, the individual FiP sensors may, preferably, be spaced apart from each other by a distance from 1 cm to 100 cm, preferably from 10 cm to 25 cm, as determined in the direction perpendicular to the optical axis. In this preferred embodiment, the tracking system may, thus, be employed for determining a position of a modulated active target while the scanning system which is adapted to project one or more dots onto the one or more surfaces of the one or more objects may be used for generating at least one item of information about the distance between the at least one dot and the scanning system. In addition, the stereoscopic system may further comprise a separate position sensitive device being adapted for generating the item of information on the transversal position of the at least one object within the image as described elsewhere in this application.

Besides allowing stereoscopic vision, further particular advantages of the stereoscopic system which are primarily based on a use of more than one longitudinal optical sensor may, in particular, include an increase of the total intensity and/or a lower detection threshold. Further, whereas in a conventional stereoscopic system which comprises at least two conventional position sensitive devices corresponding pixels in the respective images have to be determined by applying considerable computational effort, in the stereoscopic system according to the present invention which comprises at least two FiP sensors the corresponding pixels in the respective images being recorded by using the FiP sensors, wherein each of the FiP sensors may be operated with a different modulation frequency, may apparently be assigned with respect to each other. Thus, it may be emphasized that the stereoscopic system according to the present invention may allow generating the at least one item of information on the longitudinal position of the object as well as on the transversal position of the object with reduced effort.

For further details of the stereoscopic system, reference may be made to the description of the tracking system and the scanning system, respectively.

In a further aspect of the present invention, a camera for imaging at least one object is disclosed. The camera comprises at least one detector according to the present invention, such as disclosed in one or more of the embodiments given above or given in further detail below. Thus, the detector may be part of a photographic device, specifically of a digital camera. Specifically, the detector may be used for 3D photography, specifically for digital 3D photography. Thus, the detector may form a digital 3D camera or may be part of a digital 3D camera. As used herein, the term "photography" generally refers to the technology of acquiring image information of at least one object. As further used herein, a "camera" generally is a device adapted for performing photography. As further used herein, the term "digital photography" generally refers to the technology of acquiring image information of at least one object by using a plurality of light-sensitive elements adapted to generate electrical signals indicating an intensity of illumination, preferably digital electrical signals. As further used herein, the term "3D photography" generally refers to the technology of acquiring image information of at least one object in three spatial dimensions. Accordingly, a 3D camera is a device adapted for performing 3D photography. The camera generally may be adapted for acquiring a single image, such as a single 3D image, or may be adapted for acquiring a plurality of images, such as a sequence of images. Thus, the camera may also be a video camera adapted for video applications, such as for acquiring digital video sequences.

Thus, generally, the present invention further refers to a camera, specifically a digital camera, more specifically a 3D camera or digital 3D camera, for imaging at least one object. As outlined above, the term imaging, as used herein, generally refers to acquiring image information of at least one object. The camera comprises at least one detector according to the present invention. The camera, as outlined above, may be adapted for acquiring a single image or for acquiring a plurality of images, such as image sequence, preferably for acquiring digital video sequences. Thus, as an example, the camera may be or may comprise a video camera. In the latter case, the camera preferably comprises a data memory for storing the image sequence.

In a further aspect of the present invention, a method for manufacturing an optical sensor is disclosed. The method preferably may be used for manufacturing or producing at least one optical sensor according to the present invention, such as of at least one optical sensor according to one or more of the embodiments disclosed elsewhere in this document in further detail below. Thus, for optional embodiments of the method, reference might be made to the description of the various embodiments of the optical sensor.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method according to the present invention comprises the following steps:
a) providing a layer of at least one photoconductive material;
b) thereafter, applying at least one precursor being adapted to react to at least one metal-containing compound, whereby the metal-containing compound is deposited as an amorphous cover layer on the layer of the photoconductive material; and
c) thereafter, thermally treating the amorphous cover layer;

wherein at least two electrical contacts electrically contacting the layer of the photoconductive material are further provided.

According to step a), a layer of at least one photoconductive material is provided. In particular, the photoconductive material may be selected from a list of the photoconductive materials as presented above. For further details with respect to the manufacturing of the layer of the photoconductive material reference may be made to the description of FIG. 3 below.

According to step b), at least one precursor being adapted to react to a metal-containing compound is, subsequently, applied to the layer of the photoconductive material. Hereby, at least one metal-containing compound is deposited as an amorphous cover layer on the photoconductive material. As described above, the at least one metal-containing compound may, in particular, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, wherein the metals Al, Ti, Ta, Mn, Mo, Zr, Hf, and W are, particularly, preferred. In a specific embodiment, the metal-containing compound may, alternatively, comprise a semi-metal or metalloid selected from the group consisting of B, Si, Ge, As, Sb, and Te. Herein, the at least one metal-containing compound may, preferably, be selected from the group comprising an oxide, a hydroxide, a chalcogenide, a pnictide, a carbide, or a combination thereof. Thus, in a particularly preferred embodiment, the at least one metal-containing compound may be selected from at least one oxide, at least one hydroxide, or a combination thereof of Al, Ti, Zr or Hf, or from a nitride of Si.

In a further preferred embodiment, step b) is repeated at least once, preferably at least 10 times, more preferred at least 100 times. Herein, the same precursors being adapted to react to the same metal-containing compound may be employed for each repetition. In a special embodiment, at least two adjacent layers may be deposited in form of a laminate. Herein, the term "laminate" may refer to a manner of deposition in which the adjacent layers may differ with respect to their respective composition. Consequently, the adjacent layers may differ in a fashion that they may comprise different metal-containing compounds. Alternatively, other kinds of compounds, in particular at least one of a metallic compound, a polymeric compound, a silicone compound, a glass compound, may be employed in some but not in all of the adjacent layers, such as in an alternating fashion with the layers comprising the metal-containing compounds. Preferably, the at least one metal-containing compound and, if applicable, the other kinds of compounds are deposited on the photoconductive material until it accomplishes a thickness of 10 nm to 600 nm, preferably of 20 nm to 200 nm, more preferred of 40 nm to 100 nm, most preferred of 50 to 75 nm. Herein, the at least one metal-containing compound and, if applicable, the other kinds of compounds are deposited on the photoconductive material in a manner that the cover layer may, preferably, be a conformal layer with respect to an adjacent surface of the photoconductive material. Accordingly, the thickness of the conformal layer may follow a corresponding surface of the photoconductive material within a deviation of ±50 nm, preferably of ±20 nm, mostly preferred of ±10 nm, over at least 90%, preferably at least 95%, most preferred at least 99%, of a surface of the cover layer.

In a particularly preferred embodiment of the present invention, at least one deposition method is used for depositing the metal-containing compound on the photoconductive material. Preferably, the deposition method may be selected from at least one of an atomic layer deposition (ALD) process, a chemical vapor deposition (CVD) process, a sputtering process, or a combination thereof. For further details with respect to the ALD process or the CVD process reference may be made to the description above. For the purpose of providing the metal-containing compound, two different types of precursors may, preferably, be employed, wherein a first precursor may be or comprise a metal-organic precursor, and wherein a second precursor may be or comprise a fluid. As generally used, the term "fluid" may refer to a non-solid state of the second precursor. By way of example, for providing an Al-containing compound, the first precursor may be or comprise TMA, i.e. trimethylaluminium $Al(CH_3)_3$, while the second precursor may be or comprise $H_2O$, oxygen, air or a solution thereof, or ozone. Alternatively or in addition, for providing a Zr-containing compound the first precursor may be or comprise TDMA-Zr, i.e. tetrakis(dimethylamido)zirconium(IV), while the second precursor may be or comprise $H_2O$, a solution thereof, or ozone. Herein, at least one of the precursors may be mixed with an inert gas, in particular $N_2$ or Ar, especially in order to provide a steady fluid flow.

As already described above, at least one additional layer may, further, be deposited on the cover layer or a partition thereof. As an alternative or in addition, at least one additional layer may at least partially be deposited on the layer of the photoconductive material and, subsequently, covered by the cover layer. Herein, the additional layer may be selected to be or comprise at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

According to method step c), a sample comprising the amorphous cover layer deposited on the photoconductive material, subsequently, undergoes a thermal treatment. For this purpose, a temperature from 20° C. to 300° C., preferably from 50° C. to 200° C., is applied to the sample as the heat treatment. Herein, at least one of method step b) and method step c) may, thus, preferably be performed in a vacuum chamber, wherein, in a particularly preferred embodiment, both method steps b) and c) are performed within the same vacuum chamber, especially without removing any of the samples during the method steps b) and c). As a result of the heat treatment in accordance with method step c), an influence on the photoconductivity of the photoconductive material, in particular an improvement on the photon-induced conductivity of the photoconductive material may, mostly preferred, be observable in the samples as produced in accordance with the method pursuant to the present invention.

As mentioned above, the desired optical sensor is, generally, designed to generate at least one sensor signal in a manner dependent on an illumination of a sensor region as comprised by the optical sensor by an incident light beam. For this purpose, at least two electrical contacts being adapted to electrically contact the photoconductive material comprised within the sensor region are further provided. In general, the electrical contacts may be provided before or during any one of the method steps a) to c). In a particularly preferred embodiment, the electrical contacts may be provided before step a), such as by providing an evaporated metal layer, such as by known evaporation techniques, wherein the metal layer may, particularly, comprise one or more of silver, aluminum, platinum, magnesium, chromium, titanium, gold, or graphene. Alternatively, the electrical contacts may be provided by a galvanic or chemically deposition process, such as electroless Ni, electroless Au, galvanic Ni, or galvanic Au. Herein, the cover layer may be deposited in a manner that it may also fully or partially cover the electrical contacts. In this particular embodiment, the electrical contacts are at least partially, preferably fully, covered by the cover layer may, thus, be bonded to at least one external connection by using electrically conductive leads, preferably in form of wires, in particular Au, Al, or Cu wires, wherein the electrically conductive leads may, especially, be bonded to the electrical contacts through the cover layer. By way of example, Au contacts covered by the cover layer may, subsequently, be contacted by wire bonds.

In addition, further details concerning the manufacturing process for the optical sensor may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, µMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAP-BGA, UCSP, µBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at https://en.wikipedia.org/wiki/List_of_integrated_circuit-_packaging_types or https://en.wikipedia.org/wiki/List_of_integrated_circuit-_package_dimensions.

In a further aspect of the present invention, a use of a detector according to the present invention is disclosed. Therein, a use of the detector for a purpose of determining a position of an object, in particular a lateral position of an object, is proposed, wherein the detector may, preferably, be used concurrently as at least one longitudinal optical sensor or combined with at least one additional longitudinal optical sensor, in particular, for a purpose of use selected from the group consisting of: a position measurement, in particular in traffic technology; an entertainment application; a security application; a human-machine interface application; a tracking application; a scanning application; a stereoscopic vision application; a photography application; an imaging application or camera application; a mapping application for generating maps of at least one space; a homing or tracking beacon detector for vehicles; a position measurement of objects with a thermal signature (hotter or colder than background); a machine vision application; a robotic application.

Thus, generally, the devices according to the present invention, such as the detector, may be applied in various fields of uses. Specifically, the detector may be applied for a purpose of use, selected from the group consisting of: a position measurement in traffic technology; an entertainment application; a security application; a human-machine interface application; a tracking application; a photography application; a cartography application; a mapping application for generating maps of at least one space; a homing or tracking beacon detector for vehicles; a mobile application; a webcam; an audio device; a Dolby surround audio system; a computer peripheral device; a gaming application; a camera or video application; a surveillance application; an automotive application; a transport application; a logistics application; a vehicle application; an airplane application; a ship application; a spacecraft application; a robotic application; a medical application; a sports' application; a building application; a construction application; a manufacturing application; a machine vision application; a use in combination with at least one sensing technology selected from time-of-flight detector, radar, Lidar, ultrasonic sensors, or interferometry. Additionally or alternatively, applications in local and/or global positioning systems may be named, especially landmark-based positioning and/or navigation, specifically for use in cars or other vehicles (such as trains, motorcycles, bicycles, trucks for cargo transportation), robots or for use by pedestrians. Further, indoor positioning systems may be named as potential applications, such as for household applications and/or for robots used in manufacturing, logistics, surveillance, or maintenance technology.

Thus, firstly, the devices according to the present invention may be used in mobile phones, tablet computers, laptops, smart panels or other stationary or mobile or wearable computer or communication applications. Thus, the devices according to the present invention may be combined with at least one active light source, such as a light source emitting light in the visible range or infrared spectral range, in order to enhance performance. Thus, as an example, the devices according to the present invention may be used as cameras and/or sensors, such as in combination with mobile software for scanning and/or detecting environment, objects and living beings. The devices according to the present invention may even be combined with 2D cameras, such as conventional cameras, in order to increase imaging effects. The devices according to the present invention may further be used for surveillance and/or for recording purposes or as input devices to control mobile devices, especially in combination with voice and/or gesture recognition. Thus, specifically, the devices according to the present invention acting as human-machine interfaces, also referred to as input devices, may be used in mobile applications, such as for controlling other electronic devices or components via the mobile device, such as the mobile phone. As an example, the mobile application including at least one device according to the present invention may be used for controlling a television set, a game console, a music player or music device or other entertainment devices.

Further, the devices according to the present invention may be used in webcams or other peripheral devices for computing applications. Thus, as an example, the devices according to the present invention may be used in combination with software for imaging, recording, surveillance, scanning, or motion detection. As outlined in the context of the human-machine interface and/or the entertainment device, the devices according to the present invention are particularly useful for giving commands by facial expressions and/or body expressions. The devices according to the present invention can be combined with other input generating devices like e.g. mouse, keyboard, touchpad, microphone etc. Further, the devices according to the present invention may be used in applications for gaming, such as by using a webcam. Further, the devices according to the present invention may be used in virtual training applications and/or video conferences. Further, devices according to the present invention may be used to recognize or track hands, arms, or objects used in a virtual or augmented reality application, especially when wearing head mounted displays.

Further, the devices according to the present invention may be used in mobile audio devices, television devices and gaming devices, as partially explained above. Specifically, the devices according to the present invention may be used as controls or control devices for electronic devices, entertainment devices or the like. Further, the devices according to the present invention may be used for eye detection or eye tracking, such as in 2D- and 3D-display techniques, especially with transparent displays for augmented reality applications and/or for recognizing whether a display is being looked at and/or from which perspective a display is being looked at. Further, devices according to the present invention may be used to explore a room, boundaries, obstacles, in connection with a virtual or augmented reality application, especially when wearing a head-mounted display.

Further, the devices according to the present invention may be used in or as digital cameras such as DSC cameras and/or in or as reflex cameras such as SLR cameras. For these applications, reference may be made to the use of the devices according to the present invention in mobile applications such as mobile phones, as disclosed above.

Further, the devices according to the present invention may be used for security or surveillance applications. Thus, as an example, at least one device according to the present invention can be combined with one or more digital and/or analogue electronics that will give a signal if an object is within or outside a predetermined area (e.g. for surveillance applications in banks or museums). Specifically, the devices according to the present invention may be used for optical encryption. Detection by using at least one device according to the present invention can be combined with other detection devices to complement wavelengths, such as with IR, x-ray, UV-VIS, radar or ultrasound detectors. The devices according to the present invention may further be combined with an active infrared light source to allow detection in low light surroundings. The devices according to the present invention are generally advantageous as compared to active detector systems, specifically since the devices according to the present invention avoid actively sending signals which may be detected by third parties, as is the case e.g. in radar applications, ultrasound applications, LIDAR or similar active detector devices. Thus, generally, the devices according to the present invention may be used for an unrecognized and undetectable tracking of moving objects. Additionally, the devices according to the present invention generally are less prone to manipulations and irritations as compared to conventional devices.

Further, given the ease and accuracy of 3D detection by using the devices according to the present invention, the devices according to the present invention generally may be used for facial, body and person recognition and identification. Therein, the devices according to the present invention may be combined with other detection means for identification or personalization purposes such as passwords, finger prints, iris detection, voice recognition or other means. Thus, generally, the devices according to the present invention may be used in security devices and other personalized applications.

Further, the devices according to the present invention may be used as 3D barcode readers for product identification.

In addition to the security and surveillance applications mentioned above, the devices according to the present invention generally can be used for surveillance and monitoring of spaces and areas. Thus, the devices according to the present invention may be used for surveying and monitoring spaces and areas and, as an example, for triggering or executing alarms in case prohibited areas are violated. Thus, generally, the devices according to the present invention may be used for surveillance purposes in building surveillance or museums, optionally in combination with other types of sensors, such as in combination with motion or heat sensors, in combination with image intensifiers or image enhancement devices and/or photomultipliers. Further, the devices according to the present invention may be used in public spaces or crowded spaces to detect potentially hazardous activities such as commitment of crimes such as theft in a parking lot or unattended objects such as unattended baggage in an airport.

Further, the devices according to the present invention may advantageously be applied in camera applications such as video and camcorder applications. Thus, the devices according to the present invention may be used for motion capture and 3D-movie recording. Therein, the devices according to the present invention generally provide a large number of advantages over conventional optical devices. Thus, the devices according to the present invention generally require a lower complexity with regard to optical components. Thus, as an example, the number of lenses may be reduced as compared to conventional optical devices, such as by providing the devices according to the present invention having one lens only. Due to the reduced complexity, very compact devices are possible, such as for mobile use. Conventional optical systems having two or more lenses with high quality generally are voluminous, such as due to the general need for voluminous beam-splitters. Further, the devices according to the present invention generally may be used for focus/autofocus devices, such as autofocus cameras. Further, the devices according to the present invention may also be used in optical microscopy, especially in confocal microscopy.

Further, the devices according to the present invention generally are applicable in the technical field of automotive technology and transport technology. Thus, as an example, the devices according to the present invention may be used as distance and surveillance sensors, such as for adaptive cruise control, emergency brake assist, lane departure warning, surround view, blind spot detection, traffic sign detection, traffic sign recognition, lane recognition, rear cross traffic alert, light source recognition for adapting the head light intensity and range depending on approaching traffic or vehicles driving ahead, adaptive front-lighting systems, automatic control of high beam head lights, adaptive cut-off lights in front light systems, glare-free high beam front lighting systems, marking animals, obstacles, or the like by headlight illumination, rear cross traffic alert, and other driver assistance systems, such as advanced driver assistance systems, or other automotive and traffic applications. Further, devices according to the present invention may be used in driver assistance systems which may, particularly, be adapted for anticipating maneuvers of the driver beforehand for collision avoidance. Further, the devices according to the present invention can also be used for velocity and/or acceleration measurements, such as by analyzing a first and second time-derivative of position information gained by using the detector according to the present invention. This feature generally may be applicable in automotive technology, transportation technology or general traffic technology. Applications in other fields of technology are feasible. A specific application in an indoor positioning system may be the detection of positioning of passengers in transportation, more specifically to electronically control the use of safety systems such as airbags. Herein, the use of an airbag may, especially, be prevented in a case in which the passenger may be located within the vehicle in a manner that a use of the airbag might cause an injury, in particular a severe injury, with the passenger. Further, in vehicles such as cars, trains, planes or the like, especially in autonomous vehicles, devices according to the present invention may be used to determine whether a driver pays attention to the traffic or is distracted, or asleep, or tired, or incapable of driving, such as due to the consumption of alcohol or other drugs.

In these or other applications, generally, the devices according to the present invention may be used as standalone devices or in combination with other sensor devices, such as in combination with radar and/or ultrasonic devices. Specifically, the devices according to the present invention may be used for autonomous driving and safety issues. Further, in these applications, the devices according to the present invention may be used in combination with infrared sensors, radar sensors, which are sonic sensors, two-dimensional cameras or other types of sensors. In these applications, the generally passive nature of the devices according to the present invention is advantageous. Thus, since the devices according to the present invention generally do not require emitting signals, the risk of interference of active sensor signals with other signal sources may be avoided. The devices according to the present invention specifically may be used in combination with recognition software, such as standard image recognition software. Thus, signals and data as provided by the devices according to the present invention typically are readily processable and, therefore, generally require lower calculation power than established stereovision systems such as LIDAR. Given the low space demand, the devices according to the present invention such as cameras may be placed at virtually any place in a vehicle, such as on or behind a window screen, on a front hood, on bumpers, on lights, on mirrors or other places and the like. Various detectors according to the present invention such as one or more detectors based on the effect disclosed within the present invention can be combined, such as in order to allow autonomously driving vehicles or in order to increase the performance of active safety concepts. Thus, various devices according to the present invention may be combined with one or more other devices according to the present invention and/or conventional sensors, such as in the windows like rear window, side window or front window, on the bumpers or on the lights.

A combination of at least one device according to the present invention such as at least one detector according to the present invention with one or more rain detection sensors is also possible. This is due to the fact that the devices according to the present invention generally are advantageous over conventional sensor techniques such as radar, specifically during heavy rain. A combination of at least one device according to the present invention with at least one conventional sensing technique such as radar may allow for a software to pick the right combination of signals according to the weather conditions.

Further, the devices according to the present invention may generally be used as break assist and/or parking assist and/or for speed measurements. Speed measurements can be integrated in the vehicle or may be used outside the vehicle, such as in order to measure the speed of other cars in traffic control. Further, the devices according to the present invention may be used for detecting free parking spaces in parking lots.

Further, the devices according to the present invention may generally be used for vision, in particular for vision under difficult visibility conditions, such as in night vision, fog vision, or fume vision. For achieving this purpose, the optical detector may be sensitive at least within a wavelength range in which small particles, such as particles being present in smoke or fume, or small droplets, such as droplets being present in fog, mist or haze, may not reflect an incident light beam or only a small partition thereof. As generally known, the reflection of the incident light beam may be small or negligent in a case in which the wavelength of the incident beam exceeds the size of the particles or of the droplets, respectively. Further, might vision may be enabled by detecting thermal radiation being emitted by a bodies and objects. Thus, the optical detector may particularly be sensitive within the infrared (IR) spectral range, preferably within the near infrared (NIR) spectral range, may, thus, allow good visibility even at night, in fume, smoke, fog, mist, or haze.

Further, the devices according to the present invention may be used in the fields of medical systems and sports. Thus, in the field of medical technology, surgery robotics, e.g. for use in endoscopes, may be named, since, as outlined above, the devices according to the present invention may require a low volume only and may be integrated into other devices. Specifically, the devices according to the present invention having one lens, at most, may be used for capturing 3D information in medical devices such as in endoscopes. Further, the devices according to the present invention may be combined with an appropriate monitoring software, in order to enable tracking and analysis of movements. This may allow an instant overlay of the position of a medical device, such as an endoscope or a scalpel, with results from medical imaging, such as obtained from magnetic resonance imaging, x-ray imaging, or ultrasound imaging. These applications are specifically valuable e.g. in medical treatments where precise location information is important such as in brain surgery and long-distance diagnosis and tele-medicine. Further, the devices according to the present invention may be used in 3D-body scanning. Body scanning may be applied in a medical context, such as in dental surgery, plastic surgery, bariatric surgery, or cosmetic plastic surgery, or it may be applied in the context of medical diagnosis such as in the diagnosis of myofascial pain syndrome, cancer, body dysmorphic disorder, or further diseases. Body scanning may further be applied in the field of sports to assess ergonomic use or fit of sports equipment.

Body scanning may further be used in the context of clothing, such as to determine a suitable size and fitting of clothes. This technology may be used in the context of tailor-made clothes or in the context of ordering clothes or shoes from the internet or at a self-service shopping device such as a micro kiosk device or customer concierge device. Body scanning in the context of clothing is especially important for scanning fully dressed customers.

Further, the devices according to the present invention may be used in the context of people counting systems, such as to count the number of people in an elevator, a train, a bus, a car, or a plane, or to count the number of people passing a hallway, a door, an aisle, a retail store, a stadium, an entertainment venue, a museum, a library, a public location, a cinema, a theater, or the like. Further, the 3D-function in the people counting system may be used to obtain or estimate further information about the people that are counted such as height, weight, age, physical fitness, or the like. This information may be used for business intelligence metrics, and/or for further optimizing the locality where people may be counted to make it more attractive or safe. In a retail environment, the devices according to the present invention in the context of people counting may be used to recognize returning customers or cross shoppers, to assess shopping behavior, to assess the percentage of visitors that make purchases, to optimize staff shifts, or to monitor the costs of a shopping mall per visitor. Further, people counting systems may be used for anthropometric surveys. Further, the devices according to the present invention may be used in public transportation systems for automatically charging passengers depending on the length of transport. Further, the devices according to the present invention may be used in playgrounds for children, to recognize injured children or children engaged in dangerous activities, to allow additional interaction with playground toys, to ensure safe use of playground toys or the like.

Further, the devices according to the present invention may be used in construction tools, such as a range meter that determines the distance to an object or to a wall, to assess whether a surface is planar, to align or objects or place objects in an ordered manner, or in inspection cameras for use in construction environments or the like.

Further, the devices according to the present invention may be applied in the field of sports and exercising, such as for training, remote instructions or competition purposes. Specifically, the devices according to the present invention may be applied in the fields of dancing, aerobic, football, soccer, basketball, baseball, cricket, hockey, track and field, swimming, polo, handball, volleyball, rugby, sumo, judo, fencing, boxing, golf, car racing, laser tag, battlefield simulation etc. The devices according to the present invention can be used to detect the position of a ball, a bat, a sword, motions, etc., both in sports and in games, such as to monitor the game, support the referee or for judgment, specifically automatic judgment, of specific situations in sports, such as for judging whether a point or a goal actually was made.

Further, the devices according to the present invention may be used in the field of auto racing or car driver training or car safety training or the like to determine the position of a car or the track of a car, or the deviation from a previous track or an ideal track or the like.

The devices according to the present invention may further be used to support a practice of musical instruments, in particular remote lessons, for example lessons of string instruments, such as fiddles, violins, violas, celli, basses, harps, guitars, banjos, or ukuleles, keyboard instruments, such as pianos, organs, keyboards, harpsichords, harmoniums, or accordions, and/or percussion instruments, such as drums, timpani, marimbas, xylophones, vibraphones, bongos, congas, timbales, djembes or tablas.

The devices according to the present invention further may be used in rehabilitation and physiotherapy, in order to encourage training and/or in order to survey and correct movements. Therein, the devices according to the present invention may also be applied for distance diagnostics.

Further, the devices according to the present invention may be applied in the field of machine vision. Thus, one or more of the devices according to the present invention may be used e.g. as a passive controlling unit for autonomous driving and or working of robots. In combination with moving robots, the devices according to the present invention may allow for autonomous movement and/or autonomous detection of failures in parts. The devices according to the present invention may also be used for manufacturing and safety surveillance, such as in order to avoid accidents including but not limited to collisions between robots, production parts and living beings. In robotics, the safe and direct interaction of humans and robots is often an issue, as robots may severely injure humans when they are not recognized. Devices according to the present invention may help robots to position objects and humans better and faster and allow a safe interaction. Given the passive nature of the devices according to the present invention, the devices according to the present invention may be advantageous over active devices and/or may be used complementary to existing solutions like radar, ultrasound, 2D cameras, IR detection etc. One particular advantage of the devices according to the present invention is the low likelihood of signal interference. Therefore multiple sensors can work at the same time in the same environment, without the risk of signal interference. Thus, the devices according to the present invention generally may be useful in highly automated production environments like e.g. but not limited to automotive, mining, steel, etc. The devices according to the present invention can also be used for quality control in production, e.g. in combination with other sensors like 2-D imaging, radar, ultrasound, IR etc., such as for quality control or other purposes. Further, the devices according to the present invention may be used for assessment of surface quality, such as for surveying the surface evenness of a product or the adherence to specified dimensions, from the range of micrometers to the range of meters. Other quality control applications are feasible. In a manufacturing environment, the devices according to the present invention are especially useful for processing natural products such as food or wood, with a complex 3-dimensional structure to avoid large amounts of waste material. Further, devices according to the present invention may be used to monitor the filling level of tanks, silos etc. Further, devices according to the present invention may be used to inspect complex products for missing parts, incomplete parts, loose parts, low quality parts, or the like, such as in automatic optical inspection, such as of printed circuit boards, inspection of assemblies or sub-assemblies, verification of engineered components, engine part inspections, wood quality inspection, label inspections, inspection of medical devices, inspection of product orientations, packaging inspections, food pack inspections, or the like.

Further, the devices according to the present invention may be used in vehicles, trains, airplanes, ships, spacecraft and other traffic applications. Thus, besides the applications mentioned above in the context of traffic applications, passive tracking systems for aircraft, vehicles and the like may be named. The use of at least one device according to the present invention, such as at least one detector according to the present invention, for monitoring the speed and/or the direction of moving objects is feasible. Specifically, the tracking of fast moving objects on land, sea and in the air including space may be named. The at least one device according to the present invention, such as the at least one detector according to the present invention, specifically may be mounted on a still-standing and/or on a moving device. An output signal of the at least one device according to the present invention can be combined e.g. with a guiding mechanism for autonomous or guided movement of another object. Thus, applications for avoiding collisions or for enabling collisions between the tracked and the steered object are feasible. The devices according to the present invention are generally useful and advantageous due to a low calculation power required, an instant response and due to a passive nature of the detection system which is, generally, more difficult to detect and to disturb as compared to active systems, like e.g. radar. The devices according to the present invention are particularly useful but not limited to e.g. speed control and air traffic control devices. Further, the devices according to the present invention may be used in automated tolling systems for road charges.

The devices according to the present invention may, generally, be used in passive applications. Passive applications include guidance for ships in harbors or in dangerous areas, and for aircraft when landing or starting. Wherein, fixed, known active targets may be used for precise guidance. The same can be used for vehicles driving on dangerous but well defined routes, such as mining vehicles. Further, the devices according to the present invention may be used to detect rapidly approaching objects, such as cars, trains, flying objects, animals, or the like. Further, the devices according to the present invention can be used for detecting velocities or accelerations of objects, or to predict the movement of an object by tracking one or more of its position, speed, and/or acceleration depending on time.

Further, as outlined above, the devices according to the present invention may be used in the field of gaming. Thus, the devices according to the present invention can be passive for use with multiple objects of the same or of different size, color, shape, etc., such as for movement detection in combination with software that incorporates the movement into its content. In particular, applications are feasible in implementing movements into graphical output. Further, applications of the devices according to the present invention for giving commands are feasible, such as by using one or more of the devices according to the present invention for gesture or facial recognition. The devices according to the present invention may be combined with an active system in order to work under e.g. low light conditions or in other situations in which enhancement of the surrounding conditions is required. Additionally or alternatively, a combination of one or more devices according to the present invention with one or more IR or VIS light sources is possible. A combination of a detector according to the present invention with special devices is also possible, which can be distinguished easily by the system and its software, e.g. and not limited to, a special color, shape, relative position to other devices, speed of movement, light, frequency used to modulate light sources on the device, surface properties, material used, reflection properties, transparency degree, absorption characteristics, etc. The device can, amongst other possibilities, resemble a stick, a racquet, a club, a gun, a knife, a wheel, a ring, a steering wheel, a bottle, a ball, a glass, a vase, a spoon, a fork, a cube, a dice, a figure, a puppet, a teddy, a beaker, a pedal, a switch, a glove, jewelry, a musical instrument or an auxiliary device for playing a musical instrument, such as a plectrum, a drumstick or the like. Other options are feasible.

Further, the devices according to the present invention may be used to detect and or track objects that emit light by themselves, such as due to high temperature or further light emission processes. The light emitting part may be an exhaust stream or the like. Further, the devices according to the present invention may be used to track reflecting objects and analyze the rotation or orientation of these objects.

Further, the devices according to the present invention may generally be used in the field of building, construction and cartography. Thus, generally, one or more devices according to the present invention may be used in order to measure and/or monitor environmental areas, e.g. countryside or buildings. Therein, one or more devices according to the present invention may be combined with other methods and devices or can be used solely in order to monitor progress and accuracy of building projects, changing objects, houses, etc. The devices according to the present invention can be used for generating three-dimensional models of scanned environments, in order to construct maps of rooms, streets, houses, communities or landscapes, both from ground or air. Potential fields of application may be construction, cartography, real estate management, land surveying or the like. As an example, the devices according to the present invention may be used in vehicles capable of flight, such as drones or multicopters, in order to monitor buildings, chimneys, production sites, agricultural production environments such as fields, production plants, or landscapes, to support rescue operations, to support work in dangerous environments, to support fire brigades in a burning location indoors or outdoors, to find or monitor one or more persons, animals, or moving objects, or for entertainment purposes, such as a drone following and recording one or more persons doing sports such as skiing or cycling or the like, which could be realized by following a helmet, a mark, a beacon device, or the like. Devices according to the present invention could be used recognize obstacles, follow a predefined route, follow an edge, a pipe, a building, or the like, or to record a global or local map of the environment. Further, devices according to the present invention could be used for indoor or outdoor localization and positioning of drones, for stabilizing the height of a drone indoors where barometric pressure sensors are not accurate enough, or for the interaction of multiple drones such as concertized movements of several drones or recharging or refueling in the air or the like.

Further, the devices according to the present invention may be used within an interconnecting network of home appliances such as CHAIN (Cedec Home Appliances Interoperating Network) to interconnect, automate, and control basic appliance-related services in a home, e.g. energy or load management, remote diagnostics, pet related appliances, child related appliances, child surveillance, appliances related surveillance, support or service to elderly or ill persons, home security and/or surveillance, remote control of appliance operation, and automatic maintenance support. Further, the devices according to the present invention may be used in heating or cooling systems such as an air-conditioning system, to locate which part of the room should be brought to a certain temperature or humidity, especially depending on the location of one or more persons. Further, the devices according to the present invention may be used in domestic robots, such as service or autonomous robots which may be used for household chores. The devices according to the present invention may be used for a number of different purposes, such as to avoid collisions or to map the environment, but also to identify a user, to personalize the robot's performance for a given user, for security purposes, or for gesture or facial recognition. As an example, the devices according to the present invention may be used in robotic vacuum cleaners, floor-washing robots, dry-sweeping robots, ironing robots for ironing clothes, animal litter robots, such as cat litter robots, security robots that detect intruders, robotic lawn mowers, automated pool cleaners, rain gutter cleaning robots, window washing robots, toy robots, telepresence robots, social robots providing company to less mobile people, or robots translating and speech to sign language or sign language to speech. In the context of less mobile people, such as elderly persons, household robots with the devices according to the present invention may be used for picking up objects, transporting objects, and interacting with the objects and the user in a safe way. Further the devices according to the present invention may be used in robots operating with hazardous materials or objects or in dangerous environments. As a non-limiting example, the devices according to the present invention may be used in robots or unmanned remote-controlled vehicles to operate with hazardous materials such as chemicals or radioactive materials especially after disasters, or with other hazardous or potentially hazardous objects such as mines, unexploded arms, or the like, or to operate in or to investigate insecure environments such as near burning objects or post disaster areas, or for manned or unmanned rescue operations in the air, in the sea, underground, or the like.

Further, the devices according to the present invention may be used in household, mobile or entertainment devices, such as a refrigerator, a microwave, a washing machine, a window blind or shutter, a household alarm, an air condition devices, a heating device, a television, an audio device, a smart watch, a mobile phone, a phone, a dishwasher, a stove or the like, to detect the presence of a person, to monitor the contents or function of the device, or to interact with the person and/or share information about the person with further household, mobile or entertainment devices. Herein, the devices according to the present invention may be used to support elderly or disabled persons, blind persons, or persons with limited vision abilities, such as in household chores or at work such as in devices for holding, carrying, or picking objects, or in a safety system with optical and/or acoustical signals adapted for signaling obstacles in the environment.

The devices according to the present invention may further be used in agriculture, for example to detect and sort out vermin, weeds, and/or infected crop plants, fully or in parts, wherein crop plants may be infected by fungus or insects. Further, for harvesting crops, the devices according to the present invention may be used to detect animals, such as deer, which may otherwise be harmed by harvesting devices. Further, the devices according to the present invention may be used to monitor the growth of plants in a field or greenhouse, in particular to adjust the amount of water or fertilizer or crop protection products for a given region in the field or greenhouse or even for a given plant. Further, in agricultural biotechnology, the devices according to the present invention may be used to monitor the size and shape of plants.

Further, the devices according to the present invention may be combined with sensors to detect chemicals or pollutants, electronic nose chips, microbe sensor chips to detect bacteria or viruses or the like, Geiger counters, tactile sensors, heat sensors, or the like. This may for example be used in constructing smart robots which are configured for handling dangerous or difficult tasks, such as in treating highly infectious patients, handling or removing highly dangerous substances, cleaning highly polluted areas, such as highly radioactive areas or chemical spills, or for pest control in agriculture.

One or more devices according to the present invention can further be used for scanning of objects, such as in combination with CAD or similar software, such as for additive manufacturing and/or 3D printing. Therein, use may be made of the high dimensional accuracy of the devices according to the present invention, e.g. in x-, y- or z-direction or in any arbitrary combination of these directions, such as simultaneously. In this regard, determining a distance of an illuminated spot on a surface which may provide reflected or diffusely scattered light from the detector may be performed virtually independent of the distance of the light source from the illuminated spot. This property of the present invention is in direct contrast to known methods, such as triangulation or such as time-of-flight (TOF) methods, wherein the distance between the light source and the illuminated spot must be known a priori or calculated a posteriori in order to be able to determine the distance between the detector and the illuminated spot. In contrast hereto, for the detector according to the present invention is may be sufficient that the spot is adequately illuminated. Further, the devices according to the present invention may be used for scanning reflective surfaces, such of metal surfaces, independent whether they may comprise a solid or a liquid surface. Further, the devices according to the present invention may be used in inspections and maintenance, such as pipeline inspection gauges. Further, in a production environment, the devices according to the present invention may be used to work with objects of a badly defined shape such as naturally grown objects, such as sorting vegetables or other natural products by shape or size or cutting products such as meat or objects that are manufactured with a precision that is lower than the precision needed for a processing step.

Further, the devices according to the present invention may be used in local navigation systems to allow autonomously or partially autonomously moving vehicles or multicopters or the like through an indoor or outdoor space. A non-limiting example may comprise vehicles moving through an automated storage for picking up objects and placing them at a different location. Indoor navigation may further be used in shopping malls, retail stores, museums, airports, or train stations, to track the location of mobile goods, mobile devices, baggage, customers or employees, or to supply users with a location specific information, such as the current position on a map, or information on goods sold, or the like.

Further, the devices according to the present invention may be used to ensure safe driving of motorcycles, such as driving assistance for motorcycles by monitoring speed, inclination, upcoming obstacles, unevenness of the road, or curves or the like. Further, the devices according to the present invention may be used in trains or trams to avoid collisions.

Further, the devices according to the present invention may be used in handheld devices, such as for scanning packaging or parcels to optimize a logistics process. Further, the devices according to the present invention may be used in further handheld devices such as personal shopping devices, RFID-readers, handheld devices for use in hospitals or health environments such as for medical use or to obtain, exchange or record patient or patient health related information, smart badges for retail or health environments, or the like.

As outlined above, the devices according to the present invention may further be used in manufacturing, quality control or identification applications, such as in product identification or size identification (such as for finding an optimal place or package, for reducing waste etc.). Further, the devices according to the present invention may be used in logistics applications. Thus, the devices according to the present invention may be used for optimized loading or packing containers or vehicles. Further, the devices according to the present invention may be used for monitoring or controlling of surface damages in the field of manufacturing, for monitoring or controlling rental objects such as rental vehicles, and/or for insurance applications, such as for assessment of damages. Further, the devices according to the present invention may be used for identifying a size of material, object or tools, such as for optimal material handling, especially in combination with robots. Further, the devices according to the present invention may be used for process control in production, e.g. for observing filling level of tanks. Further, the devices according to the present invention may be used for maintenance of production assets like, but not limited to, tanks, pipes, reactors, tools etc. Further, the devices according to the present invention may be used for analyzing 3D-quality marks. Further, the devices according to the present invention may be used in manufacturing tailor-made goods such as tooth inlays, dental braces, prosthesis, clothes or the like. The devices according to the present invention may also be combined with one or more 3D-printers for rapid prototyping, 3D-copying or the like. Further, the devices according to the present invention may be used for detecting the shape of one or more articles, such as for anti-product piracy and for anti-counterfeiting purposes.

Further, the devices according to the present invention may be used in the context of gesture recognition. In this context, gesture recognition in combination with devices according to the present invention may, in particular, be used as a human-machine interface for transmitting information via motion of a body, of body parts or of objects to a machine. Herein, the information may, preferably, be transmitted via a motion of hands or hand parts, such as fingers, in particular, by pointing at objects, applying sign language, such as for deaf people, making signs for numbers, approval, disapproval, or the like, by waving the hand, such as when asking someone to approach, to leave, or to greet a person, to press an object, to take an object, or, in the field of sports or music, in a hand or finger exercise, such as a warm-up exercise. Further, the information may be transmitted by motion of arms or legs, such as rotating, kicking, grabbing, twisting, rotating, scrolling, browsing, pushing, bending, punching, shaking, arms, legs, both arms, or both legs, or a combination of arms and legs, such as for a purpose of sports or music, such as for entertainment, exercise, or training function of a machine. Further, the information may be transmitted by motion of the whole body or major parts thereof, such as jumping, rotating, or making complex signs, such as sign language used at airports or by traffic police in order to transmit information, such as "turn right", "turn left", "proceed", "slow down", "stop", or "stop engines", or by pretending to swim, to dive, to run, to shoot, or the like, or by making complex motions or body positions such as in yoga, pilates, judo, karate, dancing, or ballet. Further, the information may be transmitted by using a real or mock-up device for controlling a virtual device corresponding to the mock-up device, such as using a mock-up guitar for controlling a virtual guitar function in a computer program, using a real guitar for controlling a virtual guitar function in a computer program, using a real or a mock-up book for reading an e-book or moving pages or browsing through in a virtual document, using a real or mock-up pen for drawing in a computer program, or the like. Further, the transmission of the information may be coupled to a feedback to the user, such as a sound, a vibration, or a motion.

In the context of music and/or instruments, devices according to the present invention in combination with gesture recognition may be used for exercising purposes, control of instruments, recording of instruments, playing or recording of music via use of a mock-up instrument or by only pretending to have a instrument present such as playing air guitar, such as to avoid noise or make recordings, or, for conducting of a virtual orchestra, ensemble, band, big band, choir, or the like, for practicing, exercising, recording or entertainment purposes or the like.

Further, in the context of safety and surveillance, devices according to the present invention in combination with gesture recognition may be used to recognize motion profiles of persons, such as recognizing a person by the way of walking or moving the body, or to use hand signs or movements or signs or movements of body parts or the whole body as access or identification control such as a personal identification sign or a personal identification movement.

Further, in the context of smart home applications or internet of things, devices according to the present invention in combination with gesture recognition may be used for central or non-central control of household devices which may be part of an interconnecting network of home appliances and/or household devices, such as refrigerators, central heating, air condition, microwave ovens, ice cube makers, or water boilers, or entertainment devices, such as television sets, smart phones, game consoles, video recorders, DVD players, personal computers, laptops, tablets, or combinations thereof, or a combination of household devices and entertainment devices.

Further, in the context of virtual reality or of augmented reality, devices according to the present invention in combination with gesture recognition may be used to control movements or function of the virtual reality application or of the augmented reality application, such as playing or controlling a game using signs, gestures, body movements or body part movements or the like, moving through a virtual world, manipulating virtual objects, practicing, exercising or playing sports, arts, crafts, music or games using virtual objects such as a ball, chess figures, go stones, instruments, tools, brushes.

Further, in the context of medicine, devices according to the present invention in combination with gesture recognition may be used to support rehabilitation training, remote diagnostics, or to monitor or survey surgery or treatment, to overlay and display medical images with positions of medical devices, or to overlay display prerecorded medical images such as from magnetic resonance tomography or x-ray or the like with images from endoscopes or ultra sound or the like that are recorded during an surgery or treatment.

Further, in the context of manufacturing and process automation, devices according to the present invention in combination with gesture recognition may be used to control, teach, or program robots, drones, unmanned autonomous vehicles, service robots, movable objects, or the like, such as for programming, controlling, manufacturing, manipulating, repairing, or teaching purposes, or for remote manipulating of objects or areas, such as for safety reasons, or for maintenance purposes.

Further, in the context of business intelligence metrics, devices according to the present invention in combination with gesture recognition may be used for people counting, surveying customer movements, areas where customers spend time, objects, customers test, take, probe, or the like.

Further, devices according to the present invention may be used in the context of do-it-yourself or professional tools, especially electric or motor driven tools or power tools, such as drilling machines, saws, chisels, hammers, wrenches, staple guns, disc cutters, metals shears and nibblers, angle grinders, die grinders, drills, hammer drills, heat guns, wrenches, sanders, engravers, nailers, jig saws, biscuit joiners, wood routers, planers, polishers, tile cutters, washers, rollers, wall chasers, lathes, impact drivers, joiners, paint rollers, spray guns, morticers, or welders, in particular, to support precision in manufacturing, keeping a minimum or maximum distance, or for safety measures.

Further, the devices according to the present invention may be used to aid visually impaired persons. Further, devices according to the present invention may be used in touch screen such as to avoid direct context such as for hygienic reasons, which may be used in retail environments, in medical applications, in production environments, or the like. Further, devices according to the present invention may be used in agricultural production environments such as in stable cleaning robots, egg collecting machines, milking machines, harvesting machines, farm machinery, harvesters, forwarders, combine harvesters, tractors, cultivators, ploughs, destoners, harrows, strip tills, broadcast seeders, planters such as potato planters, manure spreaders, sprayers, sprinkler systems, swathers, balers, loaders, forklifts, mowers, or the like.

Further, devices according to the present invention may be used for selection and/or adaption of clothing, shoes, glasses, hats, prosthesis, dental braces, for persons or animals with limited communication skills or possibilities, such as children or impaired persons, or the like. Further, devices according to the present invention may be used in the context of warehouses, logistics, distribution, shipping, loading, unloading, smart manufacturing, industry 4.0, or the like. Further, in a manufacturing context, devices according to the present invention may be used in the context of processing, dispensing, bending, material handling, or the like.

The devices according to the present invention may be combined with one or more other types of measurement devices. Thus, the devices according to the present invention may be combined with one or more other types of sensors or detectors, such as a time of flight (TOF) detector, a stereo camera, a lightfield camera, a lidar, a radar, a sonar, an ultrasonic detector, or interferometry. When combining devices according to the present invention with one or more other types of sensors or detectors, the devices according to the present invention and the at least one further sensor or detector may be designed as independent devices, with the devices according to the present invention being separate from the at least one further sensor or detector. Alternatively, the devices according to the present invention and the at least one further sensor or detector may fully or partially be integrated or designed as a single device.

Thus, as a non-limiting example, the devices according to the present invention may further comprise a stereo camera. As used herein, a stereo camera is a camera which is designed for capturing images of a scene or an object from at least two different perspectives. Thus, the devices according to the present invention may be combined with at least one stereo camera.

The stereo camera's functionality is generally known in the art, since stereo cameras generally are known to the skilled person. The combination with the devices according to the present invention may provide additional distance information. Thus, the devices according to the present invention may be adapted, in addition to the stereo camera's information, to provide at least one item of information on a longitudinal position of at least one object within a scene captured by the stereo camera. Information provided by the stereo camera, such as distance information obtained by evaluating triangulation measurements performed by using the stereo camera, may be calibrated and/or validated by using the devices according to the present invention. Thus, as an example, the stereo camera may be used to provide at least one first item of information on the longitudinal position of the at least one object, such as by using triangulation measurements, and the devices according to the present invention may be used to provide at least one second item of information on the longitudinal position of the at least one object. The first item of information and the second item of information may be used to improve accuracy of the measurements. Thus, the first item of information may be used for calibrating the second item of information or vice a versa. Consequently, the devices according to the present invention, as an example, may form a stereo camera system, having the stereo camera and the devices according to the present invention, wherein the stereo camera system is adapted to calibrate the information provided by the stereo camera by using the information provided by devices according to the present invention.

Consequently, additionally or alternatively, the devices according to the present invention may be adapted to use the second item of information, provided by the devices according to the present invention, for correcting the first item of information, provided by the stereo camera. Additionally or alternatively, the devices according to the present invention may be adapted to use the second item of information, provided by the devices according to the present invention, for correcting optical distortion of the stereo camera. Further, the devices according to the present invention may adapted to calculate stereo information provided by the stereo camera, and the second item of information provided by devices according to the present invention may be used for speeding up the calculation of the stereo information.

As an example, the devices according to the present invention may be adapted to use at least one virtual or real object within a scene captured by the devices according to the present invention for calibrating the stereo camera. As an example, one or more objects and/or areas and/or spots may be used for calibration. As an example, the distance of at least one object or spot may be determined by using the devices according to the present invention, and distance information provided by the stereo camera may be calibrated by using this distance is determined by using the devices according to the present invention. For instance, at least one active light spot of the devices according to the present invention may be used as a calibration point for the stereo camera. The active light spot, as an example, may move freely in the picture.

The devices according to the present invention may be adapted to continuously or discontinuously calibrate the stereo camera by using information provided by the active distance sensor. Thus, as an example, the calibration may take place at regular intervals, continuously or occasionally.

Further, typical stereo cameras exhibit measurement errors or uncertainties which are dependent on the distance of the object. This measurement error may be reduced when combined with information provided by the devices according to the present invention.

Combinations of stereo cameras with other types of distance sensors are generally known in the art. Thus, in D. Scaramuzza et al., IEEE/RSJ International Conference on Intelligent Robots and Systems, IROS 2007, pp. 4164-4169, 2007, an extrinsic self-calibration of a camera and a 3D laser range finder from natural scenes is disclosed. Similarly, in D. Klimentjew et al., IEEE Conference on Multisensor Fusion and Integration for Intelligent Systems (MFI), pages 236-241, 2010, a multi sensor fusion of camera and 3D laser range finder for object recognition is disclosed. As the skilled person will recognize, the laser range finder in these setups known in the art may simply be replaced or complemented by at least one device according to the present invention, without altering the methods and advantages disclosed by these prior art documents. For potential setups of the stereo camera, reference may be made to these prior art documents. Still, other setups and embodiments of the at least one optional stereo camera are feasible.

Preferably, for further potential details of the optical detector, the method, the human-machine interface, the entertainment device, the tracking system, the camera and the various uses of the detector, in particular with regard to the transfer device, the transversal optical sensors, the evaluation device and, if applicable, to the longitudinal optical sensor, the modulation device, the illumination source and the imaging device, specifically with respect to the potential materials, setups and further details, reference may be made to one or more of WO 2012/110924 A1, US 2012/206336 A1, WO 2014/097181 A1, US 2014/291480 A1, and PCT patent application No. PCT/EP2016/051817, filed Jan. 28, 2016, the full content of all of which is herewith included by reference.

Further, the devices according to the present invention may be used for infra-red detection applications, heat-detection applications, thermometer applications, heat-seeking applications, flame-detection applications, fire-detection applications, smoke-detection applications, temperature sensing applications, spectroscopy applications, or the like. Further, devices according to the present invention may be used in photocopy or xerography applications. Further, devices according to the present invention may be used to monitor exhaust gas, to monitor combustion processes, to monitor industrial processes, to monitor chemical processes, to monitor food processing processes, or the like. Further, devices according to the present invention may be used for temperature control, motion control, exhaust control, gas sensing, gas analytics, motion sensing, chemical sensing, or the like.

The above-described optical sensor and the detector, the method, the human-machine interface and the entertainment device, which comprises at least one of the optical sensors, and also the proposed uses have considerable advantages over the prior art. Thus, generally, a simple and, still, efficient detector for an accurate determining a position of at least one object in space, specifically with regard to a depth or both to the depth and a width of the at least one object may be provided. Further, the optical sensor according to the present invention may be particularly sensitive over at least a partition of the IR spectral range, thus providing efficient, reliable and large-area position sensitive devices for the infrared.

As compared to devices known in the art, the optical sensor as proposed herein which can, preferably, be supplied as a non-bulky hermetic package, nevertheless, provides a high degree of protection against possible degradation by external influence, such as humidity and/or oxygen, even at elevated temperatures and humidity. Herein, the materials used for the optical sensor may be selected in order to ensure that the optical sensor may exhibit a suitable absorption characteristic over a wide spectral range. By way of example, the cover layer which comprises the material $Al_2O_3$ may be transparent for light beams with a wavelength up to 5 μm. Other materials may be used for other desired absorption characteristics over other spectral ranges. Moreover, since various materials exhibit a refractive index above 1.3, such as $Al_2O_3$ with approx. 1.75, the respective selected cover layer may, concurrently, function as an anti-reflective layer. As mentioned above, this type of cover material may be capable of forming a smooth cover layer which may tightly follow the surface of the photoconductive material in a conformal manner. This effect can, further, be advantageous since a light intensity within the photoconductive material which may function as the sensor region may, thus, be increased without any further efforts or any additional materials.

Further, the optical sensor can be simply manufactured and easily be integrated into a package. Herein, manufacturing the cover layer according to the present invention, in particular, by using the process of atomic layer deposition (ALD) or the combination of ALD and sputtering, pinholes and porous structures in the layer of the photoconductive material may be easily filled, thus providing leak-free encapsulation. In this regard it may be mentioned that the ALD process or the combination of ALD and sputtering is, in general, a batch process which may be applied to a large plurality of samples within a single batch. Compared to glue dispensing, a faster and cheaper encapsulation may, thus, be performed in accordance with the present invention. Furthermore, the bondability of the electrical contacts even through the cover layer and the non-bulky hermetic package of the optical sensor allows an easy integration on circuit carrier device, such as printed circuit boards (PCBs). In an alternative embodiment, the encapsulated photoconductive layer may be contacted by using through glass vias, which may allow a direct, hermetic connection from the top of the substrate to the bottom. In this alternative embodiment, devices could be glued or soldered directly onto the circuit carrier device, such as the PCB.

Summarizing, in the context of the present invention, the following embodiments are regarded as particularly preferred:

Embodiment 1: An optical sensor, comprising a layer of at least one photoconductive material, at least two individual electrical contacts contacting the layer of the photoconductive material, and a cover layer deposited on the layer of the photoconductive material, wherein the cover layer is an amorphous layer comprising at least one metal-containing compound.

Embodiment 2: The optical sensor according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 3: The optical sensor according to the preceding embodiment, wherein the at least one metal-containing compound comprises a metal selected from the group consisting of Al, Ti, Ta, Mn, Mo, Zr, Hf, and W.

Embodiment 4: The optical sensor according to any one of the preceding embodiments, wherein the at least one metal-containing compound is selected from the group comprising an oxide, a hydroxide, a chalcogenide, a pnictide, a carbide, or a combination thereof.

Embodiment 5: The optical sensor according to the preceding embodiment, wherein the at least one metal-containing compound comprises at least one oxide, at least one hydroxide, or a combination thereof of Al, Ti, Zr or Hf; or a nitride of Si.

Embodiment 6: The optical sensor according to any one of the preceding embodiments, wherein the cover layer is adapted to function as an encapsulation layer and/or as activation layer for the photoconductive material.

Embodiment 7: The optical sensor according to the preceding embodiment, wherein the cover layer is further adapted to function as an anti-reflective layer.

Embodiment 8: The optical sensor according to any one of the preceding embodiments, wherein the cover layer is or comprises a laminate having at least two adjacent layers, wherein the adjacent layers differ by their respective composition, wherein at least one of the adjacent layers comprises the at least one metal-containing compound.

Embodiment 9: The optical sensor according to the preceding embodiment, wherein at least one of the adjacent layers comprises at least one of a metallic compound, a polymeric compound, a silicone compound, a glass compound.

Embodiment 10: The optical sensor according to any one of the preceding embodiments, wherein the cover layer has a thickness of 10 nm to 600 nm, preferably of 20 nm to 200 nm, more preferred of 40 nm to 100 nm, most preferred of 50 to 75 nm.

Embodiment 11: The optical sensor according to any one of the preceding embodiments, wherein the cover layer is a conformal layer with respect to an adjacent surface of the layer of the photoconductive material, wherein the thickness of the conformal layer may, preferably, follow a corresponding surface of the photoconductive material within a deviation of ±50 nm, preferably of ±20 nm, mostly preferred of ±10 nm, over at least 90%, preferably at least 95%, most preferred at least 99%, of a surface of the cover layer.

Embodiment 12: The optical sensor according to any one of the preceding embodiments, wherein the cover layer is or comprises an atomic deposition layer or a chemical vapor deposition layer.

Embodiment 13: The optical sensor according to any one of the preceding embodiments, wherein the cover layer additionally comprises a property of at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 14: The optical sensor according to any one of the preceding embodiments, wherein the cover layer is further at least partially coated with at least one additional layer and/or wherein the at least one additional layer is at least partially deposited between the layer of the photoconductive material and the cover layer.

Embodiment 15: The optical sensor according to the preceding embodiment, wherein the additional layer is or comprises at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 16: The optical sensor according to any one of the preceding embodiments, wherein the photoconductive material comprises an inorganic photoconductive material.

Embodiment 17: The optical sensor according to the preceding embodiment, wherein the inorganic photoconductive material comprises one or more of selenium, tellurium, a selenium-tellurium alloy, a photoconductive metal oxide, a group IV element or compound, a III-V compound, a II-VI compound, a chalcogenide, a pnictogenide, a halide, and solid solutions and/or doped variants thereof.

Embodiment 18: The optical sensor according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 19: The optical sensor according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 20: The optical sensor according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 21: The optical sensor according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 22: The optical sensor according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfurselenium chalcogenide (CZTSSe), and solid solutions and/or doped variants thereof.

Embodiment 23: The optical sensor according to any one of the five preceding embodiments, wherein the photoconductive metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 24: The optical sensor according to any one of the six preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 25: The optical sensor according to any one of the seven preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 26: The optical sensor according to any one of the eight preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 27: The optical sensor according to any one of the preceding embodiments, wherein the cover layer directly contacts the layer of the photoconductive material.

Embodiment 28: The optical sensor according to any one of the preceding embodiments, wherein the cover layer fully covers the accessible surface of the photoconductive material.

Embodiment 29: The optical sensor according to any one of the preceding embodiments, wherein the cover layer at least partially covers the electrical contacts.

Embodiment 30: The optical sensor according to the preceding embodiment, wherein the electrical contacts are bondable, preferably by using wires, in particular Au, Al, or Cu wires.

Embodiment 31: The optical sensor according to any one of the preceding embodiment, the electrical contacts are bondable through the cover layer.

Embodiment 32: The optical sensor according to any one of the preceding embodiments, wherein the at least two electrical contacts are applied at different locations of the layer of the photoconductive material.

Embodiment 33: The optical sensor according to any one of the preceding embodiments, wherein the electrical contacts comprise at least one electrode material selected from the group consisting of Ag, Pt, Mo, Al, Au, and graphene.

Embodiment 34: The optical sensor according to the preceding embodiment, wherein an adhesive layer is provided at the electrical contacts, wherein the adhesive layer is adapted for bonding.

Embodiment 35: The optical sensor according to the preceding embodiment, wherein the adhesive layer comprises at least one of Ni, Cr, Ti or Pd.

Embodiment 36: The optical sensor according to any one of the preceding embodiments, wherein the at least one layer of the photoconductive material is directly or indirectly applied to at least one substrate.

Embodiment 37: The optical sensor according to the preceding embodiment, wherein at least one of the cover layer and the substrate is optically transparent within a wavelength range.

Embodiment 38: The optical sensor according to any one of the two preceding embodiments, wherein the substrate is an electrically insulating substrate.

Embodiment 39: The optical sensor according to any one of the three preceding embodiments, wherein the substrate comprises one of glass, Si, a transparent conducting oxide (TCO), or a transparent organic polymer, wherein the transparent conducting oxide, preferably, comprises indium tin oxide (ITO), fluorine doped tin oxide (SnO2:F; FTO), aluminum doped zinc oxide (AZO), magnesium oxide (MgO), or a perovskite transparent conducting oxide.

Embodiment 40: The optical sensor according to any one of the four preceding embodiments, wherein the substrate is or comprises an electrically conducting substrate, wherein an additional insulating interlayer is present between the electrically conducting substrate and the at least one layer of the photoconductive material.

Embodiment 41: A detector for an optical detection of at least one object, comprising:
 at least one optical sensor according to any one of the preceding embodiments, the optical sensor comprising at least one sensor region, wherein the optical sensor is designed to generate at least one sensor signal in a manner dependent on an illumination of the sensor region by a light beam; and
 at least one evaluation device, wherein the evaluation device is designed to generate at least one coordinate of the object by evaluating the sensor signal of the optical sensor.

Embodiment 42: The detector according to the preceding embodiment, wherein the sensor region is exactly one continuous sensor region Embodiment 43: The detector according to any of the two preceding embodiments, wherein the sensor region of the optical sensor is formed by a surface of the respective device, wherein the surface faces towards the object or faces away from the object.

Embodiment 44: The detector according to any of the three preceding embodiments, wherein the detector is adapted to generate the sensor signal by one or more of measuring an electrical resistance or a conductivity of at least one part of the sensor region.

Embodiment 45: The detector according to the preceding embodiment, wherein the detector is adapted to generate the sensor signal by performing at least one current-voltage measurement and/or at least one voltage-current-measurement.

Embodiment 46: The detector according to any one of the preceding embodiments relating to a detector, further comprising a bias voltage source.

Embodiment 47: The detector according to the preceding embodiment, wherein the bias voltage source and a load resistor are arranged in series with the longitudinal optical sensor.

Embodiment 48: The detector according to any one of the two preceding embodiments, wherein a bias voltage is applied across the photoconductive material of the longitudinal optical sensor.

Embodiment 49: The detector according to any one of the preceding embodiments relating to a detector, wherein the detector furthermore has at least one modulation device for modulating the illumination.

Embodiment 50: The detector according to the preceding embodiment, wherein the light beam is a modulated light beam.

Embodiment 51: The detector according to the preceding embodiment, wherein the detector is designed to detect at least two sensor signals in the case of different modulations, in particular at least two sensor signals at respectively different modulation frequencies, wherein the evaluation device is designed to generate the at least one item of information on the position of the object by evaluating the at least two sensor signals at the respectively different modulation frequencies.

Embodiment 52: The detector according to any one of the two preceding embodiments, wherein the optical sensor is furthermore designed in such a way that the sensor signal, given the same total power of the illumination, is dependent on a modulation frequency of a modulation of the illumination.

Embodiment 53: The detector according to the preceding embodiment, wherein the light beam is a non-modulated continuous-wave light beam.

Embodiment 54: The detector according to any one of the preceding embodiments relating to a detector, wherein the sensor signal is a longitudinal sensor signal, wherein the longitudinal sensor signal, given the same total power of the illumination, is dependent on a beam cross-section of the light beam in the sensor region, wherein the longitudinal sensor signal, given the same total power of the illumination, is dependent on the beam cross-section of the light beam in the sensor region, wherein the evaluation device is designed to generate at least one item of information on a longitudinal position of the object by evaluating the longitudinal sensor signal.

Embodiment 55: The detector according to the preceding embodiment, wherein the evaluation device is designed to generate the at least one item of information on the longitudinal position of the object from at least one predefined relationship between the geometry of the illumination and a relative positioning of the object with respect to the detector, preferably taking account of a known power of the illumination and optionally taking account of a modulation frequency with which the illumination is modulated.

Embodiment 56: The detector according to any one of the two preceding embodiments, wherein the sensor signal is a uniform sensor signal for the entire sensor region.

Embodiment 57: The detector according to any one of the three preceding embodiments, wherein the evaluation device is adapted to normalize the longitudinal sensor signal and to generate the information on the longitudinal position of the object independent from an intensity of the light beam.

Embodiment 58: The detector according to the preceding embodiment, wherein the evaluation device is adapted to recognize whether the light beam widens or narrows, by comparing the longitudinal sensor signals of different longitudinal sensors.

Embodiment 59: The detector according to any one of the five preceding embodiments, wherein the evaluation device is adapted to generate the at least one item of information on the longitudinal position of the object by determining a diameter of the light beam from the at least one longitudinal sensor signal.

Embodiment 60: The detector according to the preceding embodiment, wherein the evaluation device is adapted to compare the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

Embodiment 61: The detector according to any one of the preceding embodiments relating to a detector, wherein the sensor signal is a transversal sensor signal, wherein the transversal sensor signal is provided by the electrical contacts contacting the photoconductive material.

Embodiment 62: The detector according to the preceding embodiment, wherein the electrical contacts are configured as at least one split electrode, wherein the bias voltage source is applicable to the at least one split electrode, wherein the evaluation device is further designed to generate at least one item of information on a transversal position of the object by applying the bias voltage source and the at least one split electrode and by evaluating the transversal sensor signal.

Embodiment 63: The detector according to the preceding embodiment, wherein the split electrode comprises at least two partial electrodes.

Embodiment 64: The detector according to the preceding embodiment, wherein at least four partial electrodes are provided, wherein each of the partial electrodes is preferably provided in a form comprising a T shape.

Embodiment 65: The detector according to any one of the two preceding embodiments, wherein electrical currents through the partial electrodes are dependent on a position of the light beam in the sensor region.

Embodiment 66: The detector according to the preceding embodiment, wherein the transversal optical sensor is adapted to generate the transversal sensor signal in accordance with the electrical currents through the partial electrodes, wherein the evaluation device is adapted to generate the information on the transversal position of the object from at least one ratio of the currents through the partial electrodes.

Embodiment 67: The detector according to any one of the preceding embodiments relating to a detector, furthermore comprising at least one illumination source.

Embodiment 68: The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 69: The detector according to the preceding embodiment, wherein the light beam is generated by a reflection of the primary radiation on the object and/or by light emission by the object itself, stimulated by the primary radiation.

Embodiment 70: The detector according to the preceding embodiment, wherein the spectral sensitivity of the optical sensor is covered by the spectral range of the illumination source.

Embodiment 71: The detector according to any one of the preceding embodiments relating to a detector, wherein the detector has at least two optical sensors, wherein the optical sensors are stacked.

Embodiment 72: The detector according to the preceding embodiment, wherein the optical sensors are stacked along the optical axis.

Embodiment 73: The detector according to any of the two preceding embodiments, wherein the optical sensors are arranged such that a light beam from the object illuminates a plurality of the optical sensors, preferably sequentially, wherein at least one sensor signal is generated by each optical sensor.

Embodiment 74: The detector according to any one of the preceding embodiments relating to a detector, wherein the detector further comprises at least one transfer device, the transfer device being adapted to guide the light beam onto the optical sensor.

Embodiment 75: The detector according to the preceding embodiment, wherein the transfer device comprises at least one of an optical lens, a mirror, a beam splitter, an optical filter.

Embodiment 76: The detector according to any one of the preceding embodiments relating to a detector, wherein the detector further comprises at least one imaging device.

Embodiment 77: The detector according to the preceding claim, wherein the imaging device is located in a position furthest away from the object.

Embodiment 78: The detector according to any one of the two preceding embodiments, wherein the imaging device comprises a camera.

Embodiment 79: The detector according to any one of the three preceding embodiments, wherein the imaging device comprises at least one of: an inorganic camera; a monochrome camera; a multichrome camera; a full-color camera; a pixelated inorganic chip; a pixelated organic camera; a CCD chip, preferably a multi-color CCD chip or a full-color CCD chip; a CMOS chip; an IR camera; an RGB camera.

Embodiment 80: An arrangement comprising at least two detectors according to any one of the preceding embodiments relating to a detector.

Embodiment 81: The arrangement according to the preceding embodiment, wherein the arrangement further comprises at least one illumination source.

Embodiment 82: A human-machine interface for exchanging at least one item of information between a user and a machine, in particular for inputting control commands, wherein the human-machine interface comprises at least one detector according to any one of the preceding embodiments relating to a detector, wherein the human-machine interface is designed to generate at least one item of geometrical information of the user by means of the detector wherein the human-machine interface is designed to assign to the geometrical information at least one item of information, in particular at least one control command.

Embodiment 83: The human-machine interface according to the preceding embodiment, wherein the at least one item of geometrical information of the user is selected from the group consisting of: a position of a body of the user; a position of at least one body part of the user; an orientation of a body of the user; an orientation of at least one body part of the user.

Embodiment 84: The human-machine interface according to any of the two preceding embodiments, wherein the human-machine interface further comprises at least one beacon device connectable to the user, wherein the human-machine interface is adapted such that the detector may generate an information on the position of the at least one beacon device.

Embodiment 85: The human-machine interface according to the preceding embodiment, wherein the beacon device comprises at least one illumination source adapted to generate at least one light beam to be transmitted to the detector.

Embodiment 86: An entertainment device for carrying out at least one entertainment function, in particular a game, wherein the entertainment device comprises at least one human-machine interface according to any of the preceding embodiments referring to a human-machine interface, wherein the entertainment device is designed to enable at least one item of information to be input by a player by means of the human-machine interface, wherein the entertainment device is designed to vary the entertainment function in accordance with the information.

Embodiment 87: A tracking system for tracking the position of at least one movable object, the tracking system comprising at least one detector according to any of the preceding embodiments referring to a detector, the tracking system further comprising at least one track controller, wherein the track controller is adapted to track a series of positions of the object, each comprising at least one item of information on a position of the object at a specific point in time.

Embodiment 88: The tracking system according to the preceding embodiment, wherein the tracking system further comprises at least one beacon device connectable to the object, wherein the tracking system is adapted such that the detector may generate an information on the position of the object of the at least one beacon device.

Embodiment 89: A scanning system for determining at least one position of at least one object, the scanning system comprising at least one detector according to any of the preceding embodiments relating to a detector, the scanning system further comprising at least one illumination source adapted to emit at least one light beam configured for an illumination of at least one dot located at least one surface of the at least one object, wherein the scanning system is designed to generate at least one item of information about the distance between the at least one dot and the scanning system by using the at least one detector.

Embodiment 90: The scanning system according to the preceding embodiment, wherein the illumination source comprises at least one artificial illumination source, in particular at least one laser source and/or at least one incandescent lamp and/or at least one semiconductor light source.

Embodiment 91: The scanning system according to any one of the two preceding embodiments, wherein the illumination source emits a plurality of individual light beams, in particular an array of light beams exhibiting a respective pitch, in particular a regular pitch.

Embodiment 92: The scanning system according to any one of the three preceding embodiments, wherein the scanning system comprises at least one housing.

Embodiment 93: The scanning system according to the preceding embodiment, wherein the at least one item of information about the distance between the at least one dot and the scanning system distance is determined between the at least one dot and a specific point on the housing of the scanning system, in particular a front edge or a back edge of the housing.

Embodiment 94: The scanning system according to any one of the two preceding embodiments, wherein the housing comprises at least one of a display, a button, a fastening unit, a leveling unit.

Embodiment 95: A stereoscopic system comprising at least one tracking system according to any one of the embodiments which refer to the tracking system and at least one scanning system according to any one of the embodiments which refer to the scanning system, wherein the tracking system and the scanning system each comprise at least one optical sensor which are placed in a collimated arrangement in such a manner that they are aligned in an orientation parallel to the optical axis of the stereoscopic system and, concurrently, exhibit an individual displacement with respect to the orientation perpendicular to the optical axis of the stereoscopic system.

Embodiment 96: The stereoscopic system according to the preceding embodiment, wherein the tracking system and the scanning system each comprise at least one longitudinal optical sensor, wherein the sensor signals of the longitudinal optical sensors are combined for determining the item of information on the longitudinal position of the object.

Embodiment 97: The stereoscopic system according to the preceding embodiment, wherein the sensor signals of the longitudinal optical sensors are distinguishable with respect to each other by applying a different modulation frequency.

Embodiment 98: The stereoscopic system according to the preceding embodiment, wherein the stereoscopic system further comprises at least one transversal optical sensor, wherein the sensor signals of the transversal optical sensor are used for determining the item of information on the transversal position of the object.

Embodiment 99: The stereoscopic system according to the preceding embodiment, wherein a stereoscopic view of the object is obtained by combining the item of information on the longitudinal position of the object and the item of information on the transversal position of the object.

Embodiment 100: A camera for imaging at least one object, the camera comprising at least one detector according to any one of the preceding embodiments referring to a detector.

Embodiment 101: A method for manufacturing an optical sensor, the method comprising the following steps:
  a) providing a layer of at least one photoconductive material;
  b) thereafter, applying at least one precursor being adapted to react to at least one metal-containing compound, whereby the metal-containing compound is deposited as an amorphous cover layer on the layer of the photoconductive material; and
  c) thereafter, thermally treating the amorphous cover layer;
wherein at least two electrical contacts electrically contacting the layer of the photoconductive material are further provided.

Embodiment 102: The method according to the preceding embodiment, wherein the metal-containing comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 103: The method according to the preceding embodiment, wherein the metal for the metal-containing compound is selected from the group consisting of Al, Ti, Ta, Mn, Mo, Zr, Hf, and W.

Embodiment 104: The method according to any one of the preceding embodiments referring to a method, wherein the at least one metal-containing compound is selected from the group comprising an oxide, a hydroxide, a chalcogenide, a pnictide, a carbide, or a combination thereof.

Embodiment 105: The method according to the preceding embodiment, wherein the at least one metal-containing compound is selected from at least one oxide, at least one hydroxide, or a combination thereof of Al, Ti, Zr or Hf; or from a nitride of Si.

Embodiment 106: The method according to any one of the preceding embodiments referring to a method, wherein step b) is repeated at least once.

Embodiment 107: The method according to the preceding embodiment, wherein at least two adjacent layers are deposited as a laminate, wherein the adjacent layers are selected to differ with respect to their respective composition, wherein at least one of the adjacent layers comprises the at least one metal-containing compound.

Embodiment 108: The method according to the preceding embodiment, wherein at least one of the adjacent layers is selected to comprise at least one of a metallic compound, a polymeric compound, a silicone compound, a glass compound.

Embodiment 109: The method according to any one of the preceding embodiments referring to a method, wherein the cover layer is deposited on the photoconductive material until it accomplishes a thickness of 10 nm to 600 nm, preferably of 20 nm to 200 nm, more preferred of 40 nm to 100 nm, most preferred of 50 to 75 nm.

Embodiment 110: The method according to any one of the preceding embodiments referring to a method, wherein the cover layer is deposited on the photoconductive material in a manner that it is a conformal layer with respect to an adjacent surface of the photoconductive material.

Embodiment 111: The method according to the preceding embodiment, wherein the thickness of the conformal layer follows a corresponding surface of the photoconductive material within a deviation of ±50 nm, preferably of ±20 nm, mostly preferred of ±10 nm, over at least 90%, preferably at least 95%, most preferred at least 99%, of a surface of the cover layer.

Embodiment 112: The method according to any one of the preceding embodiments referring to a method, wherein at least one deposition method is used for depositing the metal-containing compound on the photoconductive material, wherein the at least one deposition method is, preferably, selected from an atomic layer deposition process, a chemical vapor deposition process, a sputtering process, or a combination thereof, preferably the atomic layer deposition process and the combination of the atomic layer deposition process and the sputtering process.

Embodiment 113: The method according to any one of the preceding embodiments referring to a method, wherein two different types of precursors are employed, wherein a first precursor is or comprises a metal-organic precursor, and wherein a second precursor is or comprises a fluid.

Embodiment 114: The method according to the preceding embodiment, wherein the metal-containing compound comprises Al, wherein the first precursor is or comprises TMA, and wherein the second precursor is or comprises $H_2O$, a solution thereof, or ozone.

Embodiment 115: The method according to the preceding embodiment, wherein the metal-containing compound comprises Zr, wherein the first precursor is or comprises TDMA-Zr, and wherein the second precursor is or comprises $H_2O$, a solution thereof, or ozone.

Embodiment 116: The method according to any one of the two preceding embodiments, wherein at least one of the precursors is mixed with an inert gas, in particular $N_2$ or Ar.

Embodiment 117: The method according to any one of the preceding embodiments referring to a method, wherein at least one additional layer is deposited on the cover layer or a partition thereof and/or wherein the at least one additional layer is at least partially deposited on the layer of the photoconductive material and, subsequently, covered by the cover layer.

Embodiment 118: The method according to the preceding embodiment, wherein the additional layer is selected to be or comprise at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 119: The method according to any one of the preceding embodiments referring to a method, wherein thermally treating according to step c) comprises applying a temperature from 20° C. to 300° C., preferably from 50° C. to 200° C.

Embodiment 120: The method according to any one of the preceding embodiments referring to a method, wherein at least one of step b) and step c) is performed in a vacuum chamber.

Embodiment 121: The method according to the preceding embodiment, wherein both step b) and step c) are performed in the same vacuum chamber.

Embodiment 122: The method according to the preceding embodiment, wherein the electrical contacts are provided before step b), wherein the cover layer is further partially deposited on the electrical contacts.

Embodiment 123: The method according to the preceding embodiment, wherein the electrical contacts are bonded to at least one external connection by using electrically conductive leads, preferably in form of wires, in particular Au, Al, or Cu wires.

Embodiment 124: The method according to the preceding embodiment, wherein the electrically conductive leads are bonded to the electrical contacts through the cover layer.

Embodiment 125: The use of a detector according to any one of the preceding claims referring to a detector, for a purpose of use, selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a distance measurement, in particular in traffic technology; a position measurement, in particular in traffic technology; an entertainment application; a security application; a human-machine interface application; a tracking application; a scanning application; in stereoscopic vision; a photography application; an imaging application or camera application; a mapping application for generating maps of at least one space; a homing or tracking beacon detector for vehicles; a distance and/or position measurement of objects with a thermal signature; a machine vision application; a robotic application; a logistics application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 1:
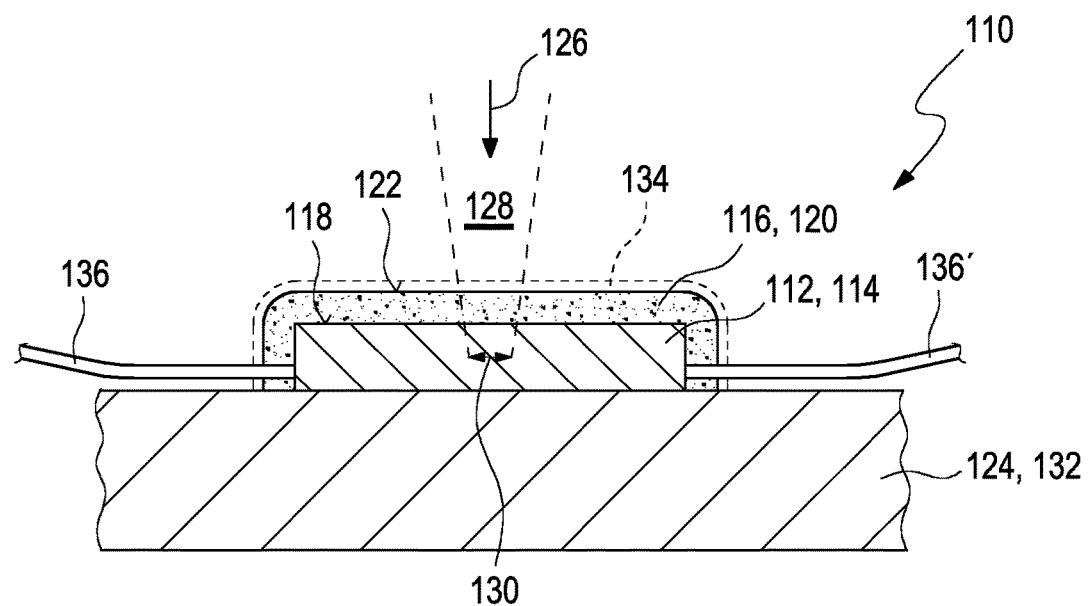
FIGS. 1A to 1G show a number of preferred exemplary embodiments of an optical sensor according to the present invention.
Figure 1:
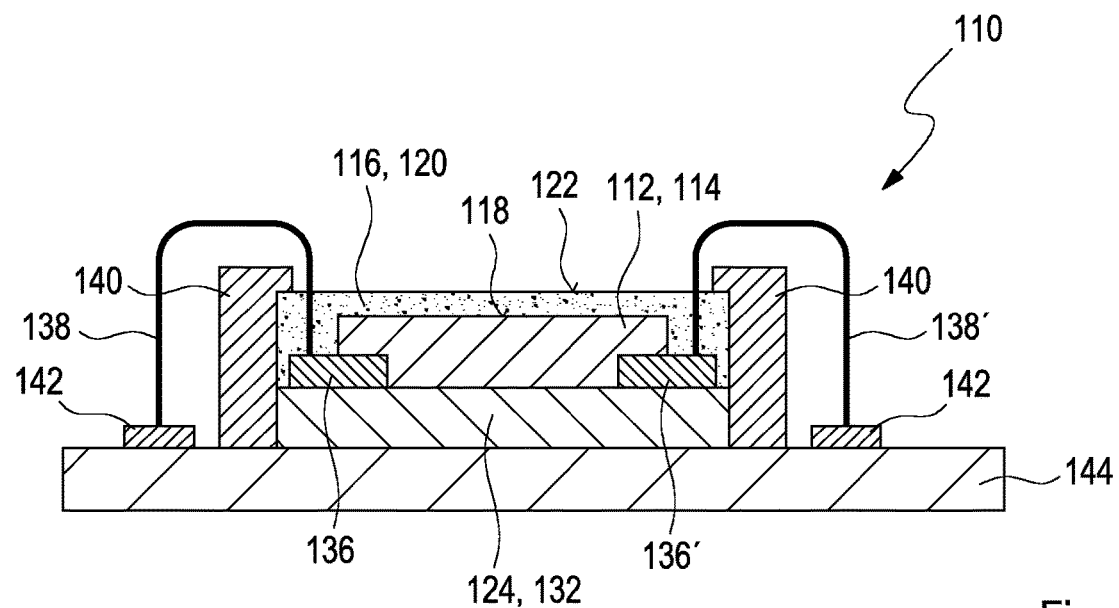
Figure 1:
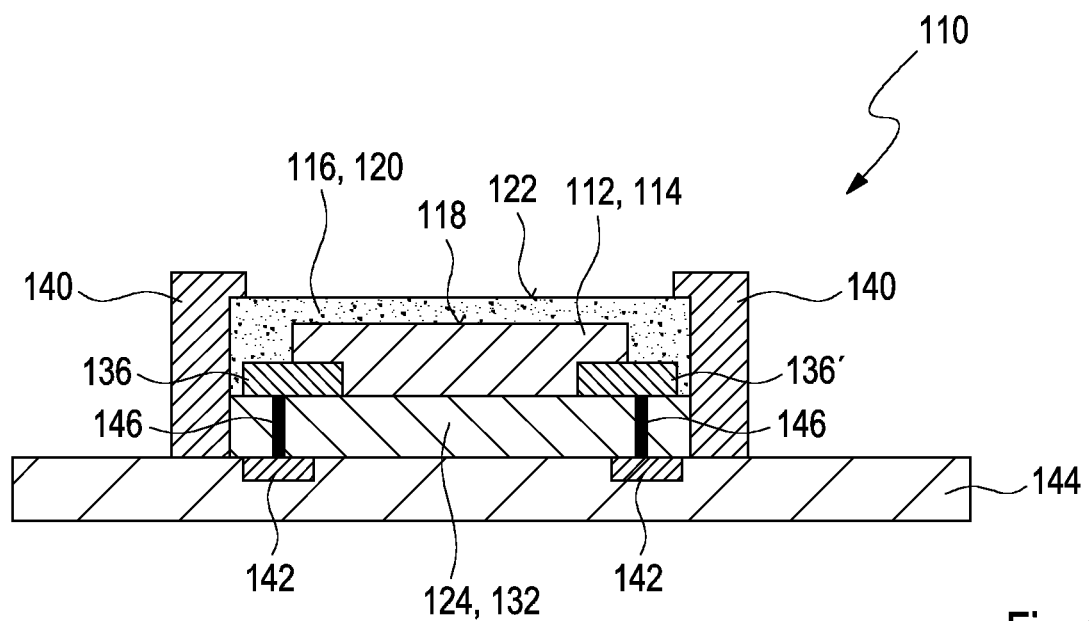
Figure 1:
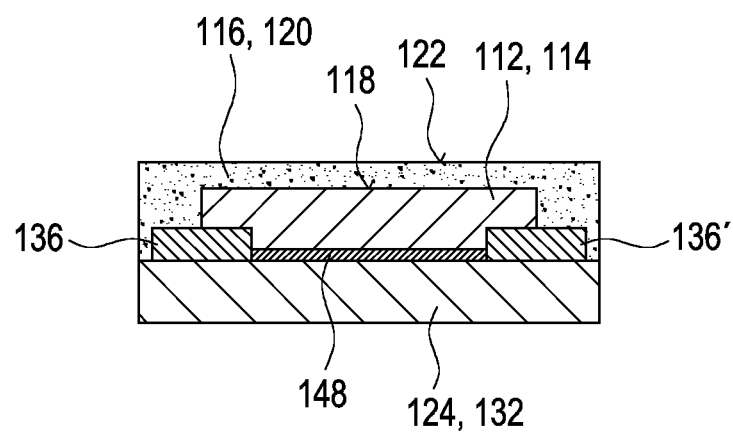
Figure 1:
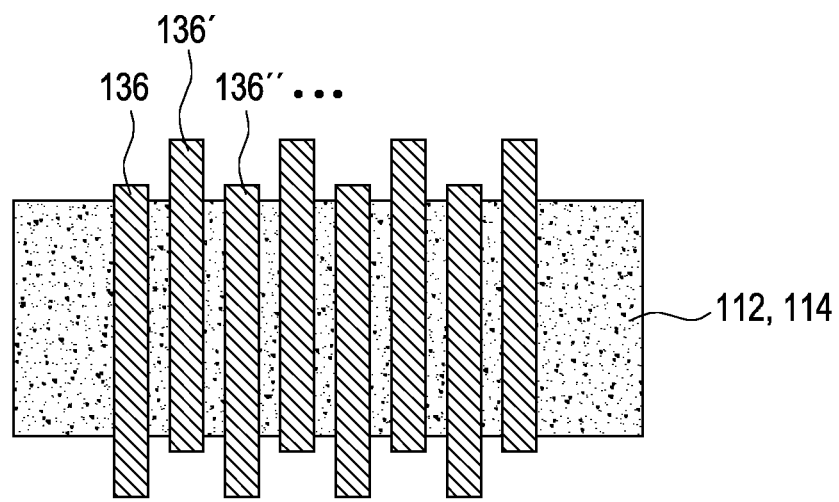
Figure 1:
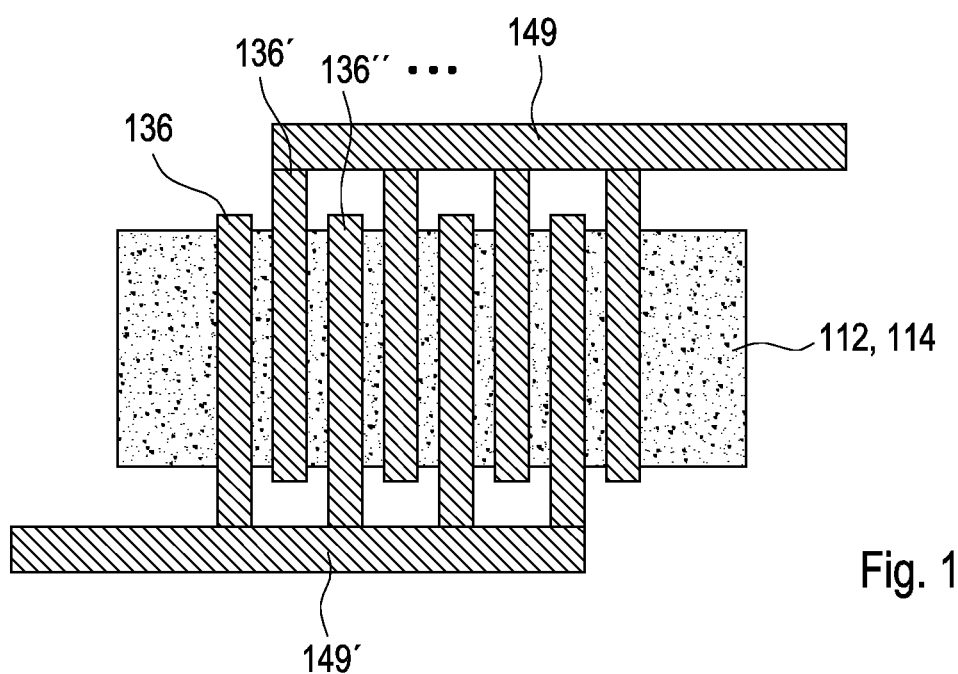
Figure 1:
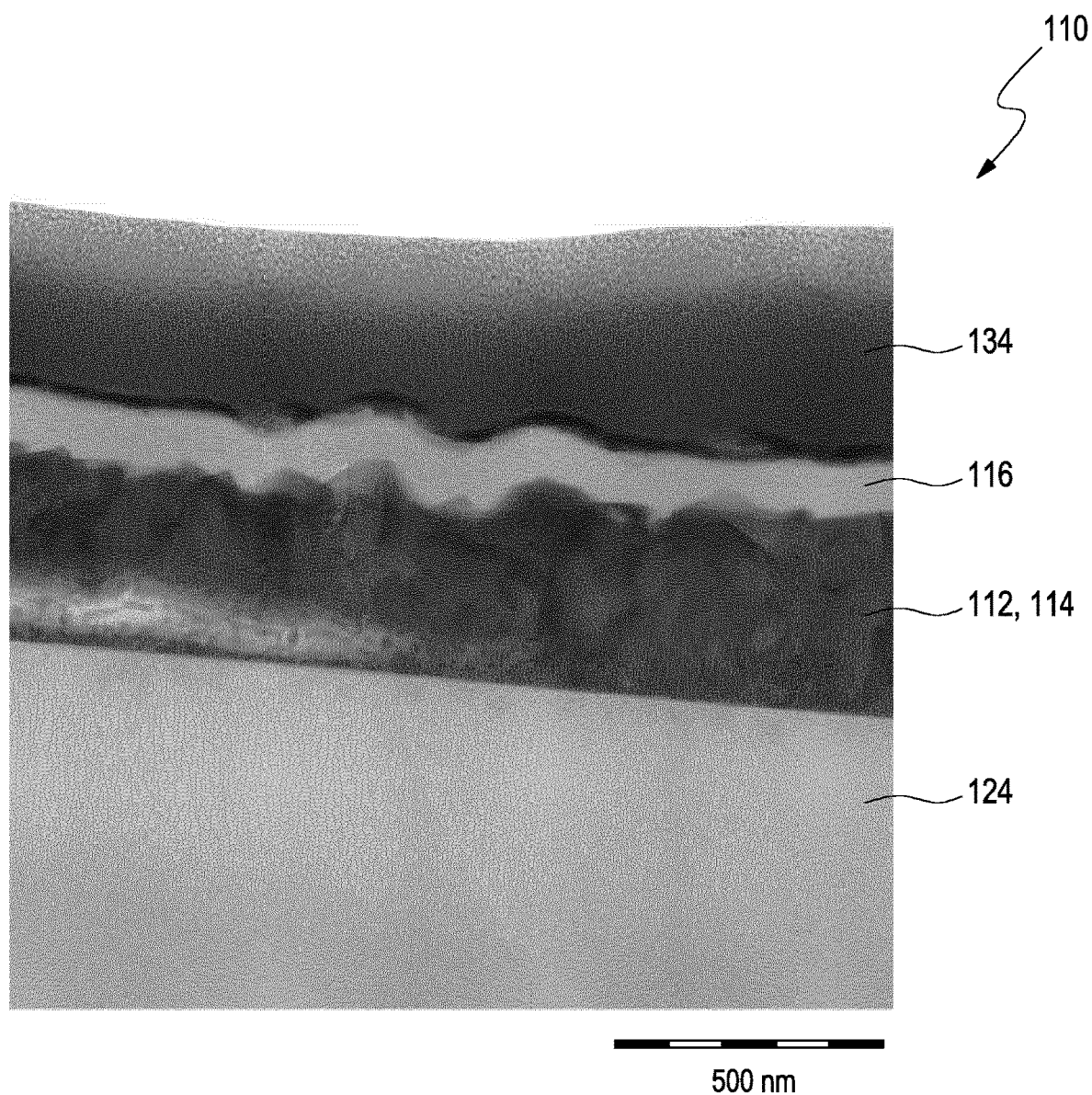

FIGS. 1A to 1F each illustrate, in a highly schematic fashion, an exemplary embodiment of an optical sensor 110 according to the present invention. Herein, FIGS. 1A to 1D present a side view of the optical sensor 110 while FIGS. 1E and 1F provide a top view only of a partition of the optical sensor 110. Further, FIG. 1G shows a transmission electron microscopy (TEM) image of the side view of a sample of the optical sensor 110 which has been prepared pursuant to the present invention.

Accordingly, the optical sensor 110 comprises a layer 112 of at least one photoconductive material 114. In particular, the layer 112 of the photoconductive material 114 may exhibit a thickness of 10 nm to 100 µm, preferably from 100 nm to 10 µm, in particular from 300 nm to 5 µm. In a preferred embodiment, the layer 112 of the photoconductive material 114 may comprise an essentially flat surface, wherein, however, other embodiments which may exhibit variations of the surface of the layer 112, such as gradients or steps, may also be feasible. Herein, the layer 112 of the photoconductive material 114 may, preferably, be manufactured as described below with respect to FIG. 3. However, other manufacturing methods may also be feasible.

In the exemplary embodiments of FIGS. 1A to 1F, the photoconductive material 114 may be or comprise at least one chalcogenide which can, preferably, be selected from a group comprising sulfide chalcogenides, selenide chalcogenides, telluride chalcogenides, and ternary chalcogenides. In particular, the photoconductive material 114 may be or comprise a sulfide, preferably lead sulfide (PbS), a selenide, preferably lead selenide (PbSe), a telluride, preferably, cadmium telluride (CdTe), or a ternary chalcogenide, preferably mercury zinc telluride (HgZnTe; MZT). Since many of the preferred photoconductive materials 114 are, generally, known to exhibit a distinctive absorption characteristic within the infrared spectral range, the optical sensor 110 may, preferably, be used as an infrared sensor. However, other embodiments and/or other photoconductive materials, in particular, the photoconductive materials as described elsewhere in this document for the present purpose, may also be feasible.

Further, the optical sensor 110 according to the present invention comprises a cover layer 116, wherein the cover layer 116 is deposited on the layer 112 of the photoconductive material 114. Herein, the cover layer 116 can, especially preferably, be deposited on the layer 112 in a manner that it may directly or indirectly contact the layer 112 of the photoconductive material 114. In a preferred embodiment, the cover layer 116 fully may be deposited on the layer 112 in a fashion that it may fully cover an accessible surface 118 of the photoconductive material 114. As already described above, the cover layer 116 may, thus, in a first regard, be adapted for providing an encapsulation for the photoconductive material 114, in particular, as an hermetic package, in order to avoid a degradation of the optical sensor 110 or a partition thereof, in particular of the photoconductive material 114, by external influence, such as humidity and/or oxygen. As further described above, it has, surprisingly, been found that, the cover layer 116 may, in a second regard, exhibit an additional function as a result of its deposition on the layer 112 of the photoconductive material 114 and a subsequent thermal treating of both the cover layer 116 and the layer 112 of the photoconductive material 114. As a result, the cover layer 116 may, thus, be adapted to activate the photoconductive material 114 in a sense that the photoconductive properties of the photoconductive material 114 may considerably be improved.

As mentioned above, the cover layer 116 comprises at least one metal-containing compound 120. In a particularly preferred embodiment as described here, the metal-containing compound 120 may comprise a metal selected from the group consisting of Al, Zr, Hf, Ti, Ta, Mn, Mo, and W, wherein the metals Al, Ti, Zr, and Hf are especially preferred, in particular for achieving the activation of the photoconductive properties of the photoconductive material 114. However, other kinds of metals, in particular the metals as indicated elsewhere for this purpose in this document, may also be feasible. Further, the metal-containing compound 120 may be selected from a group comprising an oxide, a hydroxide, a chalcogenide, a pnictide, a carbide, or a combination thereof.

In this particular embodiment, the metal-containing compound 120 may, preferably, comprise at least one oxide of Al, at least one hydroxide of Al, or a combination thereof, which may also be expressed by the formula $AlO_x(OH)_y$, with $0 \leq x \leq 1.5$ and $0 \leq y \leq 1.5$, wherein $x+y=1.5$. Alternatively, the metal-containing compound 120 may comprise at least one oxide of Zr, at least one hydroxide of Zr, or a combination thereof, which may also be expressed by the formula $ZrO_x(OH)_y$ with $0 \leq x \leq 2$ and $0 \leq y \leq 2$, wherein $x+y=2$. However, other kinds of metal-containing compounds 120, in particular of Hf, may also be feasible. In all cases, rests of unreacted organic ligands could, additionally, be present.

In a further alternative embodiment (not depicted here), the cover layer 116 may be or comprise a laminate which may have at least two adjacent layers, wherein the adjacent layers may, in particular, differ by their respective composition in a manner that one, both, some, or all of the adjacent layers may comprise one of the metal-containing compounds 120. Herein, the adjacent layers may comprise two different metal-containing compounds 120 as described above in more detail. By way of example, the cover layer 116 may comprise a number of alternating adjacent layers of an Al-containing compound and of a Zr-containing compound. However other combinations of metal-containing compounds 120 apart from Al and Zr may also be possible. In addition, the laminate may further comprise additional adjacent layers which may not consist of any one of the mentioned metal-containing compounds 120 but may rather be or comprise at least one of a metallic compound, a polymeric compound, a silicone compound, or a glass compound. Other kinds of materials may also be feasible.

In this particular embodiment, the cover layer 116 may exhibit a thickness of 10 nm to 600 nm, preferably of 20 nm to 200 nm, more preferred of 40 nm to 100 nm, most preferred of 50 to 75 nm. This range of thickness may, in particular, reflect the amount of metal-containing compounds 120 within the cover layer 116 that may advantageous to achieve the above-mentioned functions of providing encapsulation for the photoconductive material 114 and, concurrently, of activating the photoconductive properties of the photoconductive material 114.

Further in this particular embodiment, the cover layer 116 may be a conformal layer with respect to the adjacent surface 118 of the photoconductive material 114. As defined above, the thickness of the conformal layer may, thus, follow the corresponding surface 118 of the photoconductive material 114 within a deviation of ±50 nm, preferably of ±20 nm, mostly preferred of ±10 nm, wherein the deviation may occur over at least for at least 90%, preferably for at least 95%, mostly preferred for at least 99%, of a surface 122 of the cover layer 116, hereby leaving aside any contamination or imperfection that may be present on the surface 122 of the cover layer 116.

As further illustrated in each of FIGS. 1A to 1C, the at least one layer of the photoconductive material 114 may, preferably, be directly applied to at least one substrate 124, wherein the substrate 124 may, preferentially, be or comprise an insulating substrate. In order to allow an incident light beam 126 to reach the photoconductive material 114 in order to optically modify an electrical conductivity within the layer 112 of the photoconductive material 114, at least one of the cover layer 116 and the substrate 124 may, in particular, be optically transparent within a desired wavelength range, such as in the infrared spectral range or a partition thereof.

As schematically depicted in FIG. 1A, a beam path 128 of the incident light beam 126 may be configured to pass through the cover layer 116 in order to generate a light spot having a diameter 130 within the layer 112 of the photoconductive material 114. As a result, it may, particularly, be advantageous to select the metal-containing compound 120 for the cover layer 116 to be, preferably, optically transparent within the desired wavelength range, in particular, by exhibiting a suitable absorption characteristic. Alternatively (not depicted here), it may, however, be preferred to select the metal-containing compound 120 for the cover layer 116 not to be optically transparent within the desired wavelength range. Such a kind of selection may, in particular, be advantageous in a case in which a specific metal-containing compound 120 may exhibit particularly preferred properties for the optical sensor 110 apart from offering optical transparency within the desired wavelength range. In addition, it may be preferred that one or both the metal-containing compound 120 used for the cover layer 116 and the material applied for the substrate 124 may exhibit optically transparent properties within the desired wavelength range, such as for allowing a sensing of the light beam 126 from both directions of the optical sensor 110. Herein, the substrate 124 may comprise an optically transparent material 132, in particular a glass. However, other materials that may be at least partially optically transparent in the infrared spectral range may also be feasible.

Further, the cover layer 116 may be adapted to exhibit a further function in addition to the above-mentioned functions of providing encapsulation for the photoconductive material 114 and, concurrently, of activating the photoconductive properties of the photoconductive material 114. In this regard, the metal-containing compound 120 as used for the cover layer 116 may, especially, be selected to be able to, concurrently, exert the desired further function. In particular, the metal-containing compound 120 used for the cover layer 116 may exhibit a high refractive index, such as above 1.2 or above 1.5, in order to qualify as a suitable anti-reflective layer. As already indicated above, the cover layer 116 may, advantageously, be provided in form of a smooth layer which may tightly follow the surface of the photoconductive material 114. Further embodiments for a functional layer may include but are not limited to a scratch-resistant layer, a hydrophilic layer, a hydrophobic layer, a self-cleaning layer, an anti-fog layer, a high-permittivity layer, and a conductive layer.

In a particular embodiment, particularly in a case in which it might not be feasible to provide the cover layer 116 with the desired further function or in which an extent of the desired further function as provided by the selected cover layer 116 may not be sufficient, the cover layer 116 may, additionally, at least partially covered by at least one additional layer 134 that may be deposited at least partially on the cover layer 116. As an alternative or in addition, the at least one additional layer 134 may at least partially be deposited between the layer 112 of the photoconductive material 114 and the cover layer 116. Preferably, the additional layer 134 may be or exhibit the further desired function and may, thus, comprise at least one of an anti-reflective layer, an optical filter layer, a scratch-resistant layer, a hydrophilic layer, a hydrophobic layer, a self-cleaning layer, an anti-fog layer, a high-permittivity layer, or a conductive layer. Herein, the person skilled in the art may be easily capable of selecting and providing the at least one additional layer 134. In this regard, at least one of the further function, the composition, and the structure of the additional layer 134 may be similarly or differently selected for the embodiments of the optical sensor 110 as illustrated in FIGS. 1A and 1B. While in the embodiment as depicted in FIG. 1A, it may be advantageous to apply an anti-reflective layer or an optical filter layer as the additional layer 134, in the embodiment as depicted in FIG. 1B, it may be rather be preferred to apply a hydrophilic layer, a hydrophobic layer, a self-cleaning layer, a high-permittivity layer, or a conductive layer as the additional layer 134. However, other embodiments may also be possible.

As further illustrated in FIGS. 1A to 1D, the optical sensor 110 according to the present invention comprises at least two individual electrical contacts 136, 136', i.e. at least one first electrical contact 136 and at least one second electrical contact 136', wherein the electrical contacts 136, 136' are adapted to contact the layer 112 of the photoconductive material 114. For this purpose, the electrical contacts 136, 136' may be configured and arranged in a manner in order to be able to guide an electrical current via the first electrical contact 136 through the layer 112 of the photoconductive material 114 to the second electrical contact 136' or vice-versa, or to apply a voltage across the layer 112 of the photoconductive material 114 by using the first electrical contact 136 and the second electrical contact 136'. For both purposes, the first electrical contact 136 is isolated from the second electrical contact 136' while both the first electrical contact 136 and the second electrical contact 136' are in direct connection with the layer 112 of the photoconductive material 114.

Herein, the direct connection between any one of the electrical contacts 136, 136' and the layer 112 of the photoconductive material 114 may be provided by any known process capable of providing electrical contacts, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances at the contact zones. In order to allow a sufficient electrical conductivity through the electrical contacts 136, 136' while, concurrently, providing an sufficient mechanical stability of the electrical contacts 136, 136', the electrical contacts 136, 136' may, preferably, comprise at least one electrode material selected from the group consisting of the metals Ag, Cu, Pt, Al, Mo or Au, an alloy comprising at least one of the mentioned metals, as well as graphene. However, other kinds of electrode materials may also be feasible.

As further illustrated in each of FIGS. 1A to 1D, the cover layer 116 may at least partially cover the electrical contacts 136, 136', which may, especially, be configured to be bondable, such as to one or more leads 138, 138' that may lead to an external circuit, such as depicted in FIG. 1, around a package 140 to one or more contact pads 142 which may be in contact with a circuit carrier device, such as a printed circuit board (PCB) 144. For this purpose, wires, such as gold wires, beryllium-doped gold wires, aluminum wires, platinum wires, palladium wires, silver wires, or copper wires, may be used as leads the 138, 138' for bonding the electrical contacts 136, 136', such as to the contact pads 142 on the printed circuit board 144. In a particularly preferred embodiment as illustrated in FIG. 1B, the electrical contacts 136, 136' may be bondable through the cover layer 116. This feature may, in particular, allow improving the encapsulation function of the cover layer 116 and, concurrently, providing stability to the electrical contacts 136, 136'. In an alternative embodiment as depicted in FIG. 1C, the electrical contacts 136, 136' may directly be bondable to the contact pads 142 of the printed circuit board 144, in particular, by using electrically conducting through vias 146 connecting the electrical contacts 136, 136' with the contact pads 142.

According to a further preferred embodiment schematically depicted in FIG. 1D, the at least one layer of the photoconductive material 114 may, alternatively, be indirectly applied to at least one substrate 124, wherein the substrate 124 may, preferentially, be or comprise an electrically conducting substrate 124, such as a semiconducting silicon chip. In order to, nevertheless, provide an electrical insulation of the electrically conducting substrate 124 to the layer 112 of the photoconductive material 114, at least one interlayer 148 may, in particular, be arranged between the electrically conducting substrate 124 and the layer 112 of the photoconductive material 114.

As indicated in FIG. 1A to 1D, the electrical contacts 136, 136' may, preferably, be provided in form of a single layer. In contrast hereto, the electrical contacts 136, 136', 136", . . . may, as schematically illustrated as top view in FIGS. 1E and 1F, alternatively also be provided in form of an array being constituted by the electrical contacts 136, 136', 136", . . . . As shown in FIG. 1E, the array of the electrical contacts 136, 136', 136", . . . may, thus, be placed in a parallel arrangement of fingers each comprising an electrically conducting material, wherein each of the fingers may individually contact the layer 112 of the photoconductive material 114 and provide a connection to an external circuit, such as by using electrically conducting leads (not depicted here). As depicted in FIG. 1F, the electrical contacts 136, 136', 136", . . . may, alternatively, also be provided in form of two interdigitating comb structures 149, 149'. In addition, further arrangements of the electrical contacts 136, 136', 136", . . . which are nor depicted here, may also be feasible in connection with the present invention.

As indicated above, FIG. 1G shows a TEM image of the side view of the optical sensor 110 which has been prepared according to the present invention. As can be seen from the TEM image of FIG. 1G, the $Al_2O_3$ cover layer 116 coats the layer 112 of the PbS photoconductive material 114 in a conformal manner. As can be further derived from FIG. 1G, the cover layer 116 is here, covered by the additional layer 134 comprising Pt, wherein the additional Pt layer 134 is used here as a protective layer in the preparation of the TEM sample.

As already indicated above, the photoconductive properties of the photoconductive material PbS as used by G. H. Blount et al., see above, appear to be marginally influenced by providing an encapsulation layer on the PbS layer. As described by G. H. Blount et al., see above, a specific responsivity $S_1$ of the optical detector comprising a PbS layer changes from $1.4 \cdot 10^2$ cm$^2$/W without the encapsulation layer to $2.3 \cdot 10^2$ cm$^2$/W after applying the crystalline Al$_2$O$_3$ layer, thus, resulting in a slight improvement of the photoconductive PbS layer by less than a factor of 2. However, with respect to the present invention, Table 1 shows that the responsivity S measured in mV across the layer 112 of the PbS photoconductive material 114 depends on the presence of the Al$_2$O$_3$ cover layer 116 which has been provided in accordance with the present invention. Herein, the responsivity S is related to the specific responsivity $S_1$ being the responsivity S normalized to a size of the investigated device in a linear manner. The related measurements have been performed using a 19 V bias at 850 nm applying the same light intensities. In clear contrast to the findings of Blount et al., see above, Table 1 demonstrates that the combination of the two described functions of the cover layer 116, i.e. the encapsulation and the activation by thermal treatment, are particularly designed in order to considerably improve the quality of the photoconductive PbS layer as follows:

TABLE 1

|  | S (mV) |
|---|---|
| PbS without encapsulation | 0.1 |
| PbS without encapsulation and without thermal treatment | 0.8 |
| PbS with encapsulation | 3 |
| PbS with encapsulation and with thermal treatment | 30 |

Thus, while the photoconductive PbS layer initially exhibits a value of S≈0.1 mV, this value can be enhanced considerably to S≈30 mV, however, only after applying both encapsulation and thermal treatment to the photoconductive PbS layer. As a result, the improvement of the photoconductivity of the PbS layer which can be observed here amounts to a factor above 100, i.e. to a factor of 300. Consequently, the cover layer 116 according to the present invention does not only provide a protective encapsulation for the photoconductive material 114 but inherently contributes to the activation of the photoconductive properties of the photoconductive material 114 after thermal treatment.

Similar results could be obtained for the responsivity S measured in mV across the layer 112 of the photoconductive material 114 comprising PbSe. For this purpose, the PbSe has been deposited via chemical bath deposition (CBD) on a glass substrate 124. Electrical contacts 136, 136' could be applied before or after deposition. After CBD of PbSe, a first heat treatment for an activation of the PbSe layer has been applied. During the first heat treatment a temperature between 250 and 400° C. was applied for 10 min to 72 hours. A second heat treatment step could follow at a lower temperature compared to the first heat treatment. Hereinafter, the cover layer 116 comprising Al$_2$O$_3$ layer has been applied via ALD in the same way as with PbS as the cover layer 116, i.e. at a temperature of approx. 60° C. having a thickness of 70 nm to 100 nm. However, other thicknesses are also possible. As a result, the encapsulation process is capable of improving the optical performance of the sensor, in particular, by increasing the responsivity S in mV as follows:

TABLE 2

|  | S (mV) |
|---|---|
| PbSe without encapsulation and without thermal treatment | 0.05 |
| PbSe with thermal treatment but without encapsulation | 0.6 |
| PbSe with encapsulation and with thermal treatment | 2 |

The related measurements have been performed at a wavelength of 4 µm with a modulation frequency of 606 Hz using the same light intensities. Again, in clear contrast to the findings of Blount et al., see above, Table 2 demonstrates that the combination of the two described functions of the cover layer 116, i.e. the encapsulation and the activation by thermal treatment, are particularly designed in order to considerably improve the quality of the photoconductive PbSe layer, in particular, a factor of approx. 40.

FIGS. 2A to 2D present various X-ray diffraction (XRD) diagrams, wherein the XRD diagram of FIG. 2A originate from an Al$_2$O$_3$ covered PbS sensor as described with respect to FIG. 1A. As used herein, the XRD diagram comprises an assembly of x-ray data assembled in counts N versus 2Θ. As can easily be derived from the XRD diagram of FIG. 2A, no crystalline Al$_2$O$_3$ reflexes are detectable. Thus, the Al$_2$O$_3$ cover layer 116 comprises the metal-containing compound Al$_2$O$_3$ in an amorphous state. The only crystalline reflexes which can still be seen in FIG. 2A are attributable to Au comprised in the electrical contacts 136, 136' having gold wires and the flat bondable Au and to the photoconductive PbS material 114.

Figure 2:
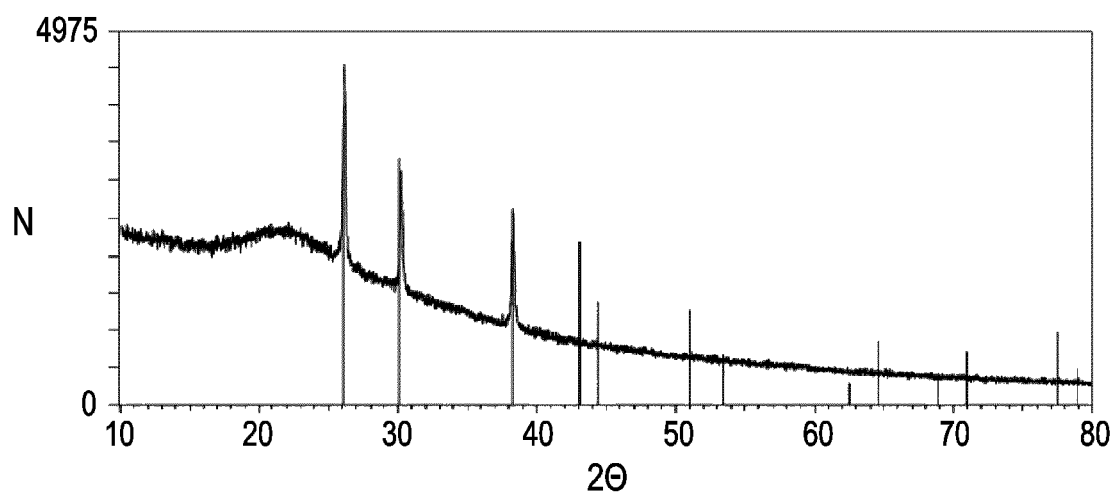
FIGS. 2A to 2D show X-ray diffraction (XRD) diagrams of various samples according to the present invention.
Figure 2:
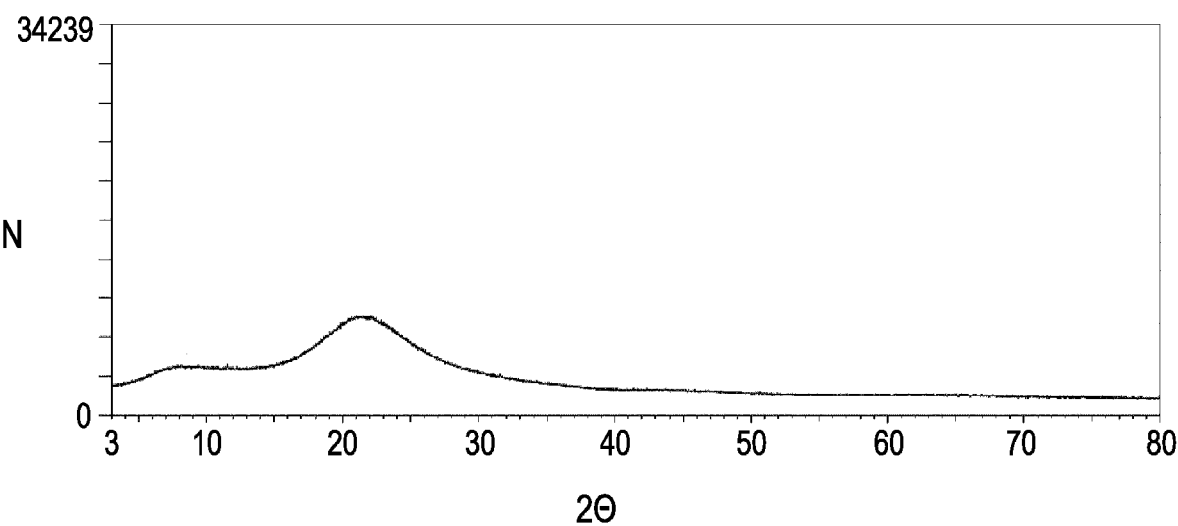
Figure 2:
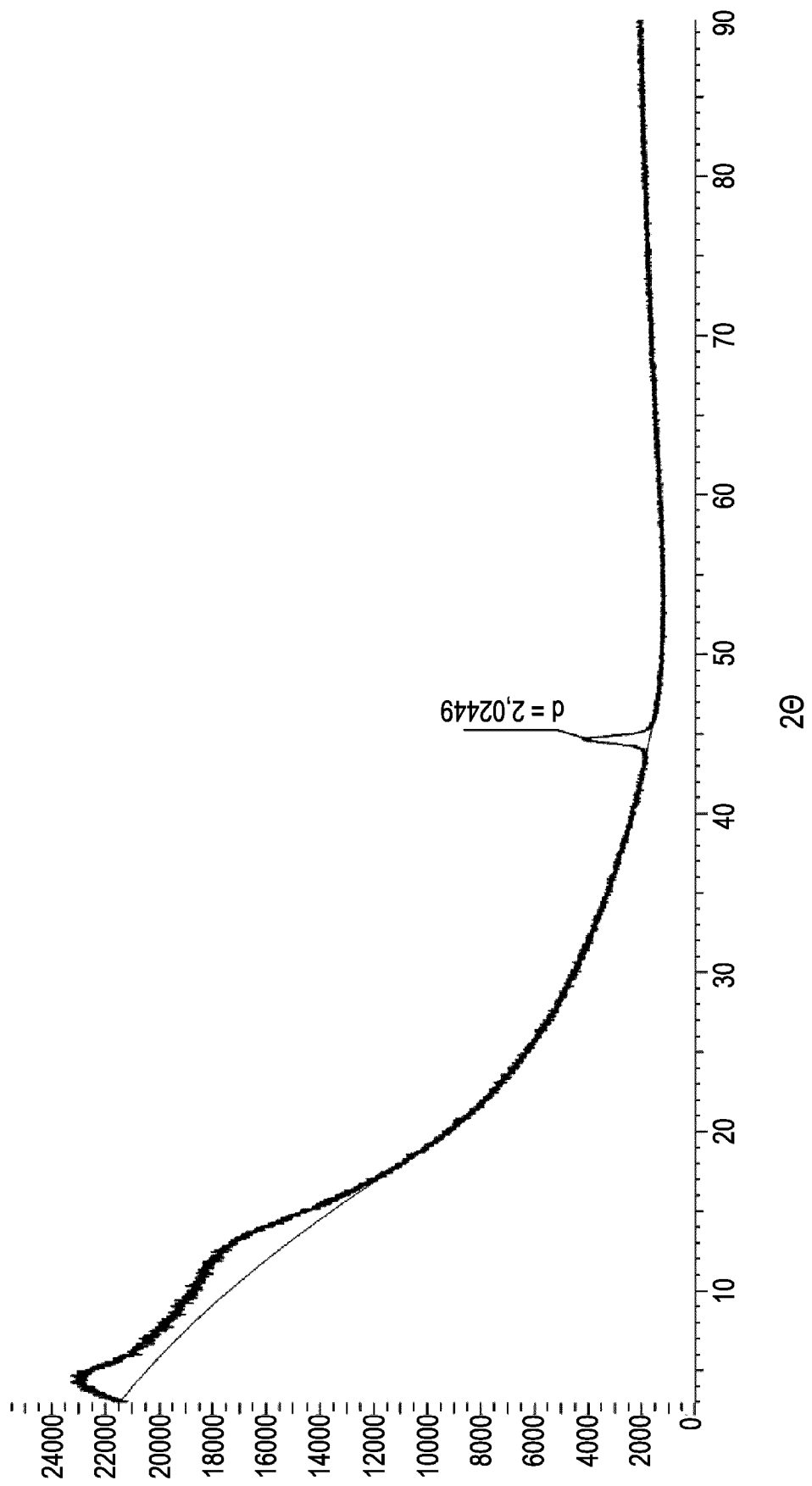

Further, in order to prove the amorphous nature of the cover layer 116, only a single layer of Al$_2$O$_3$ has been deposited in a same fashion as in the case of FIG. 2A on a glass substrate in an experiment corresponding to FIG. 2B. Thus, the corresponding XRD diagram of FIG. 2B only shows two broad elevations which are attributable to the amorphous glass. No peaks that may be assignable to crystalline or nanocrystalline Al$_2$O$_3$ can be observed here. As a result, FIG. 2 clearly demonstrates that the present invention is capable of providing a layer that is appropriate as the amorphous cover layer 116 comprising the metal-containing compound Al$_2$O$_3$.

Figure 2D:
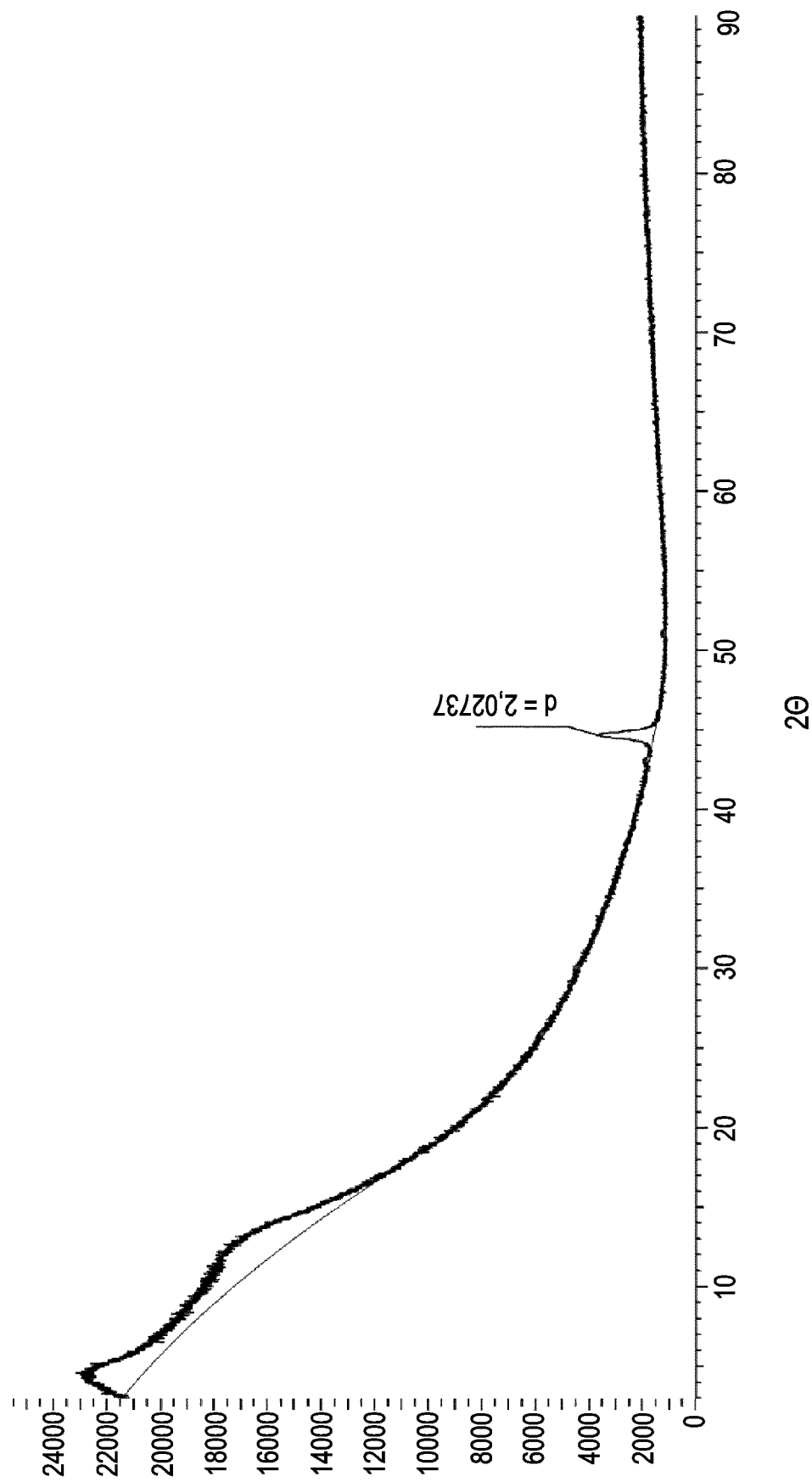

Further, FIGS. 2C and 2D show corresponding gracing incident XRD (incident angle 0.5°) diagrams of two different samples, wherein the sample of FIG. 2C comprises only a 75 nm thick Al$_2$O$_3$ cover layer directly deposited on a borosilicate glass substrate while the sample of FIG. 2D comprises a 75 nm thick Al$_2$O$_3$ cover layer deposited on a PbS photoconductive layer which is also located on a borosilicate glass substrate. For the purposes of the present invention, both samples have been tempered at 100° C. for 10 days. As a result, both samples Al$_2$O$_3$ exhibit an x-ray amorphous behavior whereas PbS could be detected (FIG. 2D). The origin of the diffraction line at 2Θ=45° as indicated by the letter "d" in both FIGS. 2C and 2D remains open.

Figure 3:
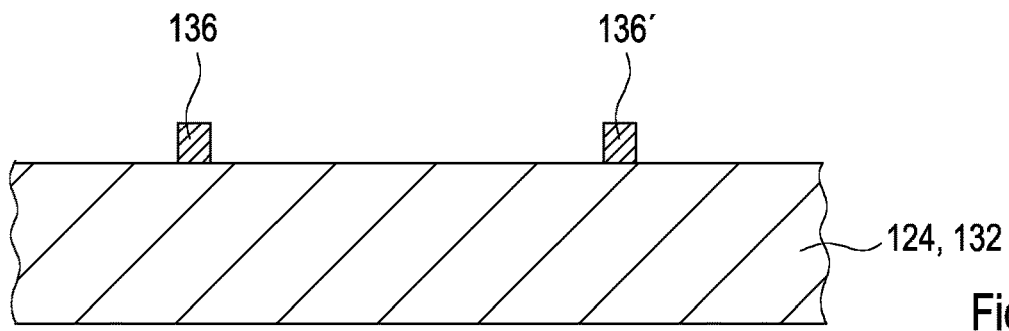
FIG. 3A to 3E shows an exemplary embodiment of a method for manufacturing an optical sensor according to the present invention.
Figure 3:
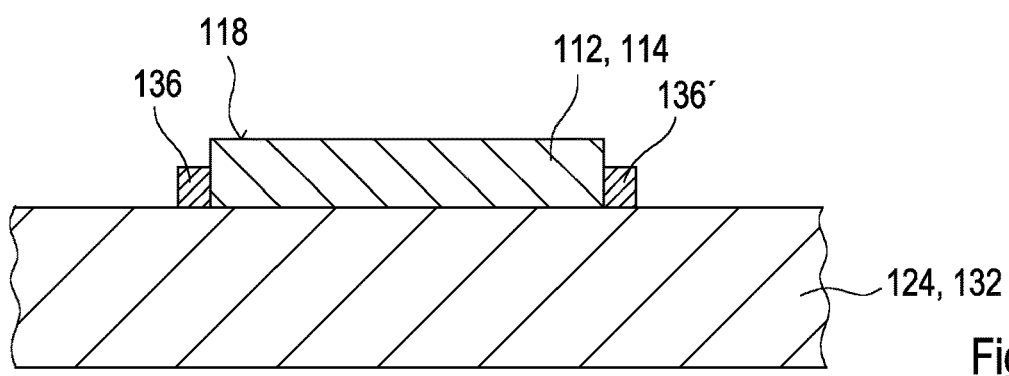
Figure 3:
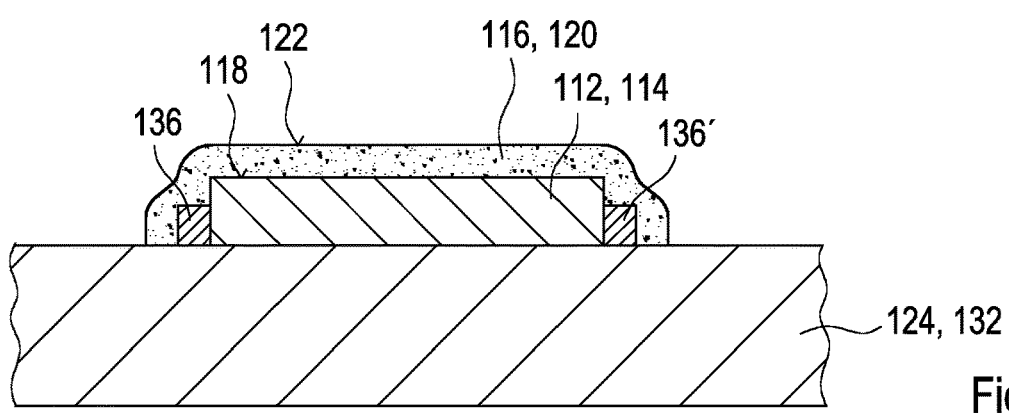
Figure 3:
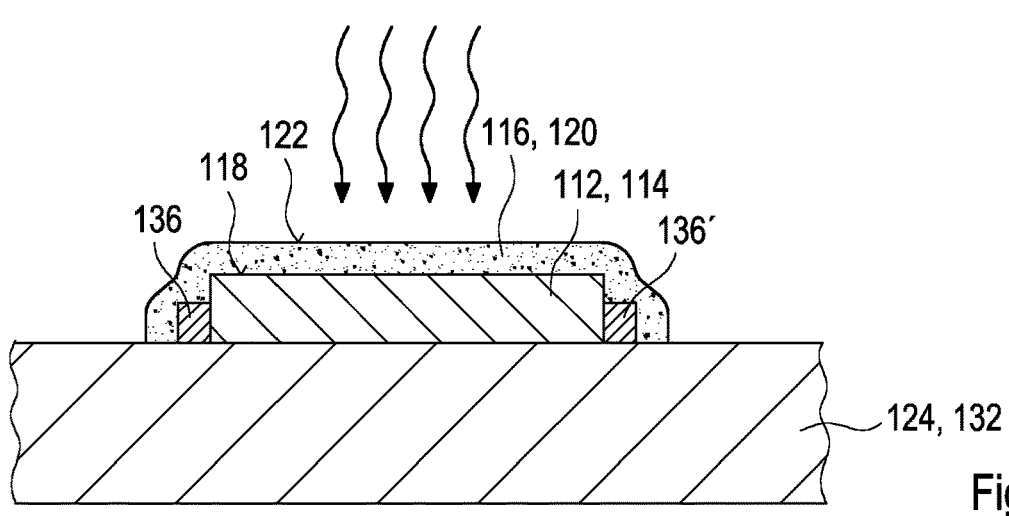
Figure 3:
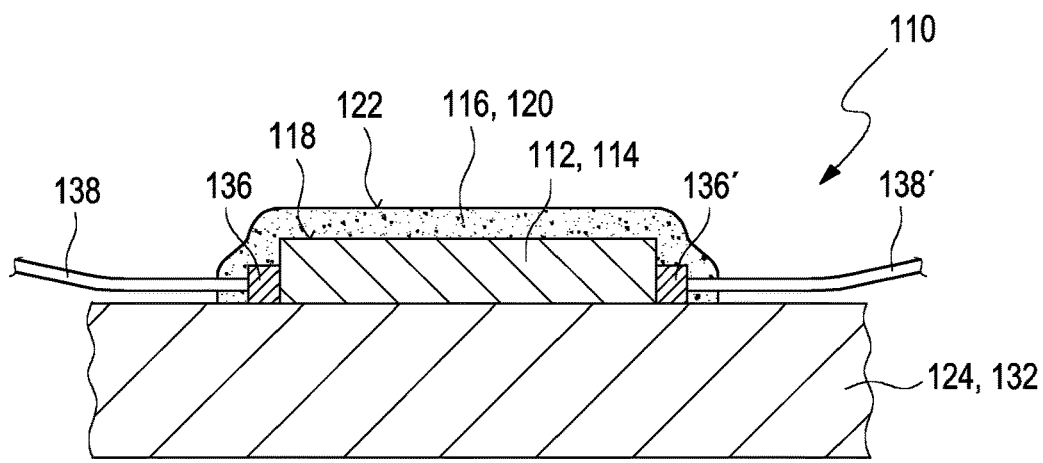

FIG. 3 illustrates an exemplary embodiment of a method for manufacturing the optical sensor 110 according to the present invention.

As illustrated in FIG. 3A, prior to providing the layer 112 of the photoconductive material 114 in accordance with method step a), the electrical contacts 136, 136' may be generated, such as in form of an evaporated metal layer which can be provided by known evaporation techniques on the substrate 124, preferably, comprising glass as the optically transparent material 132. In particular, the evaporated metal layer may comprise one or more of Ag, Al, Pt, Mg, Cr, Ti, or Au. Alternatively, the electrical contacts 136, 136' may comprise a layer of graphene. However, as mentioned above in more detail, other methods of generating the electrical contacts 136, 136' may also be feasible.

As illustrated in FIG. 3B, the layer 112 of the photoconductive material 114 is, subsequently, provided in accordance with method step a). For this purpose, the photoconductive material 114 may be synthesized according to the following procedure. Accordingly, 0.015 mol/L thiourea or substituted products thereof, 0.015 mol/L lead acetate, lead nitrate, or substituted products thereof, and 0.15 mol/L sodium hydroxide or substituted products thereof are dissolved in a reaction volume, whereby a clear solution is obtained at room temperature. As known from prior art, when the solutions mentioned above are intermixed in any order, lead sulfide (PbS) precipitates out of the solution at a temperature above 30° C., usually, in such a manner that an even and relatively smooth layer may be formed on side walls and at a bottom of a liquid-containing reactor or on the walls of any object located within therein.

However, when immediately prior to the actual precipitation of PbS from the intermixed precipitating solution, an aqueous solution of an agent capable of liberating relatively abundant quantities of nascent oxygen, preferably, of potassium persulfate, hydrogen peroxide, or sodium perborate, is added thereto, PbS precipitates therefrom in the usual manner but in an activated form being capable of direct use within a cell or of additional sensitization by aging or low-temperature baking. The precipitating solution and the activating agent are preferably mixed at a temperature above 35° C. and stirred for one to three hours, during which time deposition occurs. Herein, an amount of the persulfate ion, perborate ion, or nascent oxygen from the hydrogen peroxide, expressed in moles, added to the liquid solution for precipitating PbS may, preferably, be 0.01 to 0.5 of the theoretical amount of PbS in the bath, expressed in moles, wherein the theoretical amount of PbS is that amount which would be formed if there were a total conversion of the lead and sulfur precipitating compounds to lead sulfide.

After formation of the PbS layer, an ageing step in a climate chamber, preferably at a temperature of approx. 50° C. and a humidity above 70%, may optionally be performed, which appears to be beneficial for the photoconductive performance. Improved photoconductivity may be obtained when deposited and aged films are further processed by annealing, i.e. by heating in vacuum or air at a temperature of approx. 100° C. to 150° C. for 1 to 100 hours.

However, other kinds of providing the layer 112 of the photoconductive material 114 may also be feasible.

FIG. 3C schematically illustrates the result of method step b), by which the metal-containing compound 120 has been deposited as an amorphous cover layer 116, preferably, on the accessible surface 118 of the layer 112 of the photoconductive material PbS 114, in order to function, in particular, as an encapsulation layer. For this purpose, at least one precursor which is adapted to react to the metal-containing compound 120 has, subsequently, been applied. In this preferred embodiment, an atomic layer deposition (ALD) process or the combination of ALD and sputtering has been used as the deposition method. Alternatively, other deposition processes, such as a chemical vapor deposition (CVD) process, may, however, also be applied.

In a first embodiment of the present invention, the cover layer 116 comprises $Al_2O_3$ which has been generated via the ALD process or the combination of an ALD process and a sputtering process. Alternatively, laminates like $Al_2O_3/TiO_2/Al_2O_3/$ . . . or $Al_2O_3/ZrO_2/Al_2O_3/$ . . . may also be produced. In this particular embodiment, the ALD process has been performed applying the following process parameters:

first precursor: $H_2O$;
second precursor: $Al(CH_3)_3$ (trimethylaluminum, TMA);
temperature approx. 60° C.;
approx. 700 cycles.

As further depicted in FIG. 3C, the $Al_2O_3$-comprising cover layer 116 may be applied in a fashion that it may be adapted to, concurrently, coat both the photoconductive PbS layer 112 and the electrical contacts 136, 136' which may contact the photoconductive PbS layer 112.

FIG. 3D schematically illustrates an application of method step c), during which the amorphous cover layer 116 as generated during step b), subsequently, undergoes a thermal treatment, in particular, in order to accomplish an activation of the photoconductive material 114. Preferably, the heat treatment according to step c) is performed at a temperature from 20° C. to 300° C. in about a time interval from of 1 hour to 350 hours. As illustrated above in Table 1, the covered PbS photoconductor now exhibits an improved photoconductive performance after the heat treatment.

As illustrated in FIG. 3E, the two electrical contacts 136, 136' which electrically contact the layer 112 of the photoconductive material 114 may, preferably after the heat treatment according to step c), be bonded to at least one external connection by electrically conductive leads 138, 138', such as gold wires, which may be provided here through the cover 116. However, as mentioned above, other ways for providing electrical contacts 136, 136' to the photoconductive PbS layer 112 may also be feasible, such as by providing the leads 138, 138' already prior method step a), after method step a), or after method step b).

Figure 4:
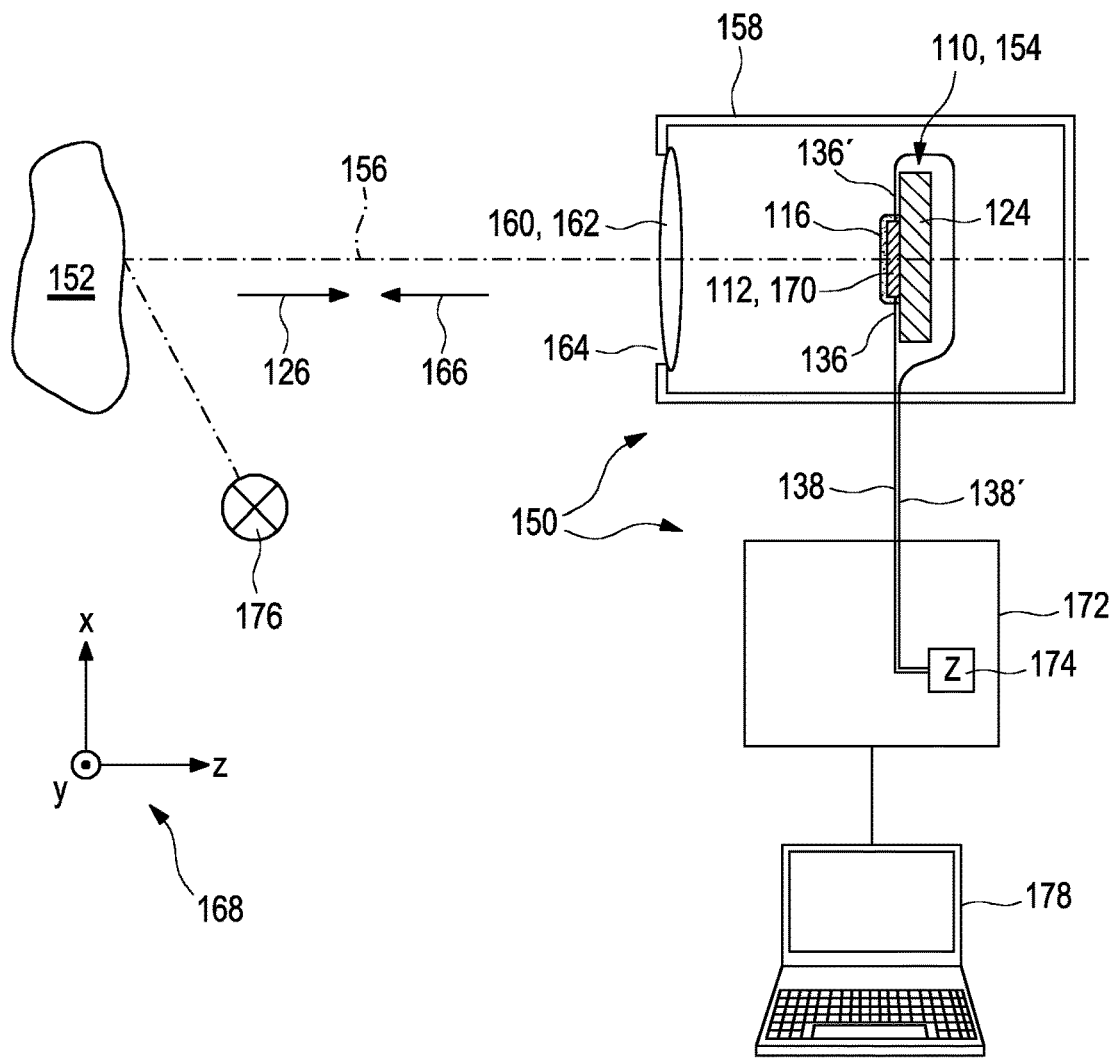
FIG. 4 shows an exemplary embodiment of a detector according to the present invention comprising a longitudinal optical sensor.

FIG. 4 illustrates, in a highly schematic fashion, an exemplary embodiment of an optical detector 150 according to the present invention, for determining a position of at least one object 152. The optical detector 150 may preferably be adapted to be used as an infrared detector. However, other embodiments are feasible.

The optical detector 150 comprises at least one optical sensor 100, which, in this particular embodiment, may be used as a longitudinal optical sensor 154 and is arranged along an optical axis 156 of the detector 150. Specifically, the optical axis 156 may be an axis of symmetry and/or rotation of the setup of the optical sensor 100. The optical sensor 100 may be located inside a housing 158 of the detector 150. Further, at least one transfer device 160 may be comprised, preferably a refractive lens 162. An opening 164 in the housing 158, which may, particularly, be located concentrically with regard to the optical axis 156, preferably defines a direction of view 166 of the detector 150. A coordinate system 168 may be defined, in which a direction parallel or antiparallel to the optical axis 156 is defined as a longitudinal direction, whereas directions perpendicular to the optical axis 156 may be defined as transversal directions. In the coordinate system 158, symbolically depicted in FIG. 4, a longitudinal direction is denoted by z and transversal directions are denoted by x and y, respectively. However, other types of coordinate systems 158 are feasible.

Further, the optical sensor 100 is designed to generate at least one sensor signal in a manner dependent on an illumination of a sensor region 170 by the light beam 126. Further, according to the FiP effect, the optical sensor 100 which is implemented here as the longitudinal optical sensor 154 provides a longitudinal sensor signal which, given the same total power of the illumination, is dependent on a beam cross-section of the light beam 126 in the respective sensor region 170. According to the present invention, the sensor region 170 comprises at least one of the layers 112 of the photoconductive material 114, preferably, a chalcogenide, in particular lead sulfide (PbS) or lead selenide (PbSe). However, other photoconductive materials 114, in particular other chalcogenides, may be used. As a result of the use of the photoconductive material 114 in the sensor region 170, an electrical conductivity of the sensor region 170, given the same total power of the illumination, depends on the beam cross-section of the light beam 126 in the sensor region 170. Consequently, the resulting longitudinal sensor signal as provided by the longitudinal optical sensor 154 upon impingement by the light beam 126 depends on the electrical conductivity of the photoconductive material 114 in the sensor region 170 and thus allows determining the beam cross-section 130 of the light beam 126 in the sensor region 170. Via the electrical contacts 136, 136' to which the leads 138, 138' are bonded, the longitudinal sensor signal may be transmitted to an evaluation device 172, which is, generally, designed to generate at least one item of information on a position of the object 152 by evaluating the sensor signal of the transversal optical sensor 154. For this purpose, the evaluation device 172 may comprise one or more electronic devices and/or one or more software components, in order to evaluate the sensor signals, which are symbolically denoted by a longitudinal evaluation unit 174 (denoted by "z"). As will be explained below in more detail, the evaluation device 172 may be adapted to determine the at least one item of information on the longitudinal position of the object 152 by comparing more than one longitudinal sensor signals of the longitudinal optical sensor 154.

The light beam 126 for illumining the sensor region 170 of the optical sensor 100 may be generated by a light-emitting object 152. Alternatively or in addition, the light beam 126 may be generated by a separate illumination source 176, which may include an ambient light source and/or an artificial light source, such as a light-emitting diode, being adapted to illuminate the object 152 that the object 152 may be able to reflect at least a part of the light generated by the illumination source 176 in a manner that the light beam 126 may be configured to reach the sensor region 170 of the optical sensor 100, preferably by entering the housing 158 of the optical detector 150 through the opening 164 along the optical axis 156. In a specific embodiment, the illumination source 176 may be a modulated light source, wherein one or more modulation properties of the illumination source 176 may be controlled by at least one optional modulation device. Alternatively or in addition, the modulation may be effected in a beam path between the illumination source 176 and the object 152 and/or between the object 152 and the optical sensor 100. Further possibilities may be conceivable.

Generally, the evaluation device 172 may be part of a data processing device 178 and/or may comprise one or more data processing devices 178. The evaluation device 172 may be fully or partially integrated into the housing 158 and/or may fully or partially be embodied as a separate device which is electrically connected in a wireless or wire-bound fashion to the optical sensor 100. The evaluation device 172 may further comprise one or more additional components, such as one or more electronic hardware components and/or one or more software components, such as one or more measurement units and/or one or more evaluation units and/or one or more controlling units (not depicted here).

Figure 5:
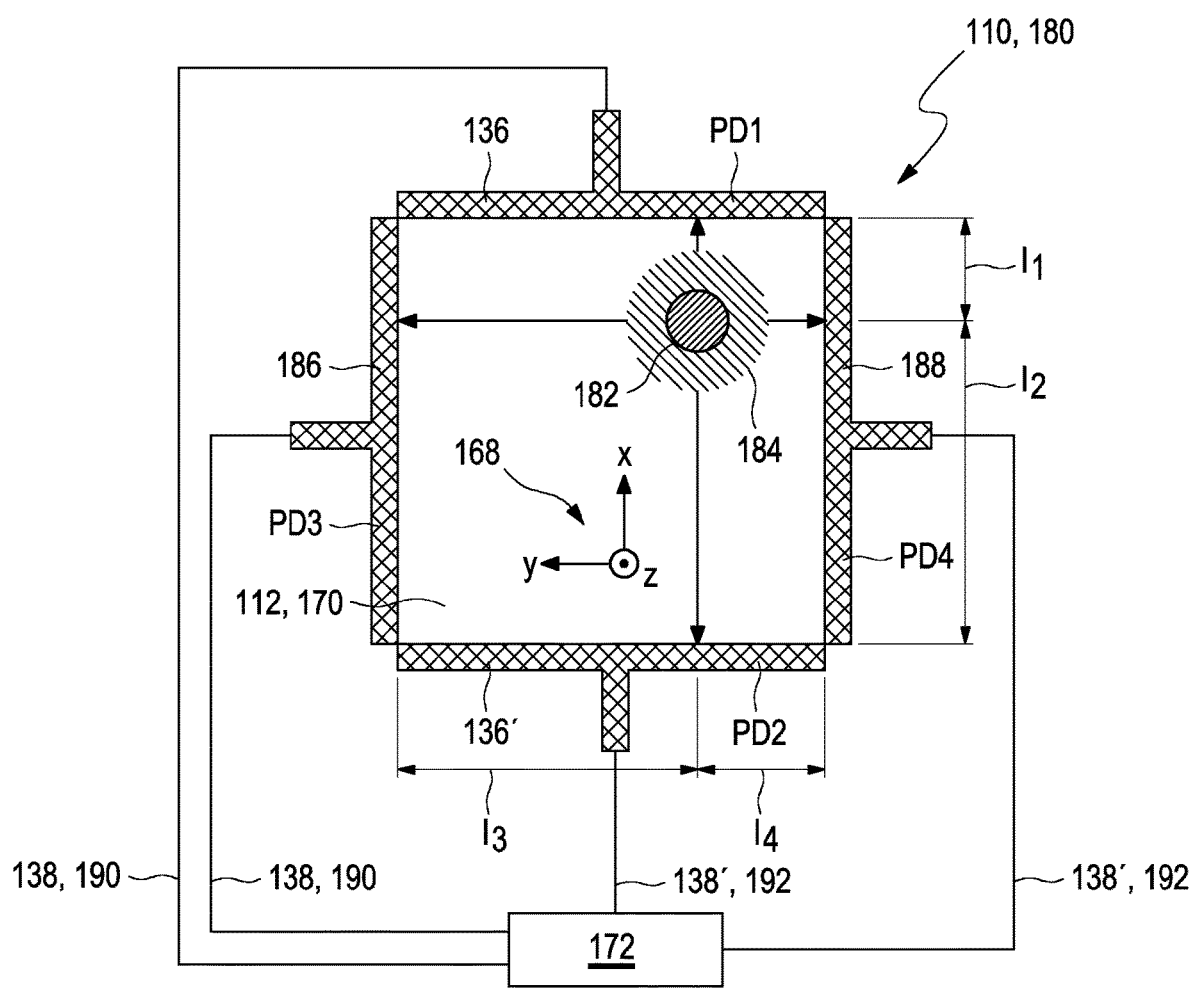
FIG. 5 shows an exemplary embodiment of a transversal optical sensor according to the present invention.

FIG. 5 illustrates the optical sensor 100 which is implemented here as the transversal optical sensor 180. Herein, an illumination of the sensor region 170 comprising the layer 12 of the photoconductive material 114 by the light beam 126 is shown. In FIG. 5, two different situations are depicted, representing different distances between the object, from which the light beam 126 propagates towards the detector 150, and the detector 150 itself, resulting in two different spot sizes of light spots generated by the light beam 126 in the sensor region 170, firstly, a small light spot 182 and, secondly, a large light spot 184. In both cases, the overall power of the light beam 126 remains the same over the light spots 182, 184. Consequently, the average intensity in the small light spot 182 is significantly higher than in the large light spot 184. Further, in both cases a position of a center of the light spots 182, 184 remains unaltered, irrespective of a size of the light spots 182, 184. This feature demonstrates the capability of the T-shaped electrical contacts 136, 136', 186, 188 and the corresponding leads 138, 138', 190, 192 of the transversal optical sensor 180 as illustrated here to provide transversal sensor signals to the evaluation device 172, which are configured to allow the evaluation device 172 unambiguously determining the at least one transversal coordinate x, y of the object 152.

Figure 6:
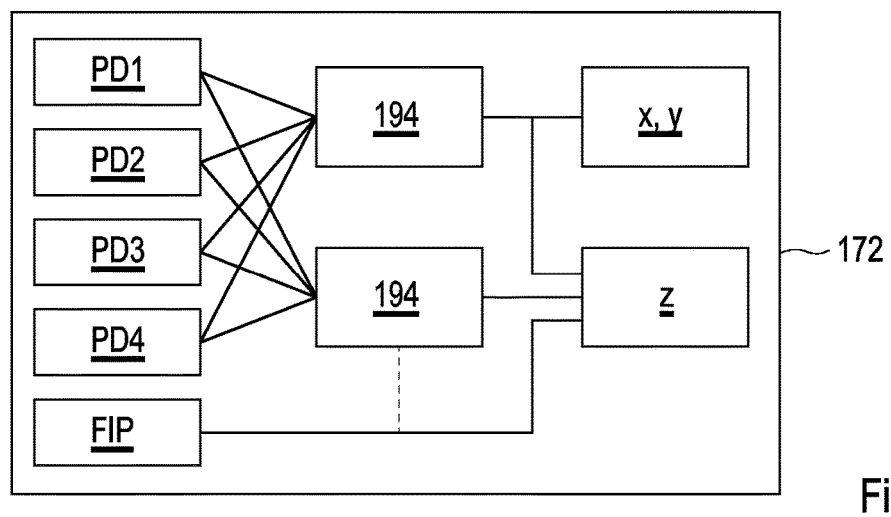
FIG. 6 shows an exemplary schematic setup of an evaluation scheme for evaluating the transversal sensor signals.
Figure 7:
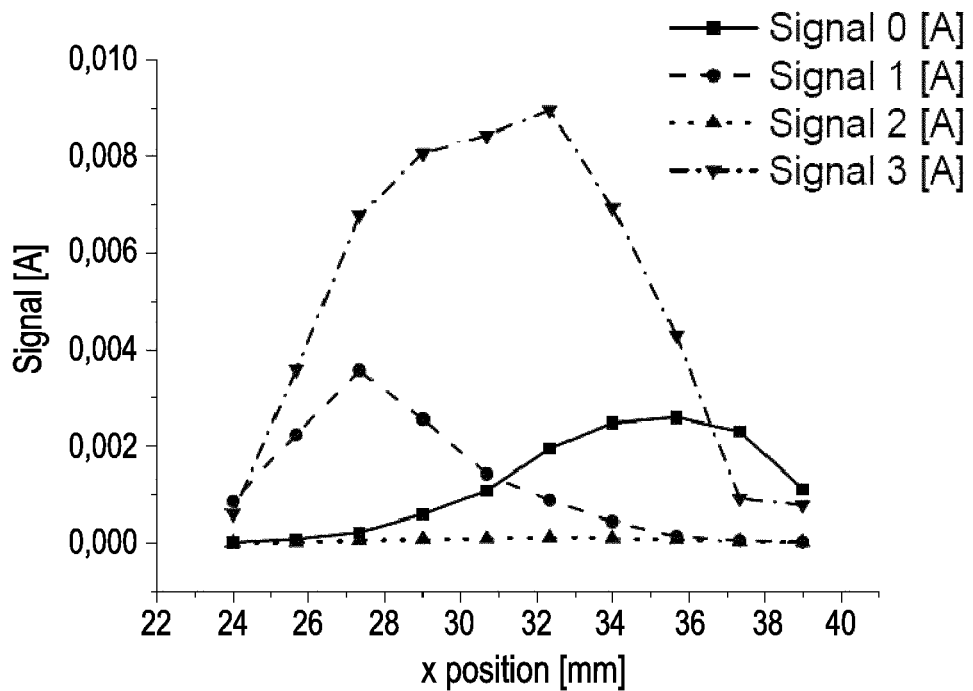
FIG. 7A to 7F show a relationship between a transversal sensor signal and a light spot position in the exemplary embodiment of the transversal optical sensor.
Figure 7:
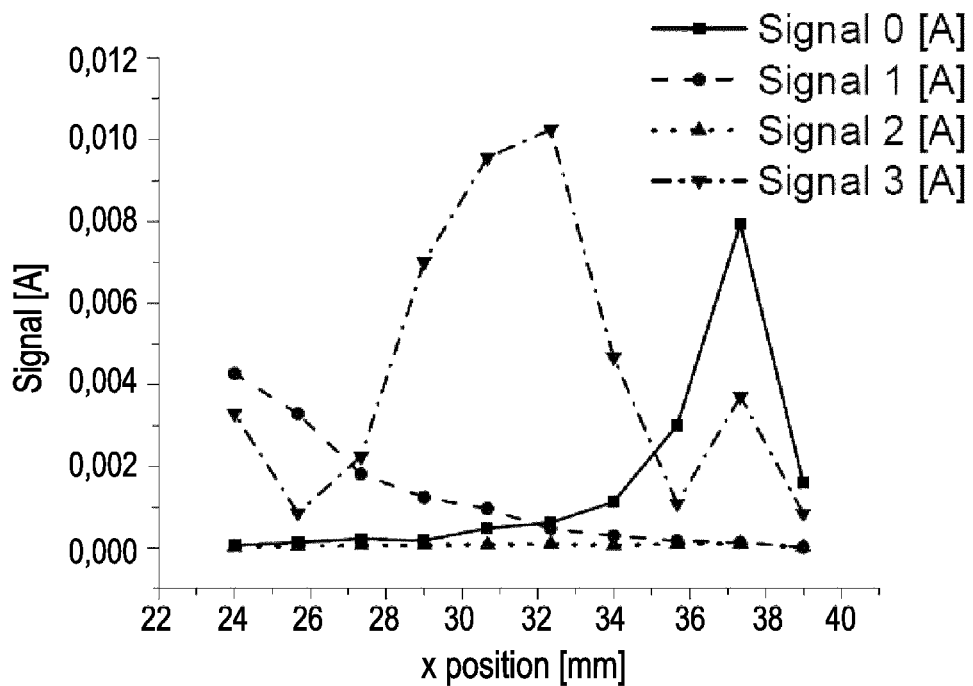
Figure 7:
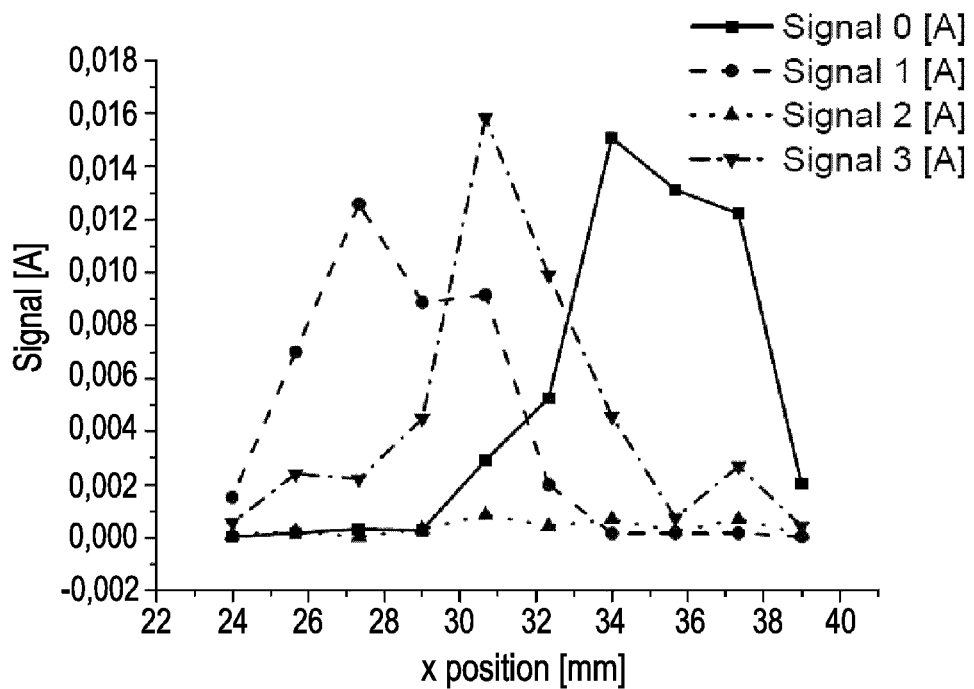
Figure 7:
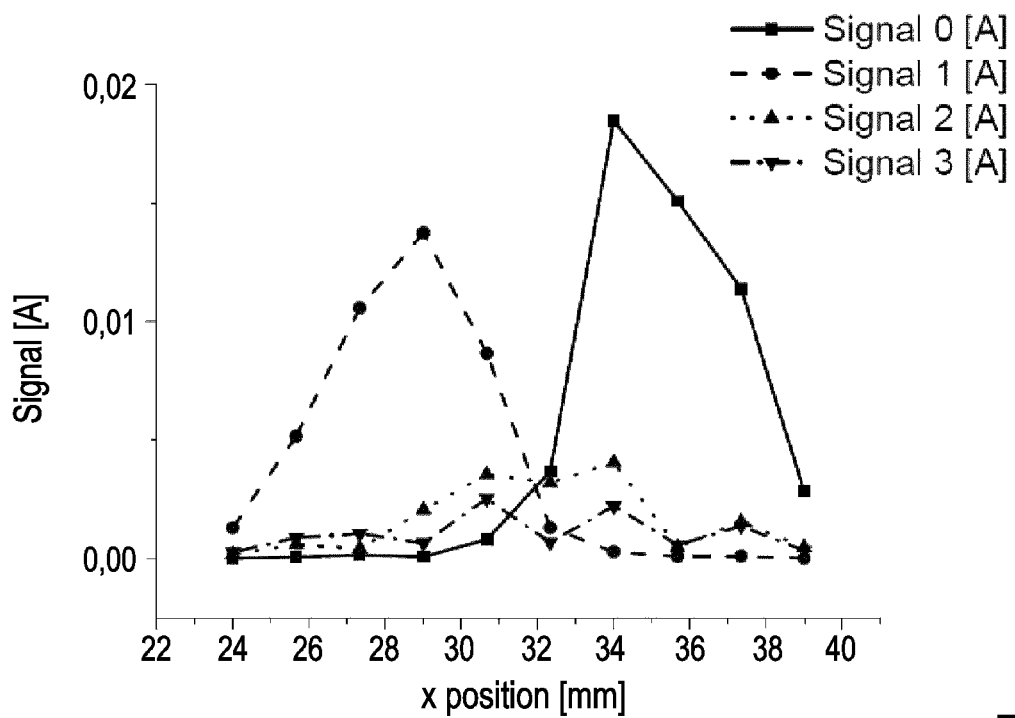
Figure 7:
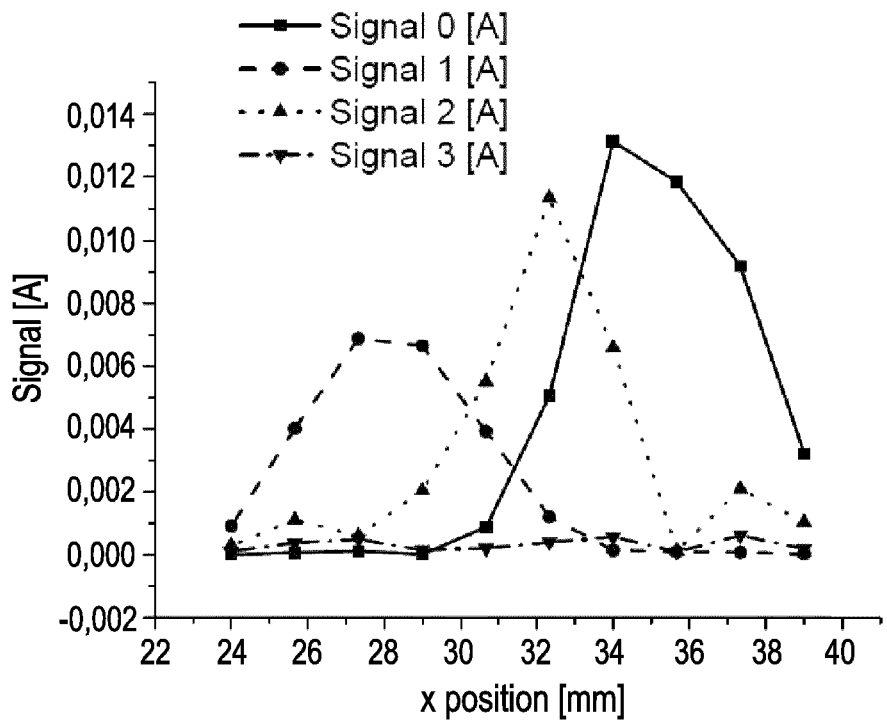
Figure 7:
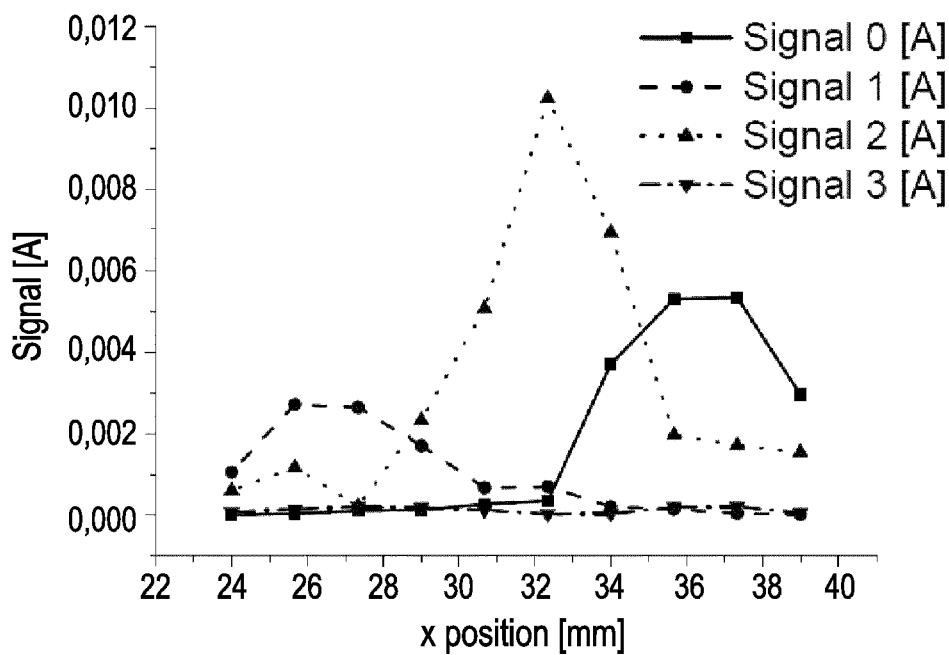

If a bias voltage source (not depicted here) may be connected to the T-shaped electrical contacts 136, 136', 186, 188, currents I1, I2, I3 and/or I4 may be flowing between the bias voltage and the electrical contacts 136, 136', 186, 188. The evaluation device 172 as schematically and symbolically depicted in FIG. 6, may, thus, be designed to evaluate the transversal sensor signals which, therein, are represented by the symbols PD1-PD4 for the transversal sensor signals of the photosensitive elements and FiP for a longitudinal sensor signal. The sensor signals may be evaluated by the evaluation device in various ways in order to derive a position information and/or a geometrical information on the object. Thus, as outlined above, at least one transversal coordinate x, y may be derived. This is mainly due to the fact that the distances between the center of the light spot 182, 184 and the electrical contacts 136, 136', 186, 188 are non-equal. Thus, the center of the light spot 182, 184 has a distance from the electrical contact 136 of 11, a distance from the electrical contact 136' of 12, a distance from the electrical contact 186 of 13, and a distance from the electrical contact 188 of 14. Due to these differences in the distances between the location of the light spot 182, 184 and the electrical contacts 136, 136', 186, 188, the transversal sensor signals will differ.

The comparison of the sensor signals may take place in various ways. Thus, generally, the evaluation device 172 may be designed to compare the transversal sensor signals in order to derive the at least one transversal coordinate of the object 152 or of the light spot 182, 184. As an example, the evaluation device 172 may comprise at least one subtracting device 194 and/or any other device which provides a function which is dependent on at least one transversal coordinate, such as on the coordinates x, y. For exemplary embodiments, the subtracting device 194 may be designed to generate at least one difference signal for one or each of dimensions x, y in FIG. 5. As an example, a simple difference between PD1 and PD2, such as (PD1-PD2)/(PD1+PD2), may be used as a measure for the x-coordinate, and a difference between PD3 and PD4, such as (PD3−PD4)/(PD3+PD4), may be used as a measure for the y-coordinate. A transformation of the transversal coordinates of the light spot 182, 184 in the sensor region 170, e.g. into transversal coordinates of the object 152 from which the light beam 126 propagates towards the detector 150, may be made by using the well-known lens equation.

For further details, as an example, reference may be made to one or more of the above-mentioned prior art documents, such as to WO 2014/097181 A1.

It shall be noted, however, that other transformations or other algorithms for processing the sensor signals by the evaluation device 172 may be possible. Thus, besides subtractions or the near combinations with positive or negative coefficients, nonlinear transformations are generally feasible. As an example, for transforming the sensor signals into z-coordinates and/or x, y-coordinates, one or more known or determinable relationships may be used, which, as an example, may be derived empirically, such as by calibrating experiments with the object 152 placed at various distances from the detector 150 and/or by calibrating experiments with the object 152 placed at various transversal positions or three-dimensional positions, and by recording the respective sensor signals.

As already outlined above, the longitudinal coordinate z may be also derived, in particular by implementing the FiP effect explained in further detail in WO 2012/110924 A1 and/or in WO 2014/097181 A1. For this purpose, the at least one longitudinal sensor signal as provided by the FiP sensor may be evaluated by using the evaluation device 172 and determining, therefrom, the at least one longitudinal coordinate z of the object 152.

FIGS. 7A to 7F illustrate experimental results, wherein the optical detector 150 having the transversal optical sensor 180 comprised photosensitive resistors of PbS. Herein, a laser having a wavelength of 630 nm was employed as the light source 176. The contact configuration was the same as illustrated in FIG. 5. The laser was set to the left under corner and was moved horizontally line by line. A measurement of the signals was made each millimeter. The measurements as shown in FIGS. 7A to 7F illustrate a dependency between the transversal sensor signals and the position of the light spots 182, 184.

Figure 8:
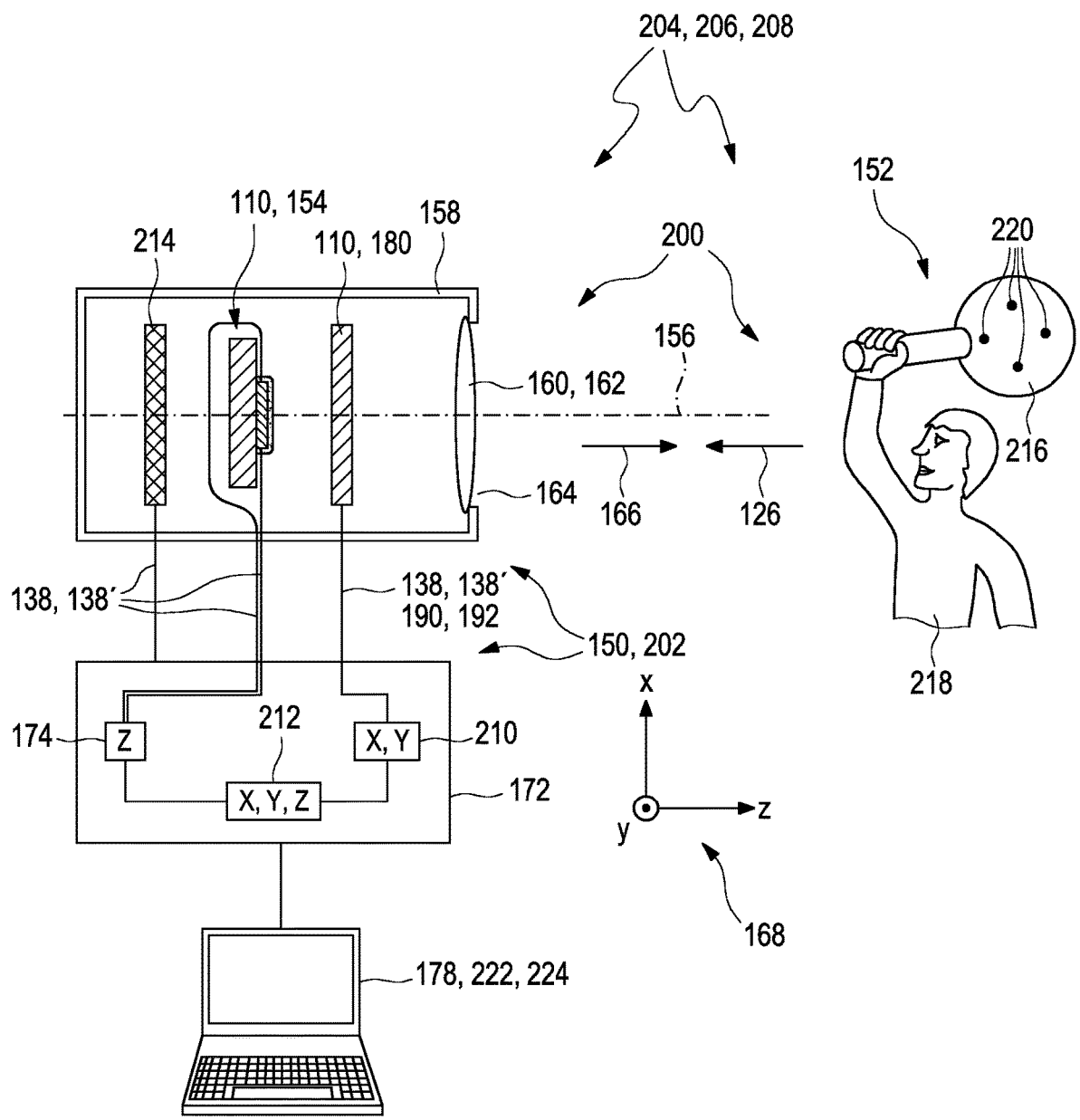
FIG. 8 shows an exemplary embodiment of an optical sensor, a detector, a detector system, a human-machine interface, an entertainment device, a tracking system and a camera according to the present invention.

As a further example, FIG. 8 shows an exemplary embodiment of a detector system 200, comprising at least one optical detector 150, such as the optical detector 150 as disclosed in one or more of the embodiments shown in the preceding Figures. Herein, the optical detector 150 may be employed as a camera 202, specifically for 3D imaging, which may be made for acquiring images and/or image sequences, such as digital video clips. Further, FIG. 8 shows an exemplary embodiment of a human-machine interface 204, which comprises the at least one detector 150 and/or the at least one detector system 200, and, further, an exemplary embodiment of an entertainment device 206 comprising the human-machine interface 204. FIG. 8 further shows an embodiment of a tracking system 208 adapted for tracking a position of at least one object 152, which comprises the detector 150 and/or the detector system 200.

With regard to the optical detector 150 and to the detector system 200, reference may be made to the full disclosure of this application. Basically, all potential embodiments of the detector 150 may also be embodied in the embodiment shown in FIG. 8. The evaluation device 172 may be connected to the at least one longitudinal optical sensor 154, in particular, by the leads 138, 138'. As described above, a use of two or, preferably, three longitudinal optical sensors 154 may support the evaluation of the longitudinal sensor signals without any remaining ambiguity. The evaluation device 172 may further be connected to the at least one optional transversal optical sensor 180, in particular, by the signal leads 138, 138', 190, 192. By way of example, the signal leads 138, 138', 190, 192 may be provided and/or one or more interfaces, which may be wireless interfaces and/or wire-bound interfaces. Further, the signal leads 138, 138', 190, 192 may comprise one or more drivers and/or one or more measurement devices for generating sensor signals and/or for modifying sensor signals. Further, again, the at least one transfer device 160 may be provided, in particular as the refractive lens 162 or convex mirror. The optical detector 150 may further comprise the at least one housing 158 which, as an example, may encase one or more of the optical sensors 154, 180.

Further, the evaluation device 172 may fully or partially be integrated into the optical sensors 154, 180 and/or into other components of the optical detector 150. The evaluation device 172 may also be enclosed into housing 158 and/or into a separate housing. The evaluation device 172 may comprise one or more electronic devices and/or one or more software components, in order to evaluate the sensor signals, which are symbolically denoted by the longitudinal evaluation unit 174 (denoted by "z") and a transversal evaluation unit 210 (denoted by "xy") and by combining results derived by these evolution units 174, 210, a position information 212, preferably a three-dimensional position information, may be generated (denoted by "x, y, z"). Similar to the embodiment according to FIG. 8, a bias voltage source (not depicted here) may be provided configured to provide a bias voltage.

Further, the optical detector 150 and/or to the detector system 200 may comprise an imaging device 214 which may be configured in various ways. Thus, as depicted in FIG. 8, the imaging device 214 can for example be part of the detector 150 within the detector housing 158. Herein, the imaging device signal may be transmitted by one or more imaging device signal leads 138, 138' to the evaluation device 172 of the detector 150. Alternatively, the imaging device 214 may be separately located outside the detector housing 158. The imaging device 214 may be fully or partially transparent or intransparent. The imaging device 214 may be or may comprise an organic imaging device or an inorganic imaging device. Preferably, the imaging device 214 may comprise at least one matrix of pixels, wherein the matrix of pixels may particularly be selected from the group consisting of: an inorganic semiconductor sensor device such as a CCD chip and/or a CMOS chip; an organic semiconductor sensor device.

In the exemplary embodiment as shown in FIG. 8, the object 152 to be detected, as an example, may be designed as an article of sports equipment and/or may form a control element 216, the position and/or orientation of which may be manipulated by a user 218. Thus, generally, in the embodiment shown in FIG. 8 or in any other embodiment of the detector system 200, the human-machine interface 204, the entertainment device 206 or the tracking system 208, the object 152 itself may be part of the named devices and, specifically, may comprise the at least one control element 216, specifically, wherein the at least one control element 216 has one or more beacon devices 220, wherein a position and/or orientation of the control element 216 preferably may be manipulated by user 218. As an example, the object 152 may be or may comprise one or more of a bat, a racket, a club or any other article of sports equipment and/or fake sports equipment. Other types of objects 152 are possible.

Further, the user 218 may be considered as the object 152, the position of which shall be detected. As an example, the user 218 may carry one or more of the beacon devices 220 attached directly or indirectly to his or her body.

The optical detector 150 may be adapted to determine at least one item on a longitudinal position of one or more of the beacon devices 220 and, optionally, at least one item of information regarding a transversal position thereof, and/or at least one other item of information regarding the longitudinal position of the object 152 and, optionally, at least one item of information regarding a transversal position of the object 152. Particularly, the optical detector 150 may be adapted for identifying colors and/or for imaging the object 152, such as different colors of the object 152, more particularly, the color of the beacon devices 220 which might comprise different colors. The opening 154 in the housing 158, which, preferably, may be located concentrically with regard to the optical axis 156 of the detector 150, may preferably define a direction of a view 166 of the optical detector 150.

The optical detector 150 may be adapted for determining the position of the at least one object 152. Additionally, the optical detector 150, specifically an embodiment including the camera 202, may be adapted for acquiring at least one image of the object 152, preferably a 3D-image. As outlined above, the determination of a position of the object 152 and/or a part thereof by using the optical detector 150 and/or the detector system 200 may be used for providing a human-machine interface 204, in order to provide at least one item of information to a machine 222. In the embodiments schematically depicted in FIG. 8, the machine 222 may be or may comprise at least one computer and/or a computer system comprising the data processing device 178. Other embodiments are feasible. The evaluation device 172 may be a computer and/or may comprise a computer and/or may fully or partially be embodied as a separate device and/or may fully or partially be integrated into the machine 222, particularly the computer. The same holds true for a track controller 224 of the tracking system 208, which may fully or partially form a part of the evaluation device 172 and/or the machine 222.

Similarly, as outlined above, the human-machine interface 204 may form part of the entertainment device 206. Thus, by means of the user 218 functioning as the object 152 and/or by means of the user 218 handling the object 152 and/or the control element 216 functioning as the object 152, the user 218 may input at least one item of information, such as at least one control command, into the machine 222, particularly the computer, thereby varying the entertainment function, such as controlling the course of a computer game.

As outlined above, the detector 150 may have a straight beam path or a tilted beam path, an angulated beam path, a branched beam path, a deflected or split beam path or other types of beam paths. Further, the light beam 126 may propagate along each beam path or partial beam path once or repeatedly, unidirectionally or bidirectionally. Thereby, the components listed above or the optional further components listed in further detail below may fully or partially be located in front of the optical sensors 100 and/or behind the optical sensors 100.

LIST OF REFERENCE NUMBERS 110 sensor
112 layer of photoconductive material
114 photoconductive material
116 cover layer
118 accessible surface of the photoconductive material
120 metal-containing compound
122 surface of the cover layer
124 substrate
126 light beam
128 beam path
130 diameter of light beam; beam cross-section
132 optically transparent material
134 additional layer
136, 136', 136" electrical contacts
138, 138' electrically connecting leads
140 package
142 contact pad
144 printed circuit board
146 via
148 interlayer
149, 149' comb structure
150 detector
152 object
154 longitudinal optical sensor
156 optical axis
158 housing
160 transfer device
162 refractive lens
164 opening
166 direction of view
168 coordinate system
170 sensor region
172 evaluation device
174 longitudinal evaluation unit
176 illumination source
178 processing device
180 transversal optical sensor
182 small spot
184 large spot
186, 188 electrical contacts
190, 192 electrically conducting leads
194 subtracting device
200 detector system
202 camera
204 human-machine interface
206 entertainment device
208 tracking system
210 transversal evaluation unit
212 position information
214 imaging device
216 control element
218 user
220 beacon device
222 machine
224 track controller

The invention claimed is:
1. An optical sensor, comprising:
a layer of at least one photoconductive material, wherein the layer of the photoconductive material comprises crystals having sizes above 15 nm, and wherein the crystals comprise the at least one photoconductive material,
at least two individual electrical contacts contacting the layer of the at least one photoconductive material, and
a cover layer deposited on the layer of at least one photoconductive material,
wherein the cover layer is an amorphous layer comprising a metal-containing compound.

2. The optical sensor according to claim 1, wherein the metal-containing compound comprises a metal selected from the group consisting of Al, Ti, Ta, Mn, Mo, Zr, Hf and W.

3. The optical sensor according to claim 1, wherein the metal-containing compound is at least one selected from the group comprising an oxide, a hydroxide, a chalcogenide, a pnictide, and a carbide.

4. The optical sensor according to claim 1, wherein the cover layer is or comprises a laminate having at least two adjacent layers, wherein the adjacent layers differ by a respective composition, and wherein at least one of the adjacent layers comprises the metal-containing compound.

5. The optical sensor according to claim 1, wherein the cover layer has a thickness of from 10 nm to 600 nm.

6. The optical sensor according to claim 1, wherein the cover layer is a conformal layer with respect to an adjacent surface of the layer of the at least one photoconductive material.

7. The optical sensor according to claim 1, wherein the cover layer is or comprises an atomic deposition layer.

8. The optical sensor according to claim 1, wherein the cover layer is at least partially coated with at least one additional layer and/or wherein the at least one additional layer is at least partially deposited between the layer of the at least one photoconductive material and the cover layer, and wherein the additional layer is or comprises at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

9. The optical sensor according to claim 1, wherein the layer of the at least one photoconductive material is directly or indirectly applied to at least one substrate, and wherein at least one of the substrate and the cover layer is optically transparent within a wavelength range.

10. The optical sensor according to claim 1, wherein the at least one photoconductive material comprises at least one chalcogenide, and wherein the chalcogenide is selected from the group consisting of a sulfide chalcogenide, a selenide chalcogenide, a telluride chalcogenide, a ternary chalcogenide, a quaternary chalcogenide, a higher chalcogenide, a solid solution thereof, and a doped variant thereof.

11. The optical sensor according to the claim 10, wherein the chalcogenide is selected from the group consisting of lead sulfide, copper indium sulfide, copper indium gallium selenide, copper zinc tin sulfide, lead selenide, copper zinc tin selenide, cadmium telluride, mercury cadmium telluride, mercury zinc telluride, lead sulfoselenide, copper-zinc-tin sulfur-selenium chalcogenide, a solid solution thereof and a doped variant thereof.

12. A detector for an optical detection of at least one object, the detector comprising:
the optical sensor according to claim 1, the optical sensor comprising at least one sensor region, wherein the optical sensor is designed to generate at least one sensor signal in a manner dependent on an illumination of the sensor region by a light beam; and
an evaluation device, wherein the evaluation device is designed to generate at least one coordinate of the object by evaluating the sensor signal of the optical sensor.

13. The detector according to claim 12, wherein the sensor signal is a longitudinal sensor signal, wherein the longitudinal sensor signal, given the same total power of the illumination, is dependent on a beam cross-section of the light beam in the sensor region, and wherein the evaluation device is designed to generate at least one item of information on a longitudinal position of the object by evaluating the longitudinal sensor signal.

14. The detector according to claim 1, wherein the sensor signal is a transversal sensor signal, wherein the transversal sensor signal is provided by the electrical contacts contacting the at least one photoconductive material, wherein the electrical contacts are configured as at least one split electrode, wherein a bias voltage source is applicable to the at least one split electrode, and wherein the evaluation device is further designed to generate at least one item of information on a transversal position of the object by applying the bias voltage source and the at least one split electrode and by evaluating the transversal sensor signal.

15. A method for manufacturing an optical sensor, the method comprising:
providing a layer of at least one photoconductive material, wherein the layer of the photoconductive material comprises crystals having sizes above 15 nm, and wherein the crystals comprise the at least one photoconductive material;
thereafter, applying at least one precursor being adapted to react to metal-containing compound, whereby the metal-containing compound is deposited as an amorphous cover layer on the layer of the at least one photoconductive material; and
thereafter, thermally treating the amorphous cover layer;
wherein at least two electrical contacts electrically contacting the layer of the at least one photoconductive material are further provided.

16. A detection method, comprising:
optically detecting at least one object with the detector according to claim 12,
wherein the method is suitable for at least one selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a distance measurement, a position measurement, an entertainment application, a security application, a human-machine interface application, a tracking application, a scanning application, stereoscopic vision, a photography application, an imaging application or camera application, a mapping application for generating maps of at least one space, a homing or tracking beacon detector for vehicles, a distance and/or position measurement of objects with a thermal signature, a machine vision application, a robotic application, and a logistics application.

* * * * *